(12) United States Patent
Kitakado et al.

(10) Patent No.: US 7,855,416 B2
(45) Date of Patent: *Dec. 21, 2010

(54) SEMICONDUCTOR DEVICE AND MANUFACTURING METHOD THEREOF

(75) Inventors: Hidehito Kitakado, Hyogo (JP); Masahiko Hayakawa, Kanagawa (JP); Shunpei Yamazaki, Tokyo (JP); Taketomi Asami, Kanagawa (JP)

(73) Assignee: Semiconductor Energy laboratory Co., Ltd. (JP)

( * ) Notice: Subject to any disclaimer, the term of this patent is extended or adjusted under 35 U.S.C. 154(b) by 92 days.

This patent is subject to a terminal disclaimer.

(21) Appl. No.: 12/276,746

(22) Filed: Nov. 24, 2008

(65) Prior Publication Data
US 2009/0224255 A1 Sep. 10, 2009

Related U.S. Application Data

(60) Continuation of application No. 11/119,431, filed on Apr. 29, 2005, now Pat. No. 7,456,474, which is a continuation of application No. 10/260,698, filed on Sep. 30, 2002, now Pat. No. 6,940,124, which is a division of application No. 09/558,736, filed on Apr. 26, 2000, now Pat. No. 6,461,899.

(30) Foreign Application Priority Data
Apr. 30, 1999 (JP) ................... 11-125392

(51) Int. Cl.
*H01L 21/84* (2006.01)
(52) U.S. Cl. .............. 257/347; 257/349; 257/632; 257/639; 257/E27.1
(58) Field of Classification Search ............... 257/347, 257/349, 632, 639, E27.1
See application file for complete search history.

(56) References Cited

U.S. PATENT DOCUMENTS 3,765,935 A 10/1973 Rand et al.

(Continued)

FOREIGN PATENT DOCUMENTS

JP 56-111258 9/1981

(Continued)

OTHER PUBLICATIONS

U.S. Appl. No. 09/584,617 (abandoned) to Sakama et al, filed May 31, 2000, including specification, claims, abstract, drawings and PTO filing receipt.

(Continued)

*Primary Examiner*—Eugene Lee
(74) *Attorney, Agent, or Firm*—Husch Blackwell LLP Welsh Katz

(57) ABSTRACT

Channel doping is an effective method for controlling $V_{th}$, but if $V_{th}$ shifts to the order of −4 to −3 V when forming circuits such as a CMOS circuit formed from both an n-channel TFT and a P-channel TFT on the same substrate, then it is difficult to control the $V_{th}$ of both TFTs with one channel dope. In order to solve the above problem, the present invention forms a blocking layer on the back channel side, which is a laminate of a silicon oxynitride film (A) manufactured from $SiH_4$, $NH_3$, and $N_2O$, and a silicon oxynitride film (B) manufactured from $SiH_4$ and $N_2O$. By making this silicon oxynitride film laminate structure, contamination by alkaline metallic elements from the substrate can be prevented, and influence by stresses, caused by internal stress, imparted to the TFT can be relieved.

31 Claims, 25 Drawing Sheets

U.S. PATENT DOCUMENTS

| | | |
|---|---|---|
| 5,108,843 A | 4/1992 | Ohtaka et al. |
| 5,247,190 A | 9/1993 | Friend et al. |
| 5,254,208 A | 10/1993 | Zhang |
| 5,273,920 A | 12/1993 | Kwasnick et al. |
| 5,274,602 A | 12/1993 | Glenn |
| 5,298,455 A | 3/1994 | Arai et al. |
| 5,306,651 A | 4/1994 | Masumo et al. |
| 5,323,042 A | 6/1994 | Matsumoto |
| 5,362,667 A | 11/1994 | Linn et al. |
| 5,399,502 A | 3/1995 | Friend et al. |
| 5,434,441 A | 7/1995 | Inoue et al. |
| 5,504,020 A | 4/1996 | Aomori et al. |
| 5,508,532 A | 4/1996 | Teramoto |
| 5,594,569 A | 1/1997 | Konuma et al. |
| 5,640,067 A | 6/1997 | Yamauchi et al. |
| 5,643,826 A | 7/1997 | Ohtani et al. |
| 5,684,365 A | 11/1997 | Tang et al. |
| 5,707,746 A | 1/1998 | Yaoi et al. |
| 5,731,613 A | 3/1998 | Yamazaki et al. |
| 5,747,830 A | 5/1998 | Okita |
| 5,771,110 A | 6/1998 | Hirano et al. |
| 5,773,325 A | 6/1998 | Teramoto |
| 5,784,073 A | 7/1998 | Yamazaki et al. |
| 5,804,878 A | 9/1998 | Miyazaki et al. |
| 5,815,223 A | 9/1998 | Watanabe et al. |
| 5,858,823 A | 1/1999 | Yamazaki et al. |
| 5,893,730 A | 4/1999 | Yamazaki et al. |
| 5,897,328 A | 4/1999 | Yamauchi et al. |
| 5,923,962 A | 7/1999 | Ohtani et al. |
| 5,970,384 A | 10/1999 | Yamazaki et al. |
| 5,972,437 A | 10/1999 | Ohori et al. |
| 6,048,758 A | 4/2000 | Yamazaki et al. |
| 6,081,310 A * | 6/2000 | Katsuya et al. ............ 349/113 |
| 6,087,229 A | 7/2000 | Aronowitz et al. |
| 6,093,577 A | 7/2000 | Van der Groen et al. |
| 6,157,426 A | 12/2000 | Gu |
| 6,165,824 A | 12/2000 | Takano et al. |
| 6,166,414 A | 12/2000 | Miyazaki |
| 6,174,590 B1 | 1/2001 | Iyer et al. |
| 6,174,816 B1 | 1/2001 | Yin et al. |
| 6,198,133 B1 | 3/2001 | Yamazaki et al. |
| 6,225,168 B1 | 5/2001 | Gardner et al. |
| 6,225,645 B1 | 5/2001 | Zhang |
| 6,271,897 B1 | 8/2001 | Ichikawa et al. |
| 6,274,516 B1 | 8/2001 | Kamei et al. |
| 6,281,552 B1 | 8/2001 | Kawasaki et al. |
| 6,285,042 B1 | 9/2001 | Ohtani et al. |
| 6,291,363 B1 | 9/2001 | Yin et al. |
| 6,300,253 B1 | 10/2001 | Moore et al. |
| 6,306,694 B1 | 10/2001 | Yamazaki et al. |
| 6,316,810 B1 | 11/2001 | Yamazaki et al. |
| 6,323,528 B1 | 11/2001 | Yamazaki et al. |
| 6,335,541 B1 | 1/2002 | Ohtani et al. |
| 6,348,420 B1 | 2/2002 | Raaijmakers et al. |
| 6,365,933 B1 | 4/2002 | Yamazaki et al. |
| 6,380,558 B1 | 4/2002 | Yamazaki et al. |
| 6,399,988 B1 | 6/2002 | Yamazaki |
| 6,420,282 B1 | 7/2002 | Batey et al. |
| 6,429,483 B1 | 8/2002 | Teramoto |
| 6,461,899 B1 | 10/2002 | Kitakado et al. |
| 6,478,263 B1 | 11/2002 | Yamazaki et al. |
| 6,492,681 B2 | 12/2002 | Koyama et al. |
| 6,524,895 B2 | 2/2003 | Yamazaki et al. |
| 6,531,713 B1 | 3/2003 | Yamazaki |
| 6,534,826 B2 | 3/2003 | Yamazaki |
| 6,573,195 B1 | 6/2003 | Yamazaki et al. |
| 6,632,708 B2 | 10/2003 | Sakama et al. |
| 6,645,826 B2 | 11/2003 | Yamazaki et al. |
| 6,730,992 B2 | 5/2004 | Sakama et al. |
| 6,784,495 B2 | 8/2004 | Koyama et al. |
| 6,853,002 B2 | 2/2005 | Yamazaki et al. |
| 6,858,898 B1 | 2/2005 | Hayakawa et al. |
| 7,015,505 B2 | 3/2006 | Yamazaki et al. |
| 7,064,388 B2 | 6/2006 | Hayakawa et al. |
| 7,132,686 B2 | 11/2006 | Yamazaki et al. |
| 7,262,432 B2 | 8/2007 | Yamazaki et al. |
| 2001/0004121 A1 | 6/2001 | Sakama et al. |
| 2001/0011725 A1 | 8/2001 | Sakama et al. |
| 2003/0100150 A1 | 5/2003 | Kitakado et al. |
| 2004/0079952 A1 | 4/2004 | Yamazaki et al. |
| 2004/0238820 A1 | 12/2004 | Sakama et al. |
| 2005/0118751 A1 | 6/2005 | Yamazaki et al. |
| 2006/0267114 A1 | 11/2006 | Hayakawa et al. |
| 2007/0034870 A1 | 2/2007 | Yamazaki et al. |

FOREIGN PATENT DOCUMENTS

| | | |
|---|---|---|
| JP | 58-164268 | 9/1983 |
| JP | 64-35961 | 2/1989 |
| JP | 1-268060 | 10/1989 |
| JP | 1-276672 | 11/1989 |
| JP | 3-179778 | 8/1991 |
| JP | 4-369271 | 12/1992 |
| JP | 5-55581 | 3/1993 |
| JP | 5-102483 | 4/1993 |
| JP | 5-275702 | 10/1993 |
| JP | 6-85278 | 3/1994 |
| JP | 6-318703 | 11/1994 |
| JP | 7-130652 | 5/1995 |
| JP | 7-335900 | 12/1995 |
| JP | 8-55846 | 2/1996 |
| JP | 8-55847 | 2/1996 |
| JP | 8-55848 | 2/1996 |
| JP | 8-64834 | 3/1996 |
| JP | 8-78329 | 3/1996 |
| JP | 9-162405 | 6/1997 |
| JP | 10-92576 | 4/1998 |
| JP | 10-135468 | 5/1998 |
| JP | 10-135469 | 5/1998 |
| JP | 10-247735 | 9/1998 |
| JP | 11-223839 | 8/1999 |
| JP | 2001-135824 | 5/2001 |
| WO | WO 90/13148 A1 | 11/1990 |
| WO | WO 99/10918 A1 | 3/1999 |

OTHER PUBLICATIONS

Kapoor, V.J., "Review of Thin Oxynitride Dielectrics for Memory Device Technology," Journal of the Electrochemical Society, vol. 138, No. 3, 1991, pp. 657-666.

Yeh, J.L., et al, "Structural and Optical Properties of Amorphous Silicon Oxynitride," J. Appl. Phys., vol. 79, No. 2, Jan. 15, 1996, pp. 656-663.

Inui, S. et al, "Thresholdless Antiferroelectricity in Liquid Crystals and its Application to Displays," J. Mater. Chem., vol. 6, No. 4, 1996, pp. 671-673.

Yoshida, T. et al, "A Full-Color Thresholdless Antiferroelectric LCD Exhibiting Wide Viewing Angle with Fast Response Time," SID 97 Digest, 1997, pp. 841-844.

Furue, H. et al, "Characteristics and Driving Scheme of Polymer-Stabilized Monostable FLCD Exhibiting Fast Response Time and High Contrast Ratio with Gray-Scale Capability," SID 98 Digest, 1998, pp. 782-785.

Worhoff, K. et al, "Silicon Oxynitride in Integrated Optics," Lasers and Electro-Optics Society Annual Meeting, LEOS '98, IEEE, vol. 2, Dec. 1998, pp. 370-371.

Terada, M. et al, "Half-V Switching Mode FLCD," Proceedings of the 46th Applied Physics Association Lectures, Society for Applied Physics of Japan, 28p-V-8, Mar. 1999, p. 1316.

Schenk, H. et al, "Polymers for Light Emitting Diodes," EURODISPLAY'99, Proceedings of the 19$^{th}$ International Display Research Conference, Sep. 6-9, Berlin, Germany, 1999, pp. 33-37.

Yoshihara, T. et al, "Time Division Full Color LCD by Ferroelectric Liquid Crystal," EKISHO, vol. 3, No. 3, 1999, pp. 190-194.

*Merriam-Webster's Collegiate Dictionary*, 10$^{th}$ edition, 1999, pp. 14 and 827.

* cited by examiner (1st BLOCKING LAYER THICKNESS [nm])

(1st BLOCKING LAYER THICKNESS [nm])

(1st BLOCKING LAYER THICKNESS [nm])

(1st BLOCKING LAYER THICKNESS [nm])

(1st BLOCKING LAYER THICKNESS [nm])

(1st BLOCKING LAYER THICKNESS [nm])

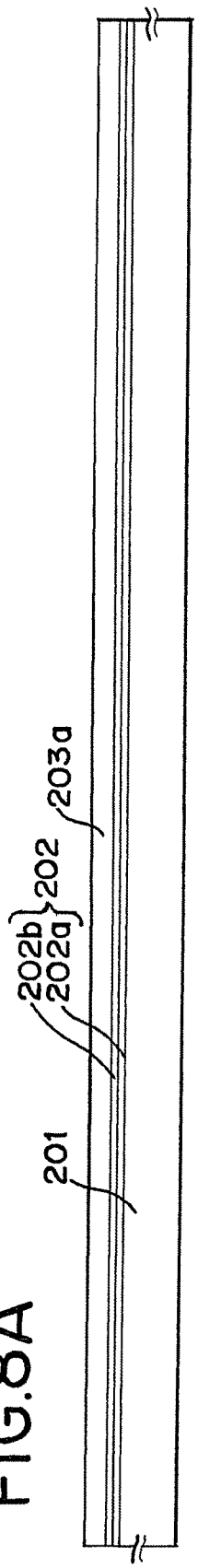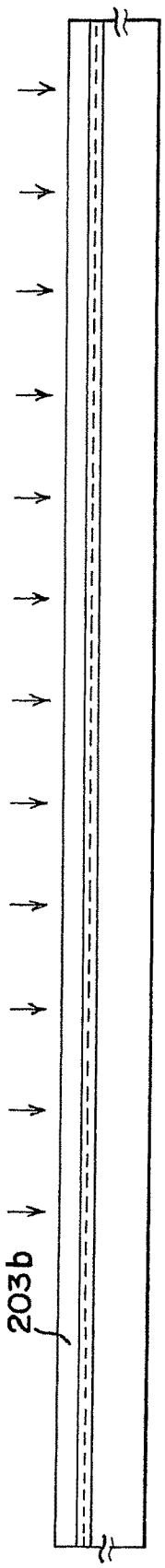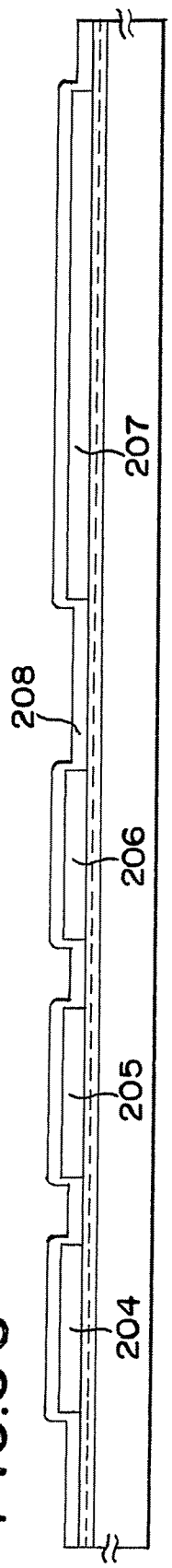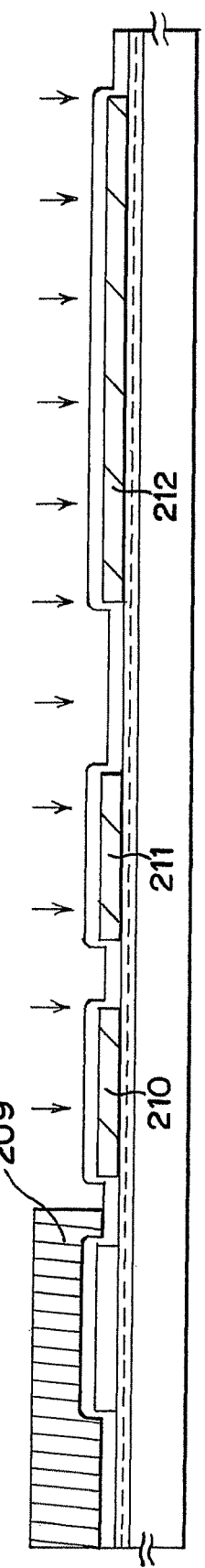

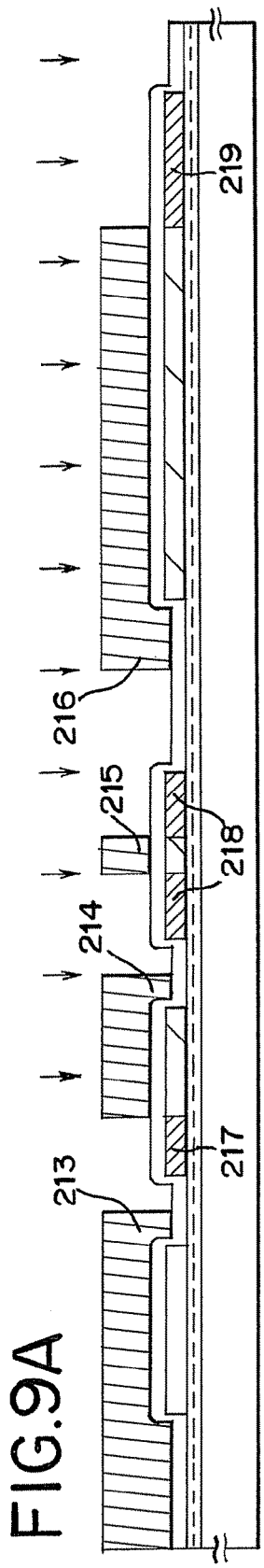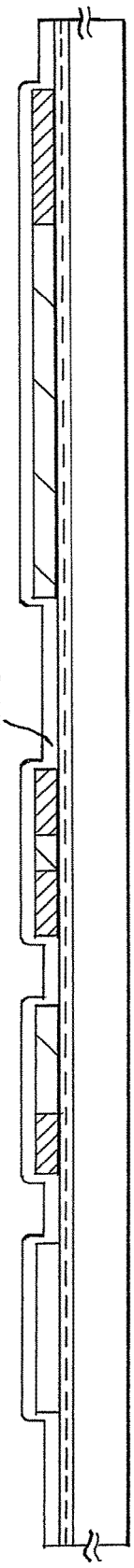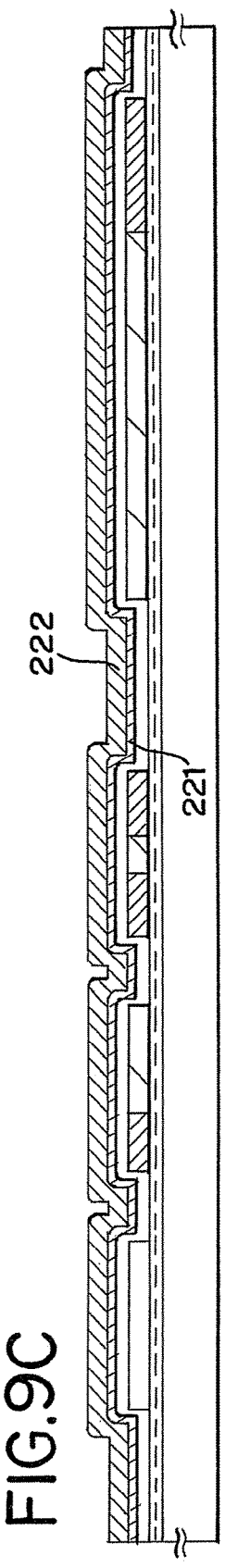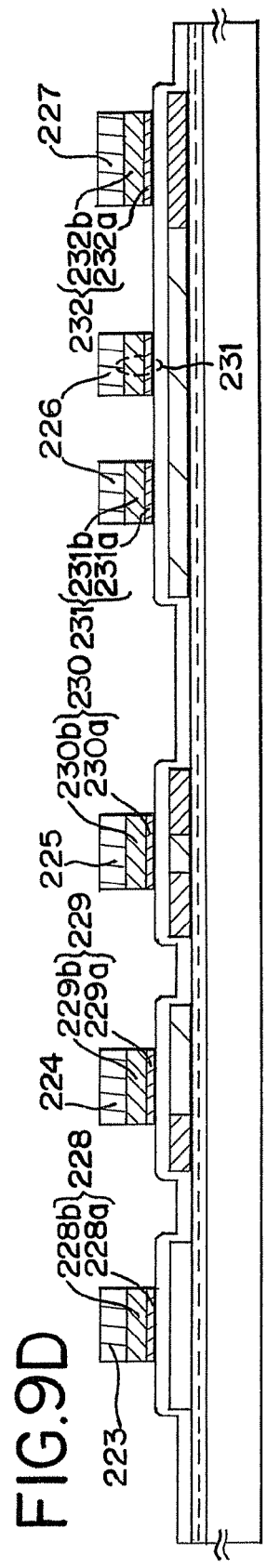

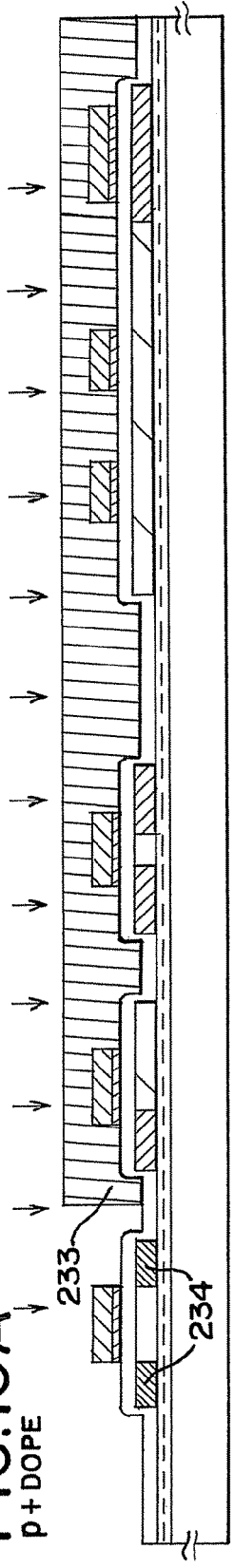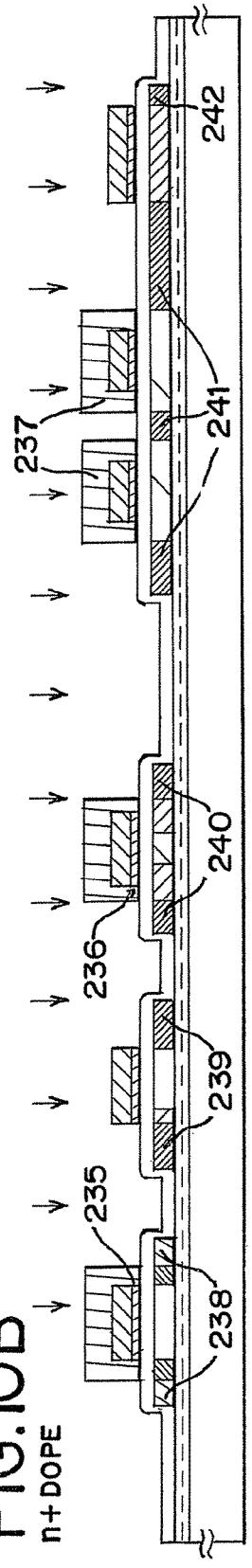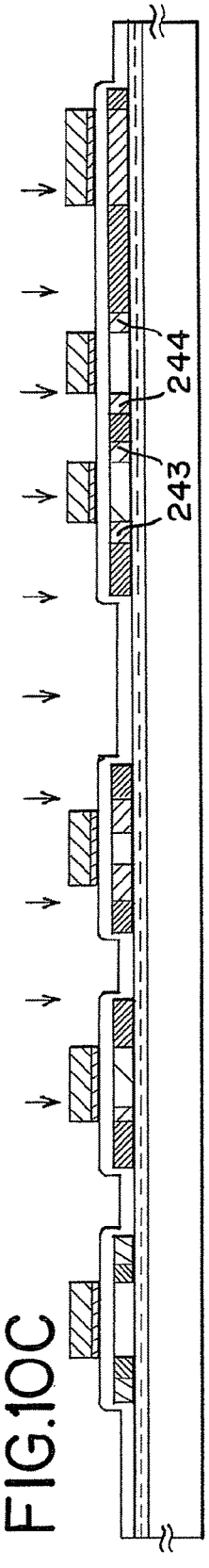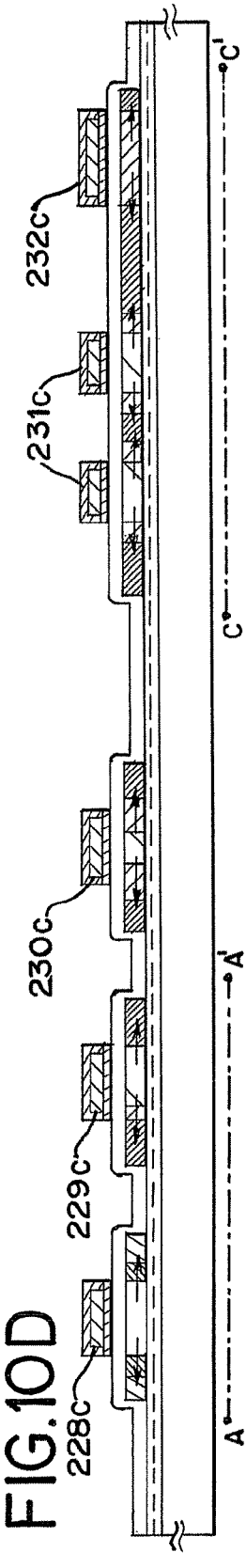
FIG.10A p+ DOPE
FIG.10B n+ DOPE
FIG.10C
FIG.10D

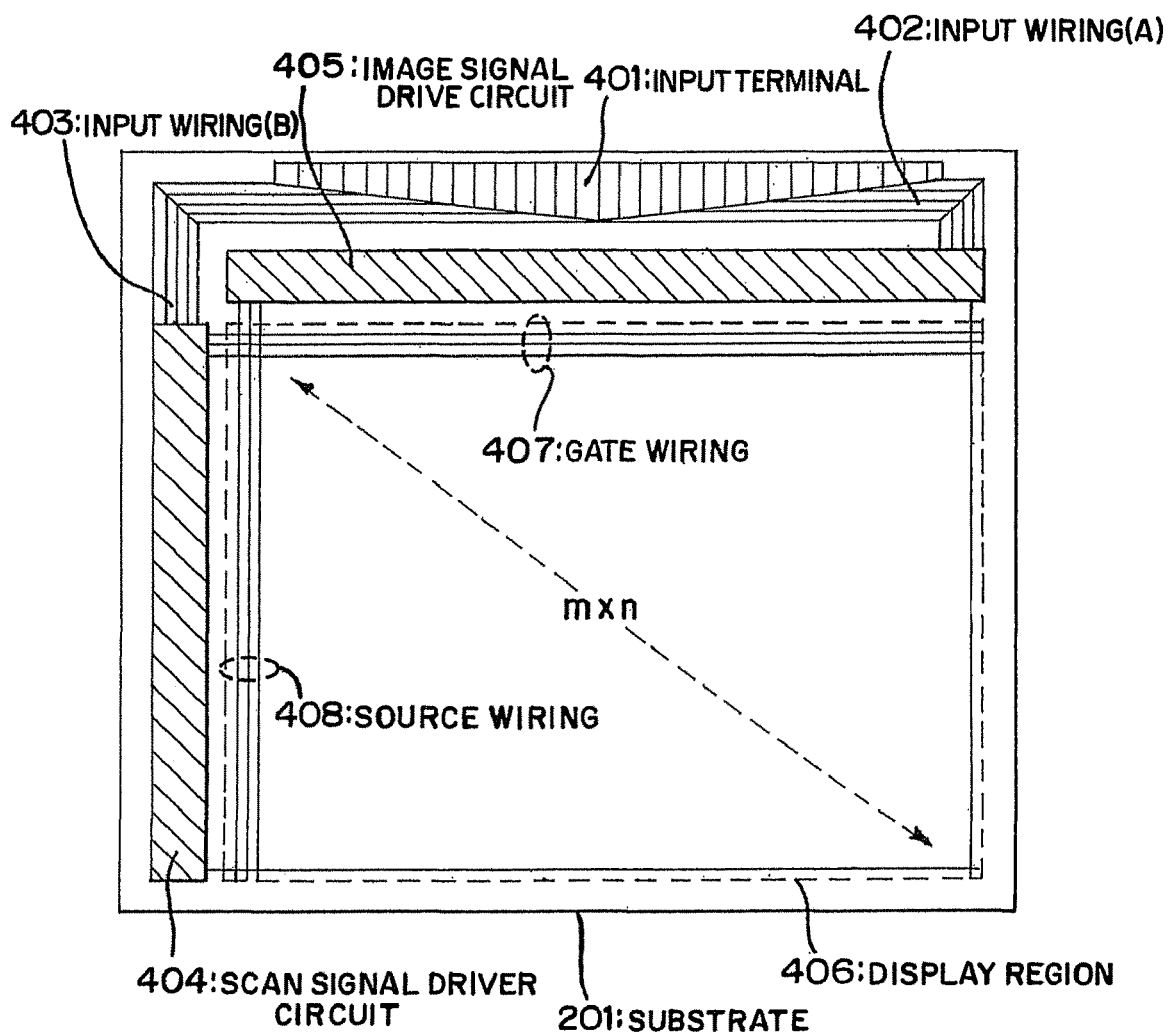

LIGHT SOURCE OPTICAL SYSTEM AND DISPLAY DEVICE (3 PLATE SYSTEM)

LIGHT SOURCE OPTICAL SYSTEM

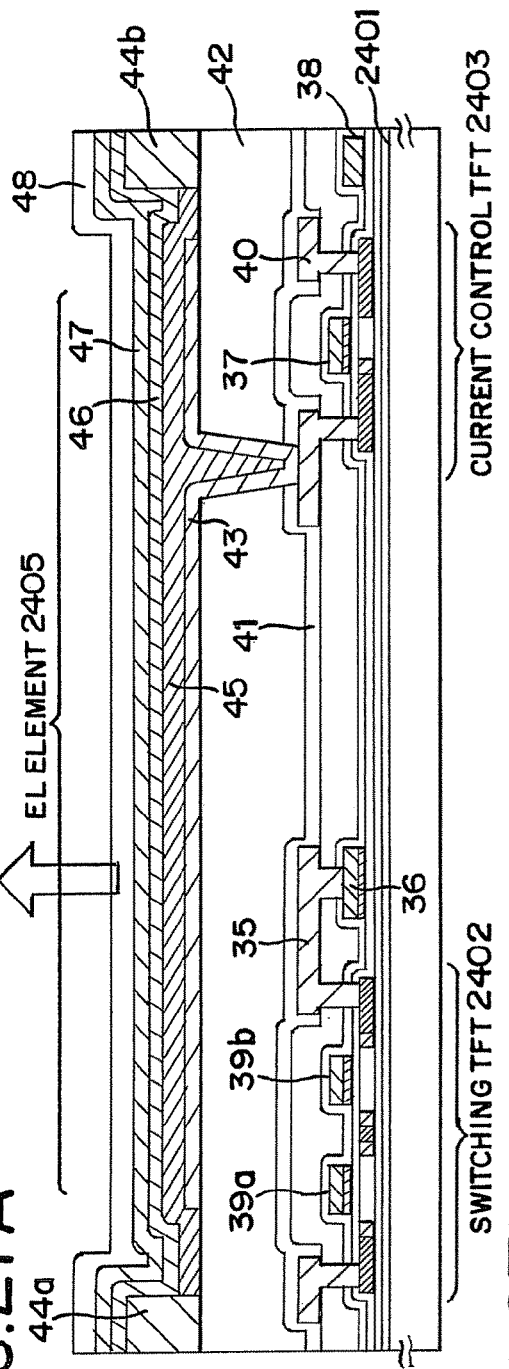
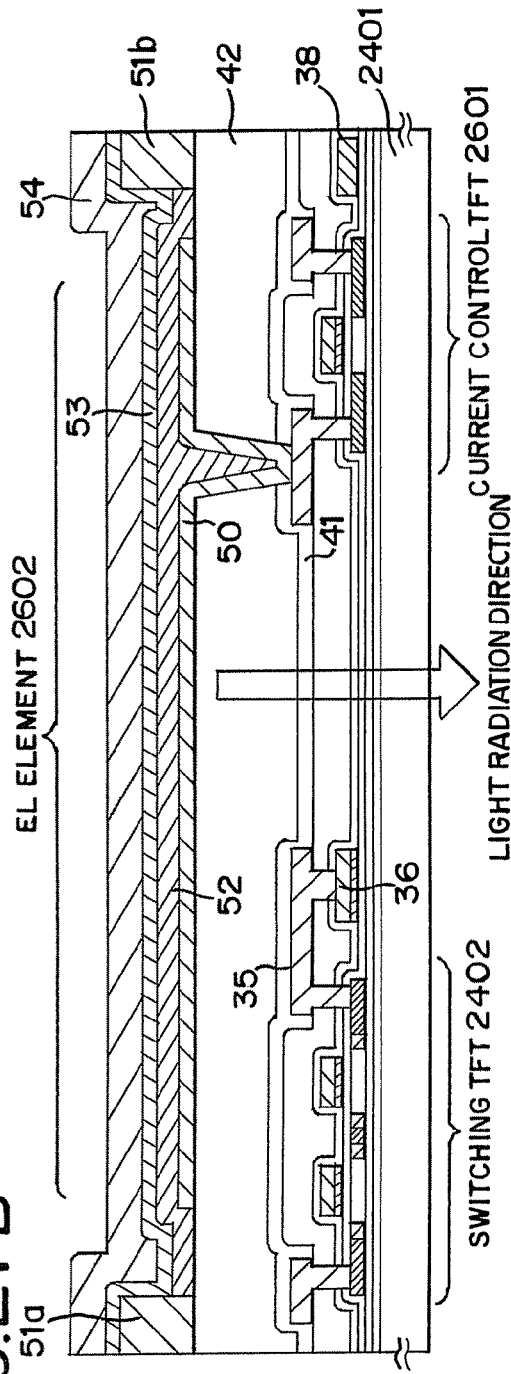

SEMICONDUCTOR DEVICE AND MANUFACTURING METHOD THEREOF

This application is a continuation of U.S. application Ser. No. 11/119,431 filed on Apr. 29, 2005 now U.S. Pat. No. 7,456,474 which is a continuation of U.S. application Ser. No. 10/260,698 filed on Sep. 30, 2002 (now U.S. Pat. No. 6,940,124 issued Sep. 6, 2005) which is a divisional of U.S. application Ser. No. 09/558,736, filed on Apr. 26, 2000 (now U.S. Pat. No. 6,461,899 issued Oct. 8, 2002).

BACKGROUND OF THE INVENTION

1. Field of the Invention

The present invention relates to a semiconductor device formed by a circuit made from a thin film transistor (hereafter referred to as TFT) formed on a substrate, and a method of manufacturing thereof. In particular, the present invention relates to an insulating film formed between a semiconductor layer which is an active layer of the TFT, and the substrate. This kind of insulting film is referred to as a blocking layer or a base film. Along with obtaining good TFT characteristics, the present invention relates to a suitable insulating film structure for preventing deterioration of the TFT, and the method of its manufacture.

The semiconductor device of the present invention includes a display device having a TFT or a semiconductor circuit including TFTs, and an electro-optical device such as an image sensor. In addition, the semiconductor device of the present invention also includes electronic equipment loaded with these display devices and electro-optical devices as the category.

2. Description of the Related Art

Active matrix display devices in which thin film transistors (hereafter referred to as TFTs) having an active layer formed by a crystalline semiconductor layer are used as pixel switching elements, and used to form driver circuits, have been in the spotlight in recent years as a means of realizing a high definition, high image quality image display. A crystalline silicon layer, for example, in which an amorphous silicon layer is crystallized by a method such as laser annealing or thermal annealing, is suitably used as a crystalline semiconductor layer material. A TFT using a crystalline silicon layer can realize a high electric field effect mobility and has good current drive capabilities, and therefore fine processing becomes possible, and it becomes possible to improve the aperture ratio of the pixel portion.

In order to realize a large surface area, low cost display in this type of active matrix display device, the use of a glass substrate, having a lower cost than a quartz substrate, becomes a premise. Due to its heat resistance temperature, it is therefore necessary to set the maximum production temperature from 600 to 700° C. or less. However, alkaline metals such as sodium (Na) are contained in the glass substrate in microscopic amounts. Consequently, it becomes necessary to form a blocking layer, made from a film such as a silicon oxide film or a silicon nitride film, on at least the surface of the substrate on which the TFTs are formed, so that the alkaline metal elements do not become mixed into the active layers of the TFTs.

Top gate type and bottom gate type (or inverse stagger type) structure is known structures for a TFT manufactured on a glass substrate. A top gate type structure is one in which at least a gate insulating film and a gate electrode are formed on the active layer on the side opposite that of the substrate. A blocking layer such as the one stated above is then formed on the face of the active layer opposite to the side contacting the gate insulating film (hereafter referred to as the back channel side in this specification for convenience).

TFT characteristics can be shown by typical parameters such as electric field effect mobility and threshold voltage (hereafter abbreviated to $V_{th}$). As shown in FIG. 23A in the graph of (drain current)$^{1/2}$ vs. gate voltage (hereafter abbreviated as $I_d$ and $V_g$, respectively), $V_{th}$ can be found by extrapolating the straight line region to the $V_g$ axis. Further, the relationship between the drain current and the gate voltage in the neighborhood or below, $V_{th}$ is referred to as the sub-threshold characteristic, and is an important property for determining the TFT performance as a switching element. A sub-threshold coefficient (hereafter shortened to S value) is used as a constant showing the merit of the sub-threshold characteristic. As shown in FIG. 23B, when the sub-threshold characteristics are plotted on a semi-log graph, the S value is defined as the gate voltage required in order to have a change of one order of magnitude in the drain current. The smaller the S value is, the faster it is possible to operate the TFT, and the lower its power consumption becomes. Furthermore, in a shift register circuit formed in a driver circuit, if the S value is large (if the sub-threshold characteristics are poor), then charge loss occurs due to the leak current, and this causes a fatal operation fault.

It is good, then, for the sake of circuit operation, to set $V_{th}$ at between 0.5 and 2.5 V for an n-channel TFT, and at between −2.5 and −0.5 V for a P-channel TFT, but if the active layer becomes one with n-type conductivity due to an unintentional cause, then $V_{th}$ may shift to the order of −4 to −3 V. If this happens, then the n-channel TFT becomes in the on state even when the gate voltage is not applied, and the designed switching characteristics cannot be obtained. The circuit becomes impossible to operate.

In order to control the value of $V_{th}$, a method of doping an impurity element that imparts p-type conductivity into a channel forming region of the active layer, at a concentration about $1\times10^{16}$ and $5\times10^{17}$ atoms/cm$^3$, is employed. This type of measure is referred to as a channel dope, and is important in the manufacture processes of the TFT.

When voltage is applied to the gate electrode in a top gate type TFT, alkaline metal element within the glass substrate which have been ionized are drawn to the active layer side by the polarity of the voltage. If the quality of the blocking layer is poor, the ions then easily mix into the active layer, change the electrical characteristics of the TFT, and the reliability cannot be maintained over time.

If a silicon nitride film is used as the blocking layer, then the blocking effect of impurity ions is high, but there are many trap levels, and further, the internal stress is large. Therefore, there is a fear of problems developing with the TFT characteristics if a silicon nitride film is formed directly contacting the active layer. On the other hand, a silicon oxide film has a wider band gap than a silicon nitride film, has superior insulating characteristics, and has the advantage of few trap levels. However, a silicon oxide film has disadvantages of moisture absorbency, and a low blocking effect against impurity ions.

If this type of blocking layer is formed, and an amorphous semiconductor layer is formed thereon, and then formed into a crystalline semiconductor layer by laser annealing or thermal annealing, then the internal stress of the blocking layer changes. This imparts a warping of the crystalline semiconductor film, and even if the TFT is completed in this state, the electrical characteristics such as $V_{th}$ and the S value will deviate from their intended values. As a result, it becomes impossible to operate the TFT at the desired voltage.

A channel dope is a method which is effective in controlling $V_{th}$, but if $V_{th}$ shifts to the order of −4 to −3 V when a circuit such as a CMOS circuit is formed by forming both an n-channel TFT and a P-channel TFT on the same substrate, then it is difficult to control the $V_{th}$ of both TFTs with one channel dope. In other words, in order to make the $V_{th}$ of the n-channel TFT between 0.5 and 2.5 V, and the $V_{th}$ of the P-channel TFT from −2.5 to −0.5 V, the amount of impurity element which must be added is not the same. If channel doping is performed twice, the number of process steps increases, and this is a cause of increases manufacturing costs.

SUMMARY OF THE INVENTION

An object of the present invention is to provide a TFT that can be manufactured without dispersion of TFT characteristics, typically $V_{th}$ and the S value, and with stable characteristics, and to provide a method of manufacturing thereof. Another object of the invention is to provide an active matrix liquid crystal display device using this type of TFT.

In order to solve the above stated problems, a blocking layer is formed on the back channel side of the TFT from a laminate of a silicon oxynitride film (A)(also called "silicon nitride oxide") manufactured from $SiH_4$, $NH_3$, and $N_2O$, and a silicon oxynitride film (B) manufactured from $SiH_4$ and $N_2O$. By using this type of laminate silicon oxynitride film structure, contamination by alkaline metallic elements from the substrate can be prevented, and the impact of stress imparted to the TFT caused by internal stress can be relieved.

A method such as plasma CVD, reduced pressure CVD, or ECR-CVD is used as a method of manufacturing the silicon oxynitride films. $SiH_4$, $NH_3$, and $N_2O$ are used as raw material gasses. It is possible to regulate the composition ratios by controlling the amount of raw material gasses supplied, or by regulating parameters related to film deposition such as reaction pressure, discharge power, discharge frequency, and substrate temperature. $NH_3$ is for supplementing the nitrification of the silicon oxynitride film, and the amount of nitrogen contained in the silicon oxynitride film can be effectively controlled by suitably regulating the amount of $NH_3$.

The concentration of oxygen contained in the silicon oxynitride film (A) is made more than or equal to 20 atomic %, and less than or equal to 30 atomic %, while the concentration of nitrogen is made more than or equal to 20 atomic %, and less than or equal to 30 atomic %. Alternatively, the composition ratio of nitrogen with respect to oxygen is made more than or equal to 0.6, and less than or equal to 1.5. Further, the concentration of oxygen contained in the silicon oxynitride film (B) is made more than or equal to 55 atomic %, and less than or equal to 65 atomic %, while the concentration of nitrogen is made more than or equal to 1 atomic %, and less than or equal to 20 atomic %. Alternatively, the composition ratio of nitrogen with respect to oxygen is made more than or equal to 0.01, and less than or equal to 0.4. The concentration of hydrogen contained in the silicon oxynitride film (A) is made more than or equal to 10 atomic %, and less than or equal to 20 atomic %, while the concentration of hydrogen contained in the silicon oxynitride film (B) is made more than or equal to 0.1 atomic %, and less than or equal to 10 atomic %.

In order to improve the ability to block alkaline metallic elements, it is necessary to make the film dense by increasing the amount of nitrogen contained in the silicon oxynitride film. However, if the ratio of nitrogen contained in the silicon oxynitride film is raised, then the trap levels are increased, and further, the internal stress becomes large, so that it is not suitable to form the active layer directly contacting this film. A silicon oxynitride film having a different composition, in which the amount of nitrogen contained is less than the amount of oxygen contained, is formed.

Further, a blocking layer formed before amorphous semiconductor layer changes the internal stress around a crystallization step for the amorphous semiconductor layer. Considering the influence to a crystalline semiconductor layer, it is necessary to make the amount of change in internal stress small. In order to prepare a blocking layer having these characteristics, an appropriate range for the composition and the film thickness of the silicon oxynitride films is necessary, and the present invention discovers those values.

The alkaline metallic element blocking ability is achieved by the silicon oxynitride film (A) formed adhering to a glass substrate and with a thickness of 10 to 150 nm, preferably between 20 and 60 nm, and by the silicon oxynitride film (B) formed thereon with a thickness of 10 to 250 nm, preferably between 20 and 100 nm.

The silicon oxynitride film (A) is then set to a density of more than or equal to $8 \times 10^{22}$ atoms/cm$^3$, and less than or equal to $2 \times 10^{23}$ atoms/cm$^3$, and the silicon oxynitride film (B) is set to a density of more than or equal to $6 \times 10^{22}$ atoms/cm$^3$, and less than or equal to $9 \times 10^{22}$ atoms/cm$^3$. The etching rate of the silicon oxynitride film (A) by a mixed aqueous solution of 7.13% ammonium hydrogen fluoride ($NH_4HF_2$) and 15.4% ammonium fluoride ($NH_4F$) at 20° C. is between 60 and 70 nm/min (between 40 and 50 nm/min after heat treatment at 500° C. for 1 hour and at 550° C. for 4 hours), and the etching rate of the silicon oxynitride film (B) is between 110 and 130 nm/min (between 90 and 100 nm/min after heat treatment at 500° C. for 1 hour and at 550° C. for 4 hours). The etching rates defined here are values obtained by using an aqueous solution of 7.13% $NH_4HF_2$ and 15.4% $NH_4F$ as an etching solution at 20° C.

The blocking layer is formed by laminating the silicon oxynitride film (A) and the silicon oxynitride film (B), and therefore it is necessary to consider the internal stresses of the laminate state, and the amount of change in internal stress around the crystallization step is set so as to be $1 \times 10^4$ Pa or less.

BRIEF DESCRIPTION OF THE DRAWINGS

In the accompanying drawings:

FIGS. 8A to 8D are cross-sectional views showing manufacturing processes for a pixel TFT, a storage capacitor, and driver circuit TFTs;

FIGS. 9A to 9D are cross-sectional views showing manufacturing processes for a pixel TFT, a storage capacitor, and driver circuit TFTs;

FIGS. 10A to 10D are cross-sectional views showing manufacturing processes for a pixel TFT, a storage capacitor, and driver circuit TFTs;

FIG. 17 is a top view showing an input output terminal, and the wiring circuit layout, of a liquid crystal display device;

FIGS. 27A and 27B are cross-sectional views of the pixel portion of an EL display device;

DETAILED DESCRIPTION OF THE PREFERRED EMBODIMENTS

Embodiment Mode 1

A process of manufacturing a CMOS circuit made from an n-channel TFT and a P-channel TFT is explained in embodiment mode 1. Together, the processes leading to the present invention are explained. FIGS. 1A to 2F are used to explain embodiment mode 1. A method of manufacturing the n-channel TFT and the P-channel TFT on the same substrate, which is necessary to form the CMOS circuit, is explained in detail here in accordance with process steps. The composition and the structure of a suitable blocking layer for setting desired values of the TFT $V_{th}$ and the S value are made evident.

Figure 1A:
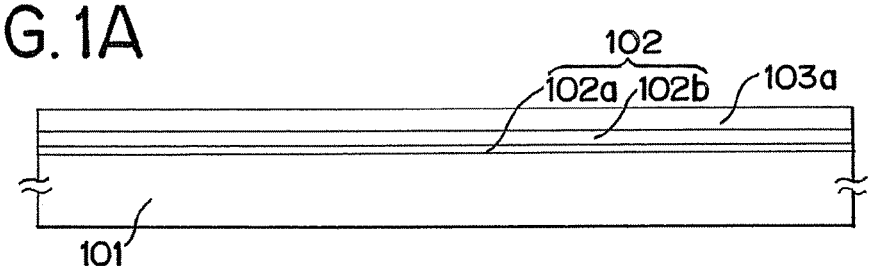
FIGS. 1A to 1F are cross-sectional views showing manufacturing processes for a TFT.

<Formation of Blocking Layer and Formation of Amorphous Semiconductor Layer: FIG. 1A>

A material such as barium borosilicate glass or aluminum borosilicate glass, typically Corning Corp. #7059 glass or #1737 glass substrate, is used as a glass substrate 101 in FIG. 1A. Although in microscopic amounts, alkaline metal elements such as sodium are contained in this kind of glass substrate. Heat treatment may be performed in advance at a temperature between 10 and 20° C. below the distortion point of the glass. A blocking layer 102 is formed on the surface of the substrate 101 on which the TFTs are formed, in order to prevent contamination by alkaline metal elements or other impurities. The blocking layer 102 is formed with a silicon oxynitride film (A) 102a formed from $SiH_4$, $NH_3$, and $N_2O$, and a silicon oxynitride film (B) 102b made from $SiH_4$ and $N_2O$. The silicon oxynitride film (A) 102a is formed with a thickness of 10 to 100 nm (preferably between 20 and 60 nm), and the silicon oxynitride film (B) 102b is formed with a thickness of 10 to 200 nm (preferably between 20 and 100 nm).

The silicon oxynitride film (A) and the silicon oxynitride film (B) may be formed by a known deposition method, but using plasma CVD is the most preferable. Typical manufacturing conditions in this case are shown in Table 1. Furthermore, manufacturing conditions suitable for an interlayer insulating film are shown in Table 1 for comparison, and the film formed under these conditions is referred to as a silicon oxynitride film (C). The gas flow rate S are each the conditions shown in Table 1, and other manufacturing conditions are as follows for the silicon oxynitride film (A): a substrate temperature of 325° C., a reaction pressure of 40 Pa, a discharge power density of 0.41 W/cm², and a discharge frequency of 60 MHz. For the silicon oxynitride film (B), the manufacturing conditions are: a substrate temperature set to 400° C., and other manufacturing conditions except for the gas flow rates set similar to those of the silicon oxynitride film (A). The silicon oxynitride film (C) is given different gas flow rates with respect to the silicon oxynitride film (B), and in addition, the reaction pressure is set to 93 Pa, the discharge power density is set to 0.12 W/cm², and the discharge frequency is set to 13.56 MHz.

TABLE 1

| | | Oxidized silicon nitride film(A) | Oxidized silicon nitride film(B) | Oxidized silicon nitride film(C) |
|---|---|---|---|---|
| Deposition temperature(° C.) | | 325 | 400 | 400 |
| Gas flow rate (SCCM) | SiH | 10 | 4 | 10 |
| | $N_2O$ | 20 | 400 | 700 |
| | $NH_3$ | 100 | 0 | 0 |

TABLE 1-continued

|  | Oxidized silicon nitride film(A) | Oxidized silicon nitride film(B) | Oxidized silicon nitride film(C) |
|---|---|---|---|
| Pressure(Pa) | 40 | 40 | 93 |
| Discharge power density(W/cm$^2$) | 0.41 | 0.41 | 0.12 |
| Power source frequency(MHz) | 60 | 60 | 13.56 |

The characteristics of the silicon oxynitride films (A) to (C) thus manufactured are brought together and shown in Table 2. The composition ratios and densities of hydrogen (H), nitrogen (N), oxygen (O) and silicon (Si) found by Rutherford back scattering spectrometry (hereafter abbreviated as RBS; device used is system 3S-R10, accelerator is NEC 3SDH pelletron, and end station is CE&A RBS-400) are shown in Table 2. The densities of N—H bonds and of Si—H bonds found by Fourier transform infrared spectroscopy (hereafter referred to as FT-IR; device used is Nicolet Magna-IR 760) are also shown in Table 2, as are etching speeds at 20° C. in an aqueous solution containing 7.13% ammonium hydrogen fluoride (NH$_4$HF$_2$) and 15.4% ammonium fluoride (NH$_4$F) (manufactured by Stela-chemifa Corp.; under the product name of LAL500), and changes in internal stresses due to thermal annealing. An Ionic System Corp. model 30114 is used as the measurement device for internal stress, and a sample manufactured on a silicon wafer substrate was measured. The internal stresses shown by a + symbol are tensile stresses (a stress transforming the film in the inside direction), and the internal stresses shown by a − symbol are compressive stresses (a stress transforming the film in the outside direction).

film (B) (after thermal annealing), and it can be presumed that the silicon oxynitride film (A) is a dense film from the fact that the etching speed becomes slower. Comparing by wet etching speed, the silicon oxynitride film (C) has a faster etching speed than that of the silicon oxynitride film (B), and it can be presumed that it is a film with a small density.

The manufacturing conditions of the silicon oxynitride films are of course not limited to those of Table 1. The silicon oxynitride film (A) may be made by: using SiH$_4$, NH$_3$, and N$_2$O; using a substrate temperature of between 250 and 450° C., a reaction pressure of between 10 and 100 Pa, and a power source frequency of 13.56 MHz or higher; setting the discharge power density from 0.15 to 0.80 W/cm$^2$; making the hydrogen concentration between 10 and 30 atomic %, the nitrogen concentration between 20 and 30 atomic %, the oxygen concentration between 20 and 30 atomic %, and the density from $8 \times 10^{22}$ to $2 \times 10^{23}$ atoms/cm$^3$; and making the etching speed by the above aqueous solution, containing 7.13% ammonium hydrogen fluoride (NH$_4$HF$_2$) and 15.4* ammonium fluoride (NH$_4$F), between 40 and 70 μm/min. On the other hand, the silicon oxynitride film (B) may be made by: using SiH$_4$ and N$_2$O; using a substrate temperature of between 250 and 450° C., a reaction pressure of between 10

TABLE 2

|  |  |  | Oxidized Silicon nitride film(A) | Oxidized silicon nitride film(B) | Oxidized silicon nitride film(C) |
|---|---|---|---|---|---|
| Composition (atomic %) | H |  | 16.5 | 1.5 | — |
|  | N |  | 24 | 7 | — |
|  | O |  | 26.5 | 59.5 | — |
|  | Si |  | 33 | 32 | — |
| Density (/cm$^3$) |  |  | $9.28 \times 10^{22}$ | $7.08 \times 10^{22}$ | — |
| Hydrogen amount (atomic/cm$^3$) | NH | As deposited | $8.09 \times 10^{21}$ | $5.46 \times 10^{20}$ | $8.86 \times 10^{20}$ |
|  |  | Annealed | $7.42 \times 10^{21}$ | $2.06 \times 10^{20}$ | — |
|  | SiH | As deposited | $8.74 \times 10^{20}$ | — | — |
|  |  | Annealed | $2.18 \times 10^{20}$ | — | — |
| Wet etching speed (nm/min) |  | As deposited | 63 | 120 | 200 |
|  |  | Annealed | 44 | 96 | 130 |
| Internal stress (dynes/cm$^2$) |  | As deposited | $8.07 \times 10^9$ | $(-4.26 \times 10^9)$ | $(-2.00 \times 10^9)$ |
|  |  | Annealed | $7.42 \times 10^{10}$ | $(-7.29 \times 10^7)$ | $(-1.30 \times 10^9)$ |

The silicon oxynitride film (A) has a composition ratio of nitrogen with respect to oxygen of 0.91, and compared to the 0.12 composition ratio of the silicon oxynitride film (B), this is a condition in which the ratio of nitrogen contained is high. The composition ratio of hydrogen with respect to oxygen becomes 0.62 in the silicon oxynitride film (A) at this point, while that of the silicon oxynitride film (B) is 0.03. As a result, densities are increased, and the wet etching speed of the silicon oxynitride film (A) becomes 44 nm/min (after thermal annealing), compared to 96 nm/min for the silicon oxynitride and 100 Pa, and a power source frequency of 13.56 MHz or higher; setting the discharge power density from 0.15 to 0.80 W/cm$^2$; making the hydrogen concentration between 0.1 and 10 atomic %, the nitrogen concentration between 1 and 20 atomic %, the oxygen concentration between 55 and 65 atomic %, and the density from $6 \times 10^{22}$ to $9 \times 10^{22}$ atoms/cm$^3$; and making the etching speed by the above aqueous solution, containing 7.13% ammonium hydrogen fluoride (NH$_4$HF$_2$) and 15.4% ammonium fluoride (NH$_4$F), between 90 and 130 nm/min.

Further, values are shown in Table 2 for the bonded hydrogen amounts, the wet etching speeds, and the internal stresses both after film deposition and after heat treatment (at 500° C. for 1 hour, then at 550° C. for 4 hours; equivalent to the processing conditions of the crystallization step). As made clear by the characteristics of Table 2, hydrogen is driven out of the silicon oxynitride films by this heat treatment, the films are made more dense, and the tensile stresses change to become larger.

A semiconductor layer 103a having an amorphous structure is formed next to a thickness of 25 to 80 nm (preferably between 30 and 60 nm) by a known method, such as plasma CVD or sputtering. Plasma CVD is used in embodiment mode 1 to form a 55-nm thick amorphous silicon film. Semiconductor films having an amorphous structure include amorphous semiconductor films and microcrystal semiconductor films, and compound semiconductor films containing an amorphous structure, such as an amorphous silicon germanium film, are also suitable. Further, the blocking layer 102 and the amorphous semiconductor layer 103a may both be formed successively. For example, after depositing the blocking layer 102b by plasma CVD, by only changing the reaction gasses from $SiH_4$ and $N_2O$ to $SiH_4$ and $H_2$, or to only $SiH_4$, both layers can be successively formed without any exposure to the atmosphere. As a result, it is possible to prevent contamination of the surface of the blocking layer 102b, and dispersion in the characteristics of the manufactured TFT, and fluctuations in the threshold voltage, can be reduced.

Figure 1B:
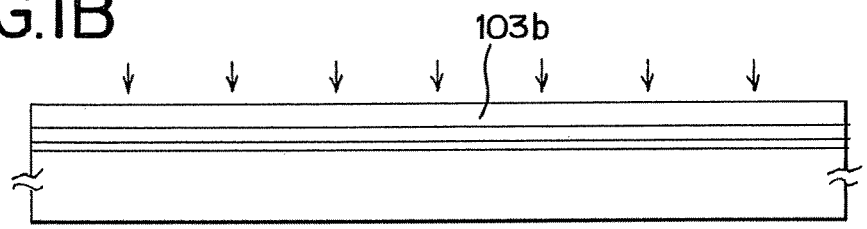

<Crystallization Process: FIG. 1B>

A crystalline semiconductor layer 103b is then formed from the amorphous semiconductor layer 103a using a known crystallization technique. For example, laser annealing and thermal annealing (solid state growth methods), and rapid thermal annealing (RTA) are applicable. In the RTA method, a lamp such as an infrared lamp, a halogen lamp, a metal halide lamp, or a xenon lamp is used as a light source. The crystalline semiconductor layer 103b can be formed by a crystallization method using a catalytic element, in accordance with the technique disclosed in Japanese Patent Application Laid-open No. Hei 7-130652 or U.S. Pat. No. 5,643, 826. The entire disclosure of these patents are incorporated herein by reference. It is essential to drive out the hydrogen contained in the amorphous semiconductor layer, and therefore it is desirable to first perform heat treatment for approximately one hour at between 400 and 500° C., reducing the amount of hydrogen contained in the amorphous semiconductor layer to 5 atomic % or less, and then performing crystallization.

When performing crystallization by laser annealing, a pulse oscillation type, or a continuous light oscillation type, excimer laser or argon laser is used as the light source. If a pulse oscillation type excimer laser is used, then laser annealing is performed after forming the laser light into a linear shape. The laser annealing conditions may be suitably chosen by the operator, but for example, are set as follows: a laser pulse oscillation frequency of 30 Hz, and a laser energy density of between 100 and 500 mJ/cm$^2$ (typically from 300 to 400 mJ/cm$^2$). The linear shape beam is then irradiated over the entire face of the substrate, and irradiation is performed so that the overlap ratio of the linear shape beam is between 80 and 98%. The crystalline semiconductor layer can thus be formed.

In addition, solid state lasers such as a YAG laser, a $YVO_4$ laser, a $YAlO_3$ laser, and a YLF laser can also be used. The second harmonic (532 nm), the third harmonic (355 nm), and the fourth harmonic (266 nm) of these solid state lasers is used rather than the base wavelength of 1064 nm. Heating and crystallization can be performed by the penetration length of the light. Heating is from the surface and from the interior of the semiconductor layer when the second harmonic (532 nm) is used, and is from the surface of the semiconductor layer when the third harmonic (355 nm) or the fourth harmonic (266 nm) is used, similar to an excimer laser.

One example of the crystallization conditions for the amorphous semiconductor film are as follows: a YAG laser with a pulse oscillation frequency set to between 1 and 10 kHz, and a laser energy density from 100 to 500 mJ/cm$^2$ (typically between 100 and 400 mJ/cm$^2$). A linear shape laser light formed by an optical system containing lenses, such as a cylindrical lens, is then scanned in a direction perpendicular to its longitudinal direction (or, the substrate is moved relatively). The line width of the linear shape laser light is between 100 and 1000 μm, for example, 400 μm. By thus jointly using a thermal crystallization method and a laser crystallization method, a crystalline semiconductor film having good crystallinity can be formed.

For the case of thermal annealing, annealing is performed in a nitrogen atmosphere at a temperature about 600 to 660° C. using an annealing furnace. Whichever method is used, realignment of atoms occurs during crystallization of the amorphous semiconductor layer, making it fine and minute, and the thickness of the crystalline semiconductor layer manufactured is reduced about between 1 and 15% from the thickness of the original amorphous semiconductor layer (55 nm in embodiment mode 1).

Figure 1C:
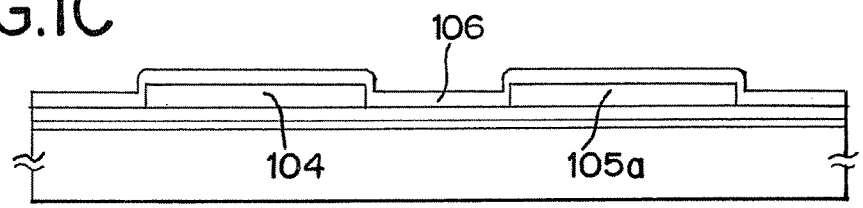

<Formation of Island-Shape Semiconductor Layers, Formation of Mask Layer: FIG. 1C>

A photoresist pattern is then formed on the crystalline semiconductor layer 103b, and the crystalline semiconductor layer is divided into island-shapes by dry etching, forming island-shape semiconductor layers 104 and 105a as active layers. A mixed gas of $CF_4$ and $O_2$ is used in dry etching. A mask layer 106 is then formed from a silicon oxide film with a thickness of 50 to 100 nm formed by plasma CVD, reduced pressure CVD, or sputtering. For example, if plasma CVD is used, tetraethyl orthosilicate (TEOS) and $O_2$ are mixed, the reaction pressure is set to 40 Pa, and the substrate temperature is set between 300 and 400° C., and discharge is conducted at a high frequency (13.56 MHz) power density of 0.5 to 0.8 W/cm$^2$, forming a thickness of 100 to 150 nm, typically 130 nm.

Figure 1D:
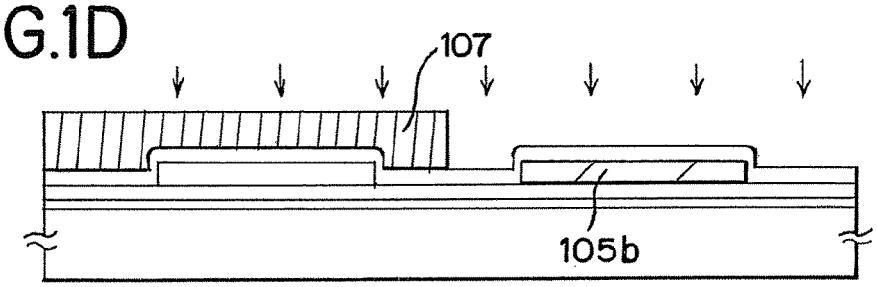

<Channel Doping Process: FIG. 1D>

A photoresist mask 107 is then formed, and an impurity element that imparts p-type conductivity is added into the island-shape semiconductor layer 105a, which forms the n-channel TFT, at a concentration of $1\times10^{16}$ to $5\times10^{17}$ atoms/cm$^3$ in order to control the threshold voltage. Periodic table group 13 elements such as boron (B), aluminum (Al), and gallium (Ga) are known as impurity elements which impart p-type conductivity into a semiconductor. Boron (B) is added here by ion doping using diborane ($B_2H_6$). Boron (B) doping is not always necessary and there is no obstacle in omitting it, but a boron (B) added semiconductor layer 105b can be formed in order to place the threshold voltage of the n-channel TFT within a preset range.

Figure 1E:
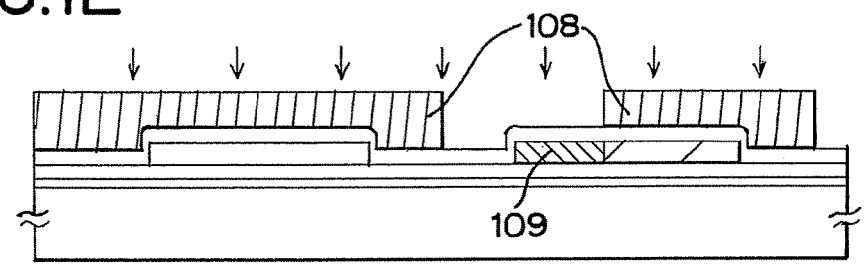

<n$^-$ Doping Process: FIG. 1E>

In order to form an LDD region of the n-channel TFT, an impurity element that imparts n-type conductivity is selectively added into the island-shape semiconductor layer 105b. Periodic table group 15 elements such as phosphorous (P), arsenic (As), and antimony (Sb) are known as impurity elements that impart n-type conductivity into a semiconductor. A photoresist mask 108 is formed, and ion doping using phosphine ($PH_3$) is applied here for adding phosphorous (P). The concentration of phosphorous (P) in an impurity region 109 formed is in the range of $2 \times 10^{16}$ to $5 \times 10^{19}$ atoms/cm$^3$. The concentration of the impurity element for imparting n-type conductivity contained in the impurity region 109 is referred to as n$^-$ throughout this specification.

Figure 1F:
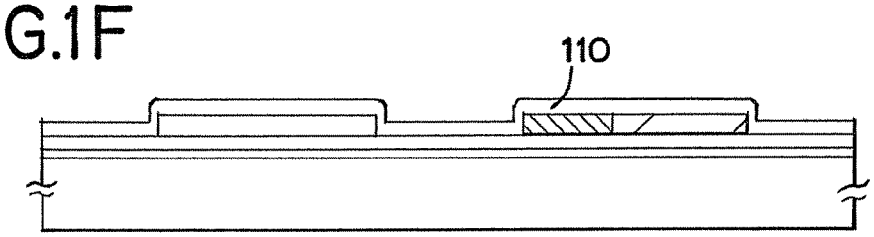

<Mask Layer Removal, Laser Crystallization, and Formation of Gate Insulating Film: FIG. 1F>

The mask layer 106 is next removed by using an etching solution such as hydrofluoric acid diluted by pure water. A process of activating the impurity elements added by FIGS. 1D and 1E into the island-shape semiconductor layer 105b is then performed. Activation can be performed by a method such as thermal annealing in a nitrogen atmosphere for 1 to 4 hours at between 500 and 600 C, or by laser annealing. Further, both methods may be performed together. A laser activation method using KrF excimer laser light (248-nm wavelength) is performed in embodiment mode 1. The laser light is formed into a linear shape beam, the oscillation frequency is set to between 5 and 50 Hz, and the energy density is set from 100 to 500 mJ/cm$^2$, and the linear shape beam is scanned with an overlap ratio of between 80 and 98%, processing the entire surface of the substrate on which the island-shape semiconductor layers are formed. Note that the irradiation conditions of the laser light are not limited to these conditions, and that the operator may set them appropriately.

Next, a gate insulating film 110, with a thickness of 40 to 150 nm, is formed next from an insulating film containing silicon by using plasma CVD or sputtering. For example, a silicon oxynitride film (B) may be formed with a thickness of 120 nm. In addition, the gate insulating film may be formed of other insulating films containing silicon using a single layer structure, or a laminate structure.

Figure 2A:
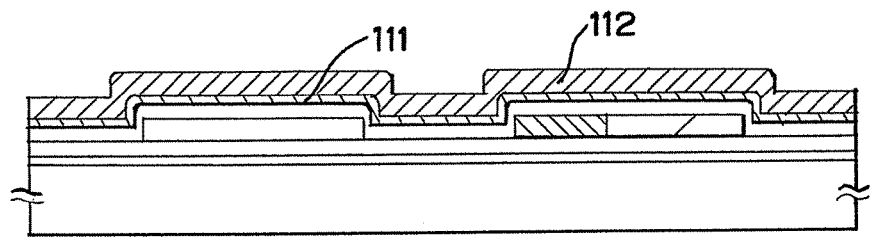
FIGS. 2A to 2F are cross-sectional views showing manufacturing processes for a TFT.

<Formation of First Conducting Layer: FIG. 2A>

A conducting layer is formed on the gate insulating film in order to form a gate electrode. A single layer may be formed for this conducting layer, but a laminate structure of two layers or three layers can also be formed when necessary. In embodiment mode 1, a conducting layer (A) 111 made from a conducting metallic nitride film and a conducting layer (B) 112 made from a metallic film are laminated. The conducting layer (B) 112 may be formed from an element selected from the group consisting of tantalum (Ta), titanium (Ti), molybdenum (Mo), and tungsten (W), or from an alloy having one of these element as its principal constituent, or from an alloy film of a combination of these elements (typically a Mo—W film or a Mo—Ta film). The conducting layer (A) 111 is formed from tantalum nitride (TaN), tungsten nitride (WN), titanium nitride (TiN), or molybdenum nitride (MoN). Further, tungsten silicide, titanium silicide, or molybdenum silicide may be applied for the conducting layer (A) 111. The concentration of contained impurities may be reduced in order to be able to make the resistance of the conducting layer (B) 112 lower, and in particular, it is good to reduce the oxygen concentration to 30 ppm or less. For example, by reducing the oxygen concentration of tungsten (w) to 300 ppm or less, a resistivity value of 20 µΩcm or less can be realized with tungsten (W).

The conducting layer (A) 111 may be from 10 to 50 nm (preferably 20 to 30 nm) in thickness, and the conducting layer (B) 112 may be from 200 to 400 nm (preferably 250 to 350 nm) in thickness. In embodiment mode 1, a TaN film of 30 nm thickness is used for the conducting layer (A) 111, and Ta film of 350 nm thickness is used for the conducting layer (B) 112, and both are formed by sputtering. The TaN film is formed using Ta as a target and a mixed gas of Ar and nitrogen as a sputtering gas. Ta is formed using Ar as the sputtering gas. Further, if a suitable amount of Xe or Kr is added to these sputtering gasses, then the internal stresses in the films formed can be relieved, and peeling can be prevented. The resistivity of an α-phase Ta film is about 20 µΩcm and it can be used in the gate electrode, but a β-phase Ta film has a resistivity about 180 µΩcm and it is unsuitable for the gate electrode. TaN film possesses a crystal structure which is close to the α-phase, and therefore the α-phase Ta film is easily obtained provide that it is formed on the TaN film. Note that although not shown in the figures, it is effective to form a silicon film doped by phosphorous (P), with a thickness about 2 to 20 nm, below the conducting film (A) 111. By doing so, along with improving the adhesiveness of the conducting film formed on the silicon film and preventing oxidation, microscopic amounts of alkaline elements contained in the conducting layer (A) or in the conducting layer (B) can be prevented from diffusing into the gate insulating film 110. Whichever is done, it is preferable that the resistively of the conducting layer (B) be in the range of 10 to 500 scm.

Figure 2B:
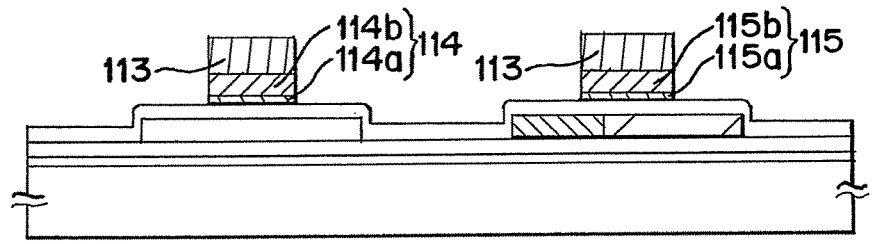

<Formation of Gate Electrode: FIG. 2B>

Next, photoresist mask 113 is formed, and the conducting layer (A) 111 and the conducting layer (B) 112 are etched together, forming gate electrodes 114 and 115. For example, etching can be performed by dry etching using a mixed gas of CF$_4$ and O$_2$, or using Cl$_2$ gas, at a reaction pressure between 1 and 20 Pa. The gate electrodes 114 and 115 are formed from conducting layers 114a and 115a, made from the conducting layer (A), conducting layers 114b and 115b, made from the conducting layer (B), in a body. The gate electrode 115 of the n-channel TFT overlaps a portion of the impurity region 109 through the gate insulating film 110. Further, it is possible to form the gate electrode from only the conducting layer (B).

Figure 2C:
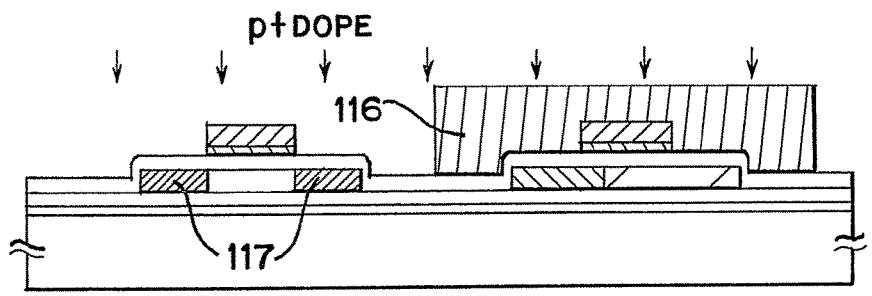

<p$^+$ Doping Process: FIG. 2C>

An impurity region 117 is formed next as a source region or a drain region of the P-channel TFT. Here, an impurity element that imparts p-type conductivity is added with the gate electrode 114 as a mask, and the impurity region is formed in a self-aligning manner. At this point, the island-shape semiconductor layer that forms the n-channel TFT is covered by a photoresist mask 116. The impurity region 117 is then formed by ion doping using diborane (B$_2$H$_6$). The boron (B) concentration of this region is made to be from $3 \times 10^{20}$ to $3 \times 10^{21}$ atoms/cm$^3$. The concentration of the impurity element for imparting p-type conductivity contained in the impurity region 117 is referred to as (p$^+$) throughout this specification.

Figure 2D:
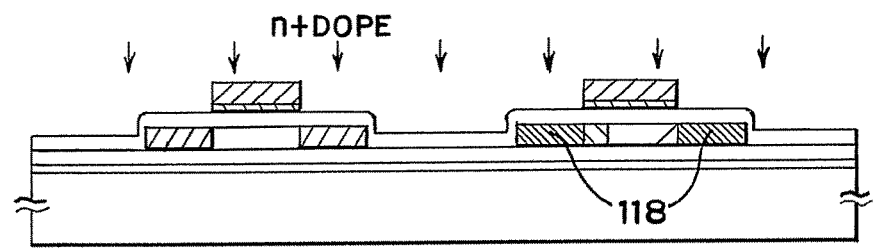

<n$^+$ Doping Process: FIG. 2D>

Next formation of an impurity region 118 which forms a source region or a drain region of the n-channel TFT is performed. Ion doping using phosphine (PH$_3$) is performed here, and the phosphorous (P) concentration is set to between $1 \times 10^{20}$ and $1 \times 10^{21}$ atoms/cm$^3$ in this region. The concentration of the impurity element for imparting n-type conductivity contained in the impurity region 118 is referred to as (n$^+$) throughout this specification. Phosphorous (P) is similarly added to the impurity region 117, but compared to the concentration of boron (B) already added by the previous step, the concentration of phosphorous (P) added to the impurity region 117 is about one-third to one-half of that of boron, and therefore the p-type conductivity is ensured and no influence is imparted to the TFT characteristics.

Figure 2E:
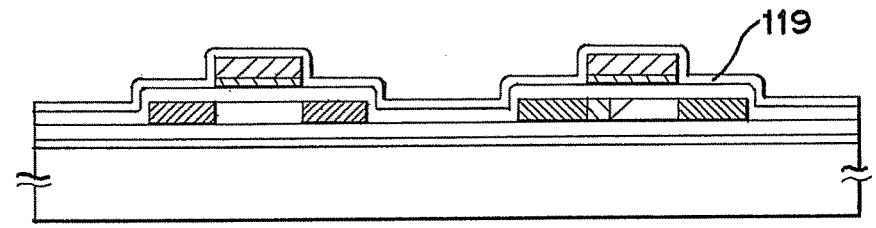

<Formation of Protecting Insulating Layer, Activation Process, Hydrogenation Process: FIG. 2E>

Thereafter, a process of activating the impurity elements which impart n-type or p-type conductivity and have been added at various concentrations is performed by thermal annealing. An annealing furnace may be used for this process. In addition, laser annealing or rapid thermal annealing (RTA) can also be performed. The annealing process is performed at 400 to 700° C., typically 500 to 600° C. in a nitrogen atmosphere which has an oxygen concentration of 1 ppm or less, preferably 0.1 ppm or less. Heat treatment is performed for 4 hours at 550° C. in embodiment mode 1. Further, it is good to form a protecting film 119 of 50 to 200 nm thickness from a silicon oxynitride film or a silicon oxide film before annealing. The silicon oxynitride film can be formed by any of the conditions of Table 1, and in addition, it may be formed by setting $SiH_4$ to 27 SCCM, $N_2O$ to 900 SCCM, with a reaction pressure of 160 Pa, a substrate temperature of 325° C., and a discharge power density of 0.1 W/cm$^2$.

Activation by laser annealing is performed by using a laser such as an excimer laser, a YAG laser, a $YVO_4$ laser, a $YAlO_3$ laser, or a YLF laser. It is good to apply the second or third higher harmonics from the fundamental waves when using a solid state laser such as a YAG laser.

After performing activation process, additional heat treatment is performed for 1 to 12 hours at 300 to 450° C. in an atmosphere containing hydrogen of between 3 and 100%, hydrogenating the island-shape semiconductor layers. This is the process of terminating dangling bonds in the semiconductor layers by thermally excited hydrogen. Plasma hydrogenation (using hydrogen excited by a plasma) may be performed as another means of hydrogenation.

Figure 2F:
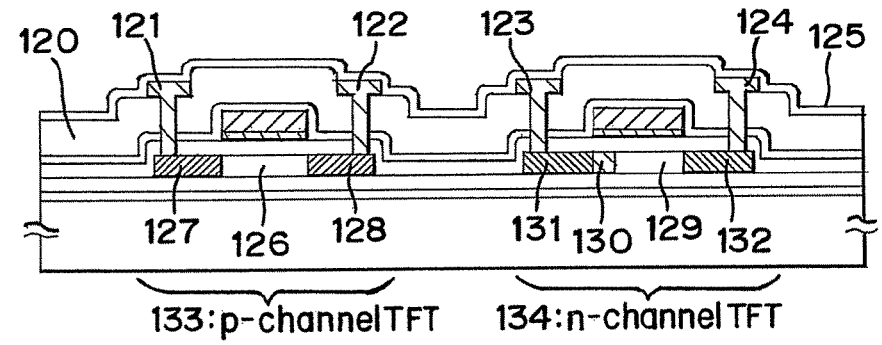

<Formation of Interlayer Insulating Layer, Source Wiring, and Drain Wiring, Formation of Passivation Film: FIG. 2F>

An additional silicon oxynitride film or silicon oxide film is laminated on the protecting insulating layer after completion of the activation and the hydrogenation processes, forming an interlayer insulating layer 120. The silicon oxynitride film is formed similar to the protecting insulating layer 119, by setting $SiH_4$ to 27 SCCM and $N_2O$ to 900 SCCM, with a reaction pressure of 160 Pa, a substrate temperature of 325° C., and a discharge power density of 0.15 W/cm$^2$, forming it to have a thickness of 500 to 1500 nm (preferably 600 to 800 nm).

Contact holes are then formed the interlayer insulating layer 120 and the protecting insulating layer 119 to reach the source and drain regions of the TFT, and source wirings 121 and 124, and drain wirings 122 and 123 are formed. Although not shown in the figures, in embodiment mode 1 these electrodes are laminate films with a three layer structure of a 100 nm Ti film, a 300 nm aluminum film containing Ti, and a 150 nm Ti film formed in succession by sputtering.

Next, a silicon oxide film or a silicon oxynitride film with a thickness of between 50 and 500 nm (typically between 100 and 300 nm) is formed as a passivation film 125. In addition, if hydrogenation processing is performed in this state, the desirable result as to the improvement of TFT characteristics can be obtained. For example, it is good to perform heat treatment for 1 to 12 hours at 300 to 450° C. in an atmosphere with 3 to 100% hydrogen, and a similar effect can be obtained by using plasma hydrogenation.

An n-channel TFT 134 and a P-channel TFT 133 are thus completed on the substrate 101. The P-channel TFT 133 has a channel forming region 126, a source region 127, and a drain region 128 in the island-shape semiconductor layer 104. The n-channel TFT 134 has a channel forming region 129, an LDD region 130 overlapping the gate electrode 115 (this type of LDD region is hereafter referred to as an $L_{ov}$ region), a source region 132, and a drain region 131 in an island-shape semiconductor layer 105. The length of the $L_{ov}$ region in the channel length direction is set between 0.5 and 3.0 μm (preferably from 1.0 to 1.5 μm) for a channel length of 3 to 8 μm. Single gate structures are taken for the respective TFTs in FIGS. 2A to 2F, but double gate structures may also be used, and multi-gate structures in which a plural number of gates are formed may also be used.

The characteristics of a TFT manufactured in this way are evaluated. TFT characteristics which are important for normal operation of a circuit formed by TFTs at the desired drive voltage include characteristics such as $V_{th}$, the S value, and the electric field effect mobility, and particular attention is paid to $V_{th}$ and the S value here. The TFT size is a channel length L=8 μm, and a channel width W=8 μm, for both the P-channel and n-channel TFTs, and an $L_{ov}$=2 μm region is formed in the n-channel TFT as an LDD region.

Figure 3:
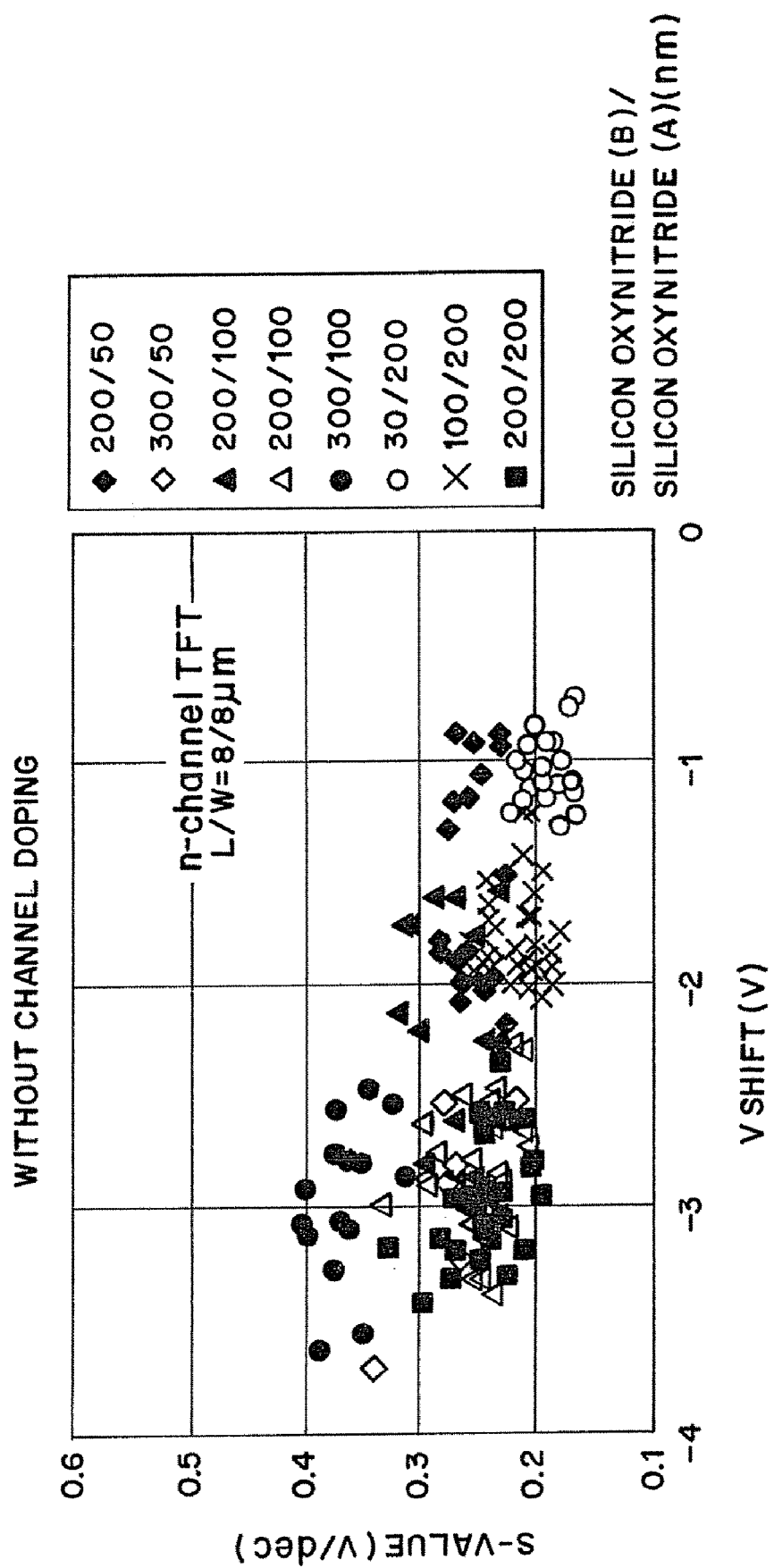
FIG. 3 is a graph for explaining the relationship between the S value and $V_{shift}$ as a parameter of the blocking layer film thickness.
Figure 4A:
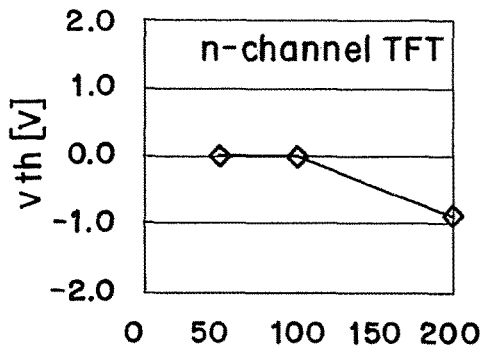
FIGS. 4A-4F are graphs showing the changes in characteristics of $V_{th}$, $V_{shift}$, and the S value in response to the film thickness changes of a first blocking layer.
Figure 4B:
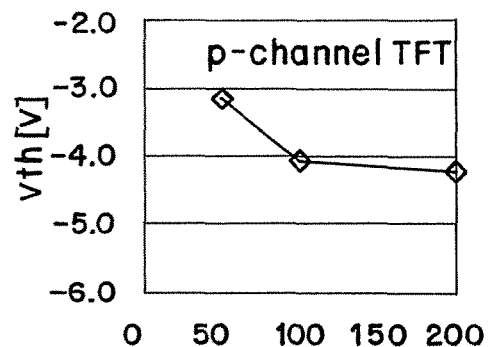
Figure 4C:
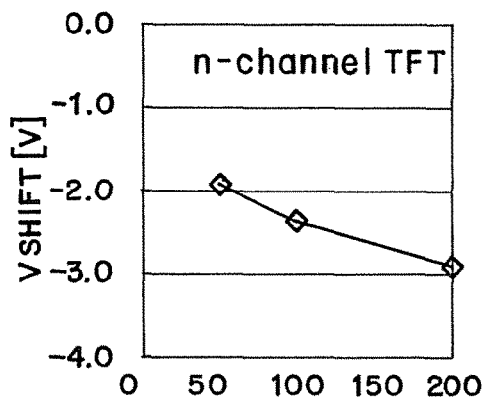
Figure 4D:
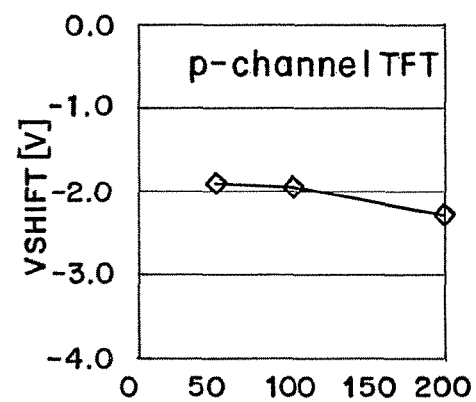
Figure 4E:
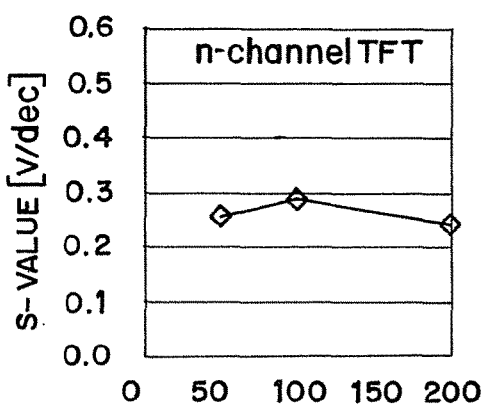
Figure 4F:
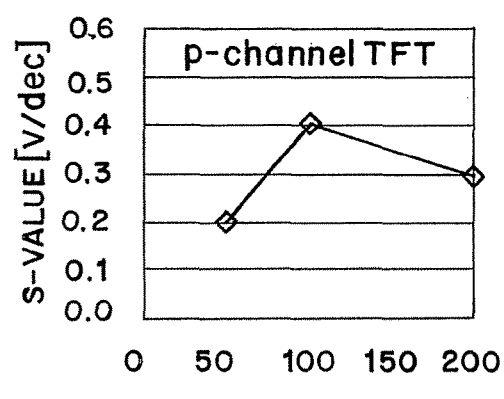
Figure 5A:
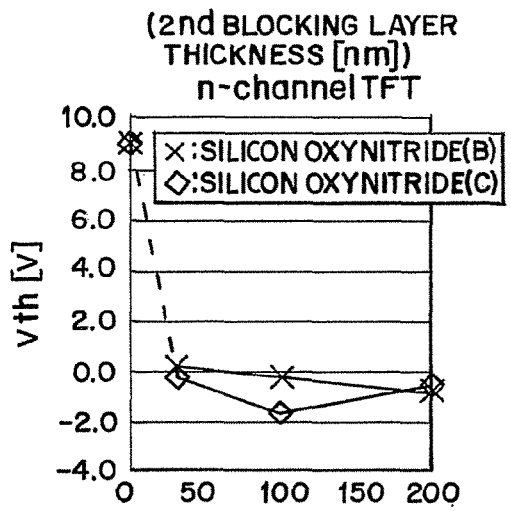
FIGS. 5A-5F are graphs showing the changes in characteristics of $V_{th}$, $V_{shift}$, and the S value in response to the film thickness changes of a second blocking layer.
Figure 5B:
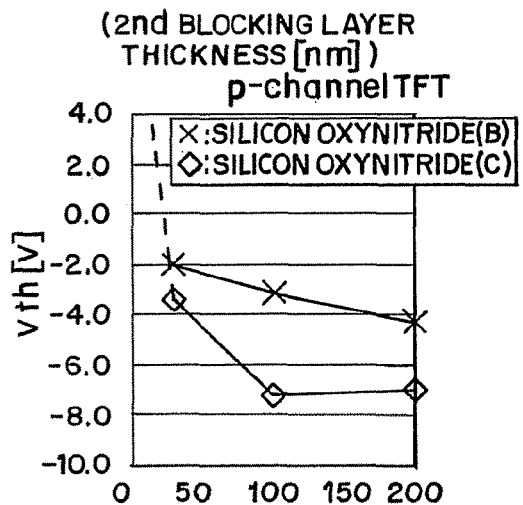
Figure 5C:
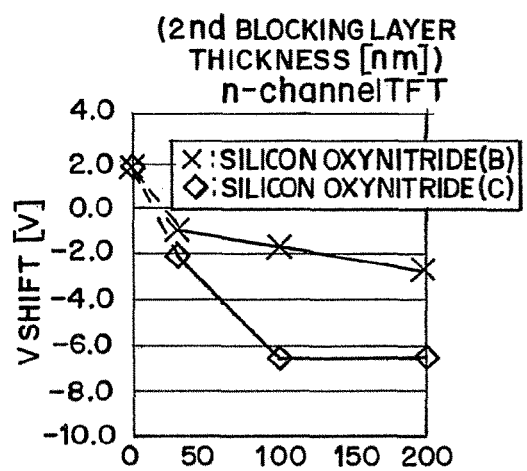
Figure 5D:
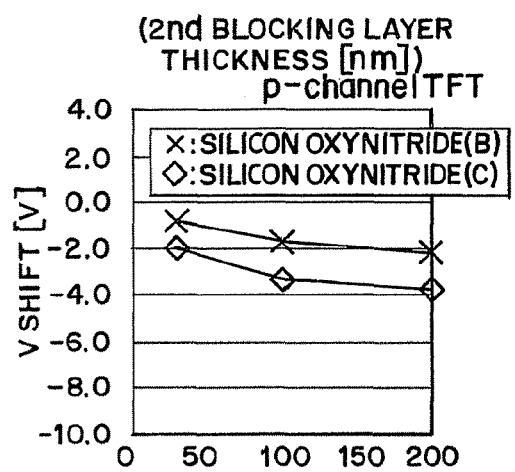
Figure 5E:
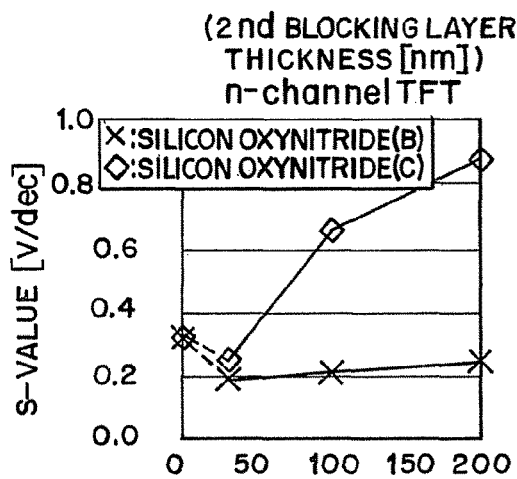
Figure 5F:
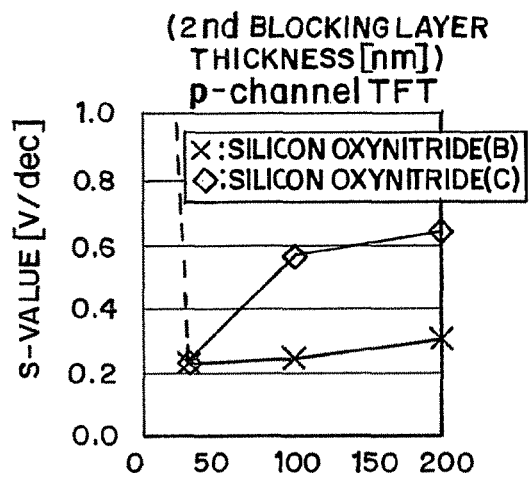
Figure 23A:
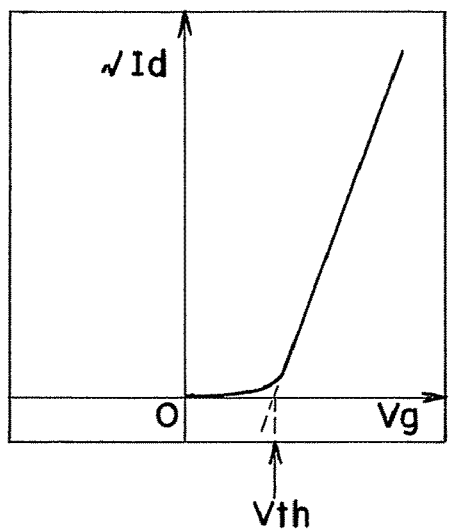
FIGS. 23A to 23C are views for explaining the definition of $V_{th}$, the S value, and $V_{shift}$.
Figure 23B:
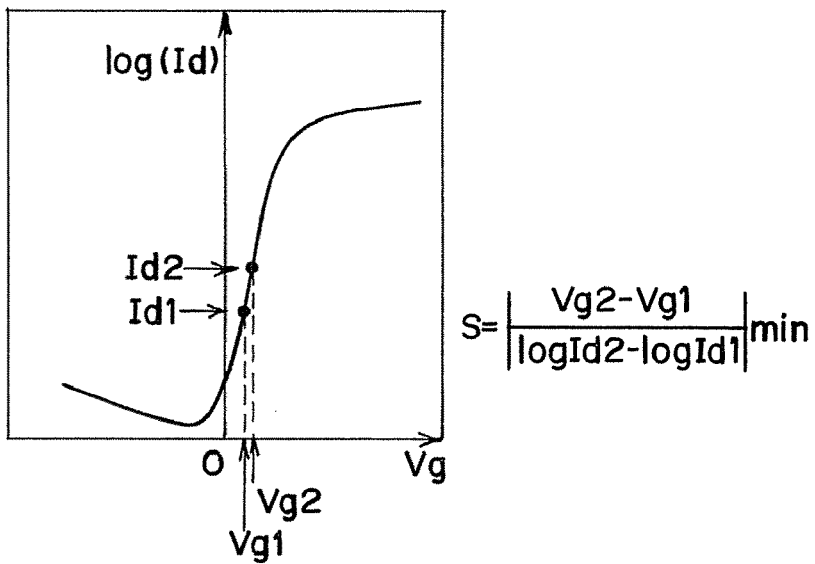
Figure 23C:
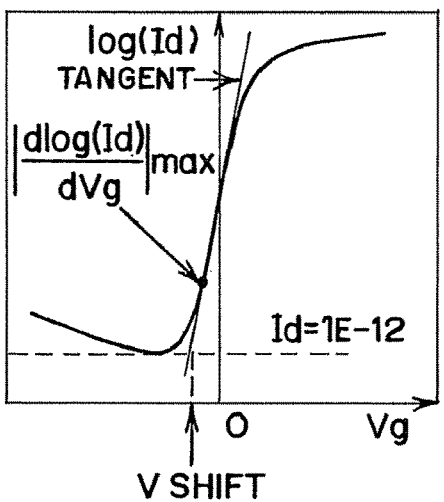

FIG. 3 is a view showing the relationship between the S value and $V_{shift}$ for an n-channel TFT without channel doping, with the film thickness of each blocking layer taken as a parameter. As shown in FIG. 23C, $V_{shift}$ is defined as the voltage value at the intersection of: a line tangent to the largest slope in the sub-threshold characteristic of the drain current ($I_d$) vs. the gate voltage ($V_g$); and the horizontal line $I_d$=1× $10^{-12}$ A. The smaller the $V_{shift}$ the better, and ideally $V_{shift}$=0 V. With the data shown in FIG. 3, a clear correlation is seen between the S value and the $V_{shift}$. It is clear that the closer that $V_{shift}$ approaches 0 V, the smaller that the S value becomes, and the TFT characteristics approach an ideal state.

FIG. 3 is the result of investigating the thickness of the silicon oxynitride film (A) and the silicon oxynitride film (B), which compose the blocking layer 102, and the $V_{shift}$ of the n-channel TFT. The data plotted in FIG. 3 are all for test pieces which were not channel doped, and the fact that there is a combination of an ideal film thickness in order to have the $V_{shift}$ value within a fixed range is shown in the figure. For example, in order to place $V_{shift}$ in the range of −1.5 V to −0.5 V, it is understood that the thickness of the silicon oxynitride film (A) may be set to 50 nm or to 200 nm, and that the thickness of the silicon oxynitride film (B) may be set to 30 nm or to 200 nm.

FIGS. 4A to 4F show the dependence of $V_{th}$, the S value, and $V_{shift}$ in the n-channel TFT and the P-channel TFT on the thickness of the first blocking layer 102a. The thickness of the second blocking layer 102b was fixed at 200 nm. A change in characteristics was not observed with relation to changes in the film thickness of the first blocking layer 102a between 50 and 200 nm.

Further, FIGS. 5A to 5F show the dependence of $V_{th}$, the S value, and $V_{shift}$ in the n-channel TFT and the P-channel TFT on the thickness of the second blocking layer 102b. The thickness of the first blocking layer 102a was fixed at 50 nm. The data shown in FIGS. 5A to 5F includes a case of the silicon oxynitride film (B) being applied in the second blocking layer 102b, and a case of the silicon oxynitride film (C) being applied in the second blocking layer 102b. As for results, first, the second blocking layer 102b becomes thicker, then the S value becomes poor, and the fluctuations in $V_{th}$ become larger. This tendency is conspicuous in the case of applying the silicon oxynitride film (C). The cause of this is not fully evident, but as shown in Table 2, there is a difference in wet etching speeds of the silicon oxynitride films (B) and (C), and it is clear that a dense film having a slow wet etching speed is good like the silicon oxynitride film (B).

Figure 6:
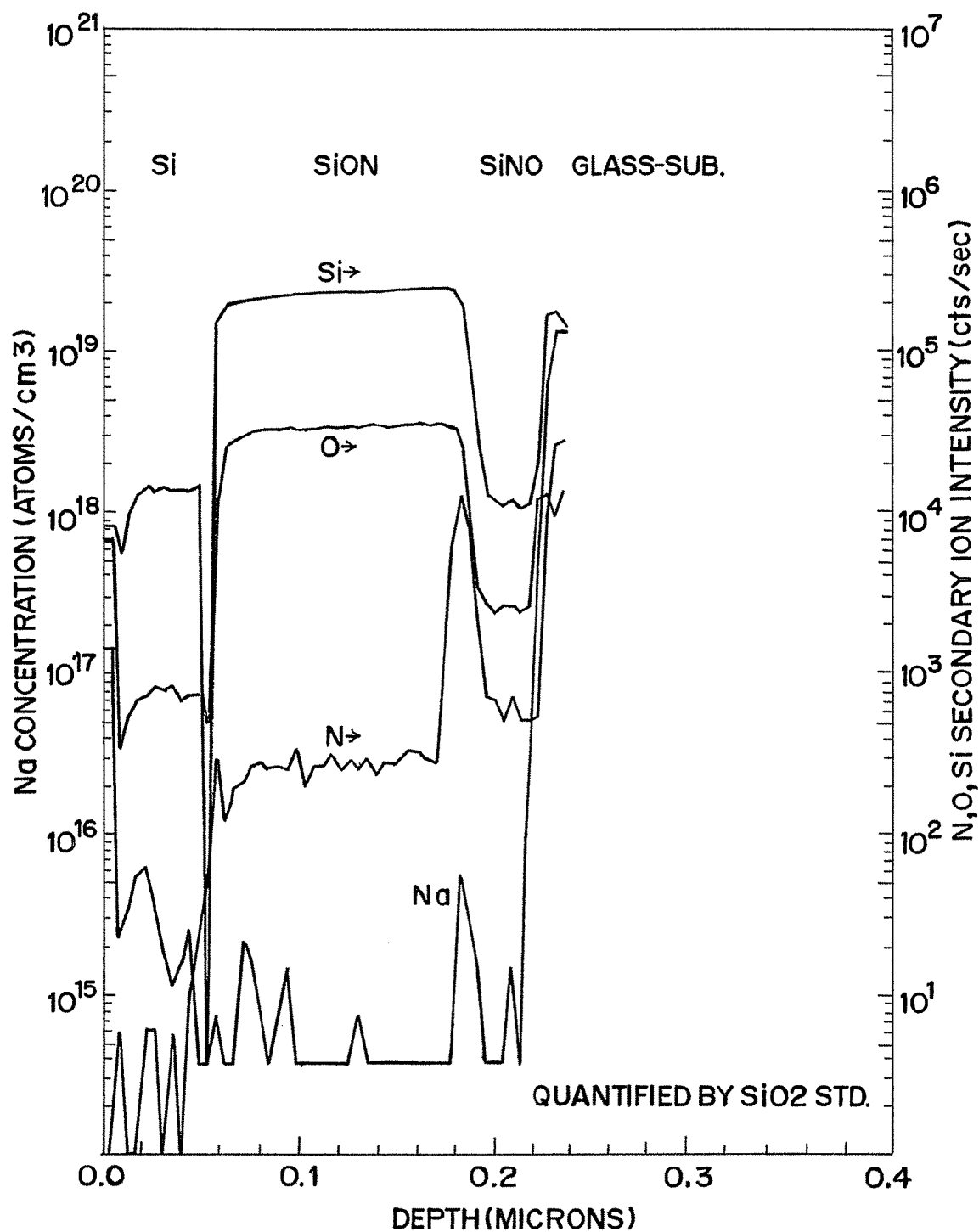
FIG. 6 is a graph showing the results of forming a lamination of a silicon oxynitride film (A) and a silicon oxynitride film (B) on a glass substrate, and analyzing the sodium (Na) distribution, after thermal annealing, by SIMS.

FIG. 6 shows the results of measuring the contamination prevention effect by alkaline metal elements in the blocking layer 102, using secondary ion mass spectroscopy (SIMS). The device used for the measurements was Model 6600 produced by Physical Electronics Corp., and the test piece is as follows: first, a silicon oxynitride film (A) with a 50 nm thickness is formed adhering to a glass substrate, a silicon oxynitride film (B) of 125 nm thickness is formed thereon, and an additional silicon film with a thickness of 50 nm is formed. This is processed at the crystallization temperature by thermal annealing using an annealing furnace, (processed at 500° C. for 1 hour, followed by 4 hours at 550° C.). The data of FIG. 6 shows the distributions of silicon (Si), oxygen (O), and nitrogen (N) by the strength of secondary ions, and the distribution of sodium (Na) with respect to those distributions is determined and shown. The results show that diffusion or exudations from the glass substrate to the silicon oxynitride film (A) were not detected, and it could be verified that even a silicon oxynitride film (A) of 50 nm thickness has a sufficient effect as a blocking layer.

Figure 7:
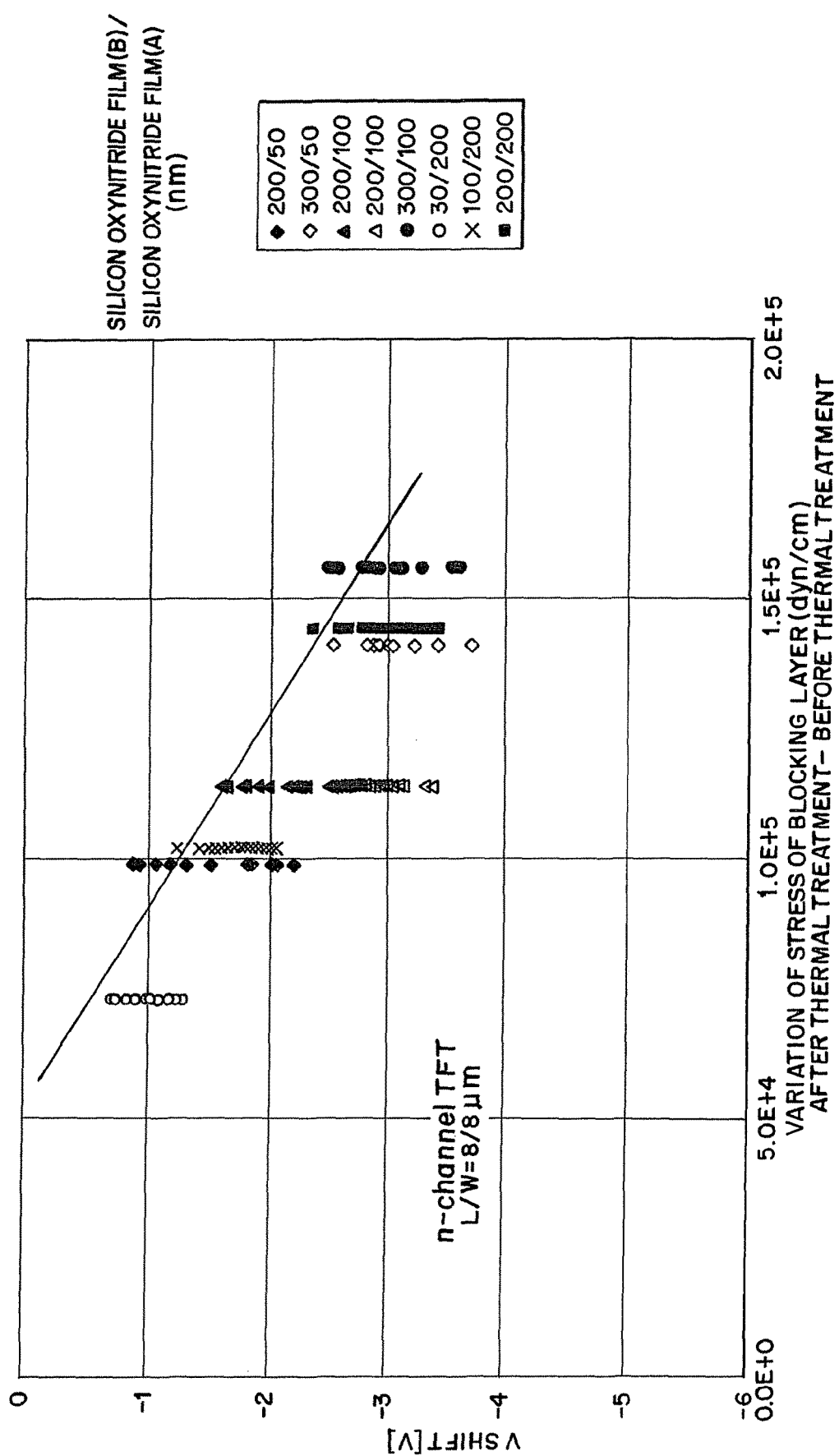
FIG. 7 is a graph showing the relationship between the change in the amount of internal stress vs. $V_{shift}$ by thermal annealing of a blocking layer.

FIG. 7 shows the changes of $V_{shift}$ with respect to the changes in internal stress of the blocking layer before and after processing at the above crystallization temperature. The combination of film thickness of the silicon oxynitride film (A) and the silicon oxynitride film (B) was investigated, and it become clear that the smaller the amount of change in internal stress, the smaller $V_{shift}$ becomes.

The S value can be made more than or equal to 0.10 V/dec and less than or equal to 0.30 V/dec, $V_{th}$ can be made more than or equal to 0.5 V and less than or equal to 2.5 V, and the electric field effect mobility can be made more than or equal to 120 cm$^2$/V sec and less than or equal to 250 cm$^2$/V·sec in the n-channel TFT in the completed TFT. Further, in the P-channel TFT of the completed TFT, the S value can be made more than or equal to 0.10 V/dec and less than or equal to 0.30 V/dec, $V_{th}$ can be made more than or equal to −2.5 V and less than or equal to −0.5 V, and the electric field effect mobility can be made more than or equal to 80 cm$^2$/V sec and less than or equal to 150 cm$^2$/V sec. Thus there is an optimal range for the film thickness and the film quality of the blocking layer using silicon oxynitride films formed on the back channel side, and the TFT characteristics can be stabilized by using a suitable combination.

Embodiment Mode 2

Figure 21:
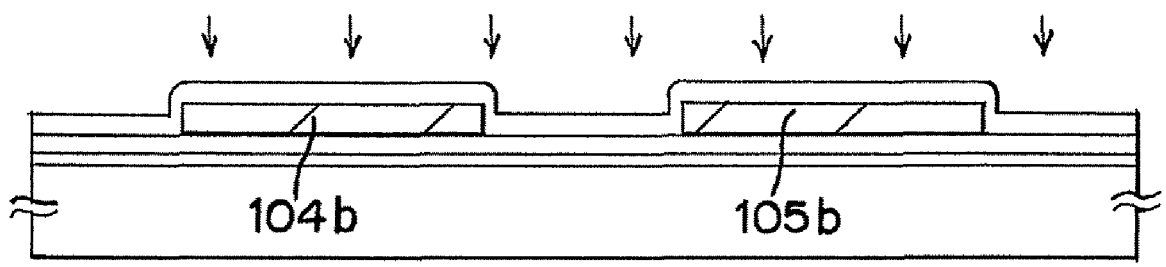
FIG. 21 is a cross-sectional view showing manufacturing processes of a TFT.

By forming the blocking layer shown in embodiment mode 1, $V_{th}$ can be set in the range of −0.5 to −1.5 V as shown in FIG. 3, and the channel doping process can be omitted. Processing is performed similar to that of embodiment mode 1 through the step of FIG. 1C, forming the blocking layer 102, the island-shape semiconductor layers 104 and 105, and the mask layer 106 on the substrate 101. Then, as shown in FIG. 21, boron (B) is added by ion doping using diborane (B$_2$H$_6$), with the aim of controlling the threshold voltage, which is similar to embodiment mode 1. Island-shape semiconductor layers 104b and 105b, to which boron (B) have been added, are formed. This is a general channel doping process that is performed without forming any kind of photoresist mask specially. If boron (B) is added at a concentration of 1×10$^{16}$ atoms/cm$^3$, then the $V_{th}$ of the n-channel TFT can be set in the range of 0.5 to 2.5 V. At this boron (B) concentration, the $V_{th}$ of the P-channel TFT has almost no change, and is in the range of −0.5 to −1.5 V. As another method, diborane (B$_2$H$_6$) can also simultaneously be added at the time that the amorphous semiconductor layer is formed, and a similar effect can be obtained. If subsequent processing is performed with the processes of FIG. 1E onward, then the n-channel TFT and P-channel having TFT structures shown in FIG. 2F can be formed. Boron (B) is contained in the channel forming regions 126 and 129 at the added concentration in FIG. 21. By performing processing in this way, one photo mask used for channel doping can be eliminated, and the number of process steps can be cut in comparison with embodiment mode 1.

Embodiment Mode 3

Figure 22A:
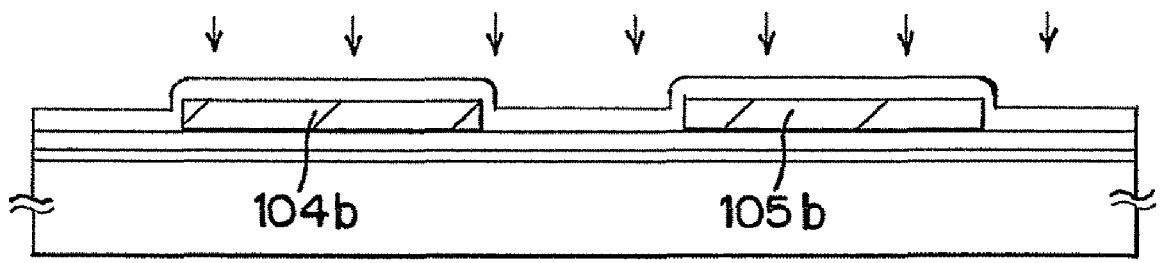
FIGS. 22A and 22B are cross-sectional views showing manufacturing processes of a TFT.
Figure 22B:
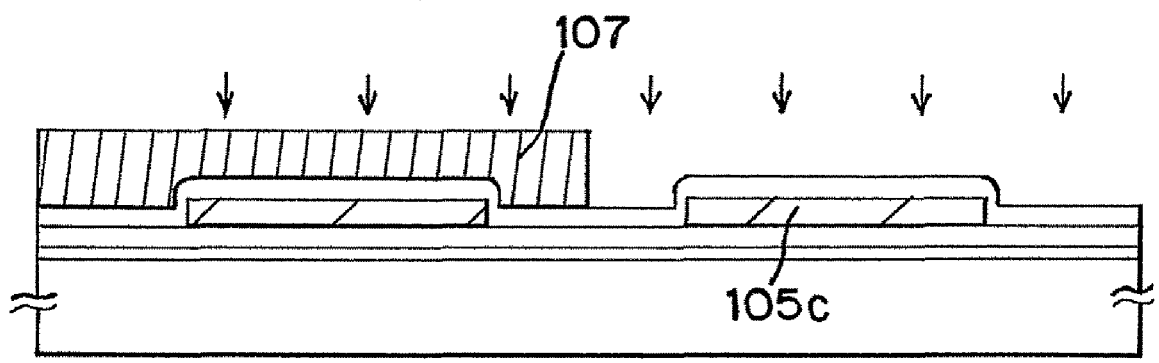

In embodiment mode 3, an exemplary of precisely controlling $V_{th}$ is shown. First, processing is performed similar to that of embodiment mode 1 through FIG. 1C, forming the blocking layer 102, the island-shape semiconductor layers 104 and 105, and the mask layer 106 on the substrate 101. A general channel doing process is then performed as shown in FIG. 22A, similar to that of embodiment mode 2, forming the island-shape semiconductor layers 104b and 105b in which boron (B) is added. In addition, the photoresist mask 107 is formed as shown in FIG. 22B, and an impurity element that imparts p-type conductivity at a concentration about 1×10$^{16}$ to 5×10$^{17}$ atoms/cm$^3$ is added, forming an island-shape semiconductor layer 105c into which boron (B) is doped. If subsequent processing is performed with the processes of FIG. 1E onward, then the n-channel TFT and P-channel TFT structures shown in FIG. 2F can be formed. Boron (B) is contained in the channel forming regions 126 and 129 at the added concentration of FIG. 21. By performing processing in this way, it becomes possible to precisely control the $V_{th}$ of the n-channel TFT within the range of 0.5 to 2.5 V, and the $V_{th}$ of the P-channel TFT can be set in the range of −0.5 to −1.5 V.

EMBODIMENTS

Embodiment 1

Embodiment 1 of the present invention is explained using FIGS. 8A to 12. Here, a detailed explanation is made of a method of manufacturing a pixel TFT of a pixel portion, and driver circuit TFTs formed in the periphery of the pixel portion. Note that, in order to simplify the explanation, a CMOS circuit, which is the basic circuit for control circuits such as a shift register circuit and a buffer circuit, and an n-channel TFT forming a sampling circuit are shown in the figures.

A barium borosilicate glass substrate or an aluminum borosilicate glass substrate is used as a substrate 201 in FIG. 8A. An aluminum borosilicate glass substrate is used in embodiment 1. Heat treatment may be performed in advance at a temperature which is lower than the distortion point of the glass by 10 to 20° C. A blocking layer 202 is formed on the substrate 201 by forming a silicon oxynitride film (A) 202a with a thickness of 50 nm on the surface of the substrate 201 on which the TFTs are formed, and in addition, laminating a silicon oxynitride film (B) 202b with a thickness of 100 nm thereon, in order to prevent impurity diffusion such as alkaline metal elements, from the substrate 201.

A semiconductor film 203a having an amorphous structure is formed next, with a thickness of between 25 and 80 nm (preferably between 30 and 60 nm), by a known method such as plasma CVD or sputtering. In embodiment 1, an amorphous silicon film is formed to have a thickness of 55 nm by plasma CVD. Amorphous semiconductor films and microcrystalline semiconductor films exist as semiconductor films having an amorphous structure, and compound semiconductor films having an amorphous structure, such as an amorphous silicon germanium film, are also suitable. Further, the blocking layer 202 and the amorphous semiconductor layer 203a may both be formed successively, because a same method is applied to both layers. By not exposing the surface to the atmosphere after forming the base film, it becomes possible to prevent contamination of the surface, and dispersion in the characteristics of the manufactured TFT, and fluctuations in the threshold voltage, can be reduced. (See FIG. 8A.)

A crystalline silicon layer 203b is then formed from the amorphous silicon layer 203a using a known crystallization technique. For example, laser annealing or thermal annealing (solid state growth methods) may be applied, but the crystalline silicon layer 203b is formed here using a catalytic element in accordance with the technique disclosed in Japanese Patent Application Laid-open No. Hei 7-130652. First, an aqueous solution containing 10 ppm by weight of a catalytic element is applied by spin coating, forming a layer containing the catalytic element (not shown in the figures). Elements such as nickel (Ni), germanium (Ge), iron (Fe), palladium (Pd), tin (Sn), lead (Pb), cobalt (Co), platinum (Pt), copper (Cu), and gold (Au) may be used as the catalytic element. In the crystallization process, heat treatment is first performed for approximately 1 hour at between 400 and 500° C., making the amount of hydrogen contained in the amorphous silicon film 5 atomic % or less. Thermal annealing is then performed in a nitrogen atmosphere at 550 to 600° C. for 1 to 8 hours using an annealing furnace. A crystalline silicon film can thus be obtained through the above processes. The concentration of the catalytic element remaining in the surface in this state is between $3\times10^{10}$ and $2\times10^{11}$ atoms/cm$^3$. Laser annealing may also be performed in conjunction with thermal annealing in order to improve the crystallization ratio. For example, an XCl excimer laser (wavelength is 308 nm) is used, formed into a linear shape beam by an optical system, the oscillation frequency set between 5 and 50 Hz, the energy density set from 100 to 500 mJ/cm$^2$, and this is irradiated with an overlap ratio of the linear shape beam of between 80 and 98%. The crystalline silicon film 203b is thus obtained. (See FIG. 8B.)

The crystalline silicon film 203b is then etched and divided into island-shapes, forming island-shape semiconductor layers 204 to 207, which are made into active layers. A mask layer 208 is then formed by plasma CVD, reduced pressure CVD, or sputtering to a thickness of between 50 and 100 nm. For example, a silicon oxide film is formed by reduced pressure CVD using a mixed gas of SiH$_4$ and O$_2$ and heated to 400° C. at a pressure of 266 Pa. (See FIG. 8C.)

Channel doping is then performed. A photoresist mask 209 is formed first, and boron (B) is added as an impurity element that imparts p-type conductivity to the entire surface of the island-shape semiconductor layers 205 to 207, at a concentration about $1\times10^{16}$ to $5\times10^{17}$ atoms/cm$^3$, with the aim of controlling the threshold voltage. Ion doping may be used for the addition of boron (B), and boron (B) can be added at the same time as the amorphous silicon film is formed. It is not always necessary to add boron (B) here, but it is preferable to form semiconductor layers 210 to 212 with added boron in order to place the threshold voltage of the n-channel TFT within a predetermined range. The method shown by embodiment mode 2 or embodiment mode 3 may also be used for this channel doping process. (See FIG. 8D.)

In order to form an LDD region of the n-channel TFT of the driver circuit, an impurity element that imparts n-type conductivity is selectively added to the island-shape semiconductor layers 210 and 211. Photoresist masks 213 to 216 are formed in advance for this purpose. Phosphorous (P) must be added here, and ion doping using phosphine (PH$_3$) is applied. The phosphorous (P) concentrations of formed impurity regions (n$^-$) 217 and 218 are set to between $2\times10^{16}$ and $5\times10^{19}$ atoms/cm$^3$, respectively. Further, an impurity region 219 is a semiconductor layer for forming a storage capacitor in the pixel portion, and phosphorous (P) is added to this region at the same concentration. (See FIG. 9A.)

The mask layer 208 is removed next by a substance such as hydrofluoric acid, and a process of activating the impurity elements added by the steps of FIG. 8D and FIG. 9A is performed. The activation can be performed by thermal annealing for 1 to 4 hours at between 500 and 600° C., or by laser annealing. Further, both methods may be performed together. Laser activation is used in embodiment 1, and KrF excimer laser light (wavelength 248 nm) formed into a linear shape beam is used, with an oscillation frequency of 5 to 50 Hz and the energy density set to between 100 and 500 mJ/cm$^2$, and this is scanned with an overlap ratio for the linear shape beam of 80 to 98%, processing the entire surface of the substrate on which the island-shape semiconductor layers are formed. Note that there are no specific limitation placed on the laser light irradiation conditions, and that the operator may set them suitably.

A gate insulating film 220 is then formed to a thickness of between 40 and 150 nm from an insulating film containing silicon using plasma CVD or sputtering. For example, a silicon oxynitride film (B) is formed. Other insulating films containing silicon, with a single layer or a plural layer structure, may also be used. (See FIG. 9B.)

A first conducting layer is formed next in order to form a gate electrode. A conducting layer (A) 221 made from a metallic nitride film having conductivity, and a conducting layer (B) 222 made from a metallic film are laminated in embodiment 1. The conducting film (B) 222 is formed by tantalum (Ta) to a thickness of 250 nm, and the conducting layer (A) 221 is formed from tantalum nitride (TaN) to a thickness of 50 nm, by sputtering using Ta as a target. (See FIG. 9C.)

Photoresist masks 223 to 227 are formed next, and the conducting layer (A) 221 and the conducting layer (B) 222 are etched at the same time, forming gate electrodes 228 to 231 and a capacitor wiring 232. The gate electrodes 228 to 231 and the capacitor wiring 232 are formed, respectively, as a single body from conducting layers (A) 228a to 232a and conducting layers (B) 228b to 232b. The gate electrodes 229 and 230 formed in the driver circuit are formed to overlap a part of the impurity regions 217 and 218, through the gate insulating film 220, at this point. (See FIG. 9D.)

Next, in order to form a source region and a drain region of the P-channel TFT of the driver circuit, a process of adding an impurity element that imparts p-type conductivity is performed. Impurity regions are formed in a self-aligning manner here with the gate electrode 228 as a mask. The region in which the n-channel TFT is formed is covered with a photoresist mask 233. An impurity region (p$^+$) 234 at a concentration of $1\times10^{21}$ atoms/cm$^3$ is then formed by ion doping using diborane (B$_2$H$_6$). (See FIG. 10A.)

Formation of impurity regions for functioning as a source region or a drain region of the n-channel TFT is performed next. Resist masks 235 to 237 are formed, and an impurity element that imparts n-type conductivity is added, forming impurity regions 238 to 242. This is performed by ion doping using phosphine (PH$_3$), and the concentration of the impurity regions (n$^+$) 238 to 242 is set to $5\times10^{20}$ atoms/cm$^3$. Boron (B) is already contained in the impurity region 238 in a previous step, but in comparison, phosphorous (P) is added with a concentration of one-third to one-half that of the boron (B), and therefore the influence of phosphorous (P) need not be considered, and there is no influence imparted to the characteristics of the TFT. (See FIG. 10B.)

A process of adding an impurity that imparts n-type conductivity is then performed in order to form an LDD region of the n-channel TFT of the pixel portion. An impurity element that imparts n-type conductivity is added by ion doping in a self-aligning manner using the gate electrode 231 as a mask. The concentration of phosphorous (P) added is set to $5 \times 10^{16}$ atoms/cm$^3$, and this is a lower concentration than that of the impurity elements added by the steps of FIG. 9A, FIG. 10A, and FIG. 10B, and in practice only impurity regions (n) 243 and 244 are formed. (See FIG. 10C.)

A heat treatment process is performed next in order to activate the impurity elements which impart n-type or p-type conductivity and have been added at various concentrations. Thermal annealing using an annealing furnace, laser annealing, or rapid thermal annealing (RTA) can be performed for this process. The activation process is performed here using furnace annealing. The heat treatment process is performed in a nitrogen atmosphere in which the oxygen concentration is 1 ppm or less, preferably 0.1 ppm or less, at between 400 and 700° C., typically between 500 and 600° C., and is performed for 4 hours at 550° C. in embodiment 1.

Through thermal annealing, the Ta films 228b to 232b forming the gate electrodes 228 to 231, and the capacitor wiring 232, have conducting films (C) 228c to 232c, made from TaN, formed in their surfaces to a thickness of 5 to 80 nm. In addition, when the conducting layers (B) 228b to 232b are tungsten (W), tungsten nitride (WN) is formed, and titanium nitride (TiN) can be formed when the conducting layers are titanium (Ti). Further, these can be formed similarly by exposing the gate electrodes 228 to 231 to a plasma atmosphere containing nitrogen using a substance such as nitrogen or ammonia. In addition, a process of hydrogenation of the island-shape semiconductor layers is performed by thermal annealing at 300 to 450° C. for between 1 and 12 hours in an atmosphere containing between 3 and 100% hydrogen. This process is the one of terminating dangling bonds in the semiconductor layers by thermally excited hydrogen. Plasma hydrogenation (using hydrogen excited by a plasma) may be performed as another means of hydrogenation.

In cases of manufacturing by a method of using a catalytic element to crystallize island-shape semiconductor layers from an amorphous silicon film, as in embodiment 1, a small amount (about $1 \times 10^{17}$ to $1 \times 10^{19}$ atoms/cm$^3$) of the catalytic element remains within the island-shape semiconductor layers. It is, of course, possible to complete the TFT in such a state, but it preferable to remove the remaining catalytic element from at least the channel forming region. One means of removing the catalytic element is a means using gettering by phosphorous (P). The concentration of phosphorous (P) necessary for gettering may on a similar order as that of the impurity regions (n$^+$) formed by the step of FIG. 10B, and the catalytic element can be segregated from the channel forming regions of the n-channel TFT and the P-channel TFT, into the impurity regions 238 to 242, by the thermal annealing of the activation process performed here. As a result, the catalytic element is segregated into the impurity regions 238 to 242 at a concentration about $1 \times 10^{17}$ and $1 \times 10^{19}$ atoms/cm$^3$. (See FIG. 3d.)

Figure 13A:
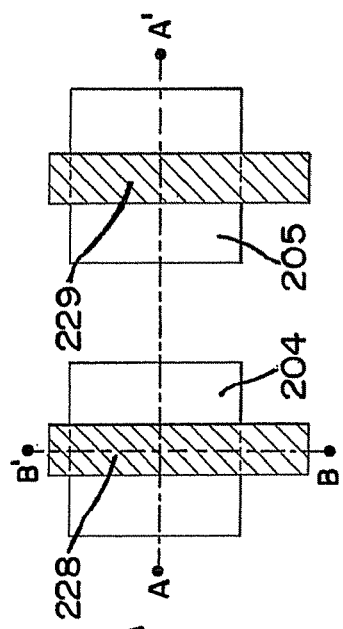
FIGS. 13A to 13C are top views showing manufacturing processes for driver circuit TFTs.
Figure 13B:
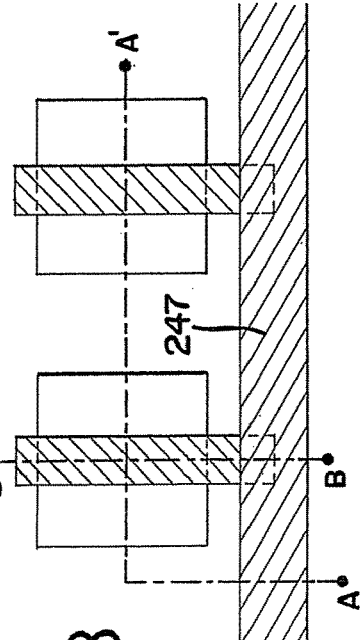
Figure 13C:
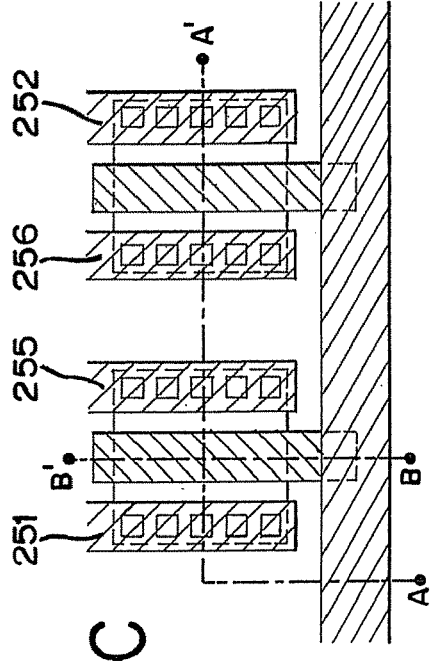
Figure 14A:
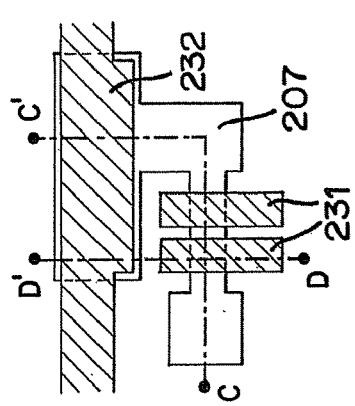
FIGS. 14A to 14C are top views showing manufacturing processes for a pixel TFT and a storage capacitor TFT.
Figure 15A:
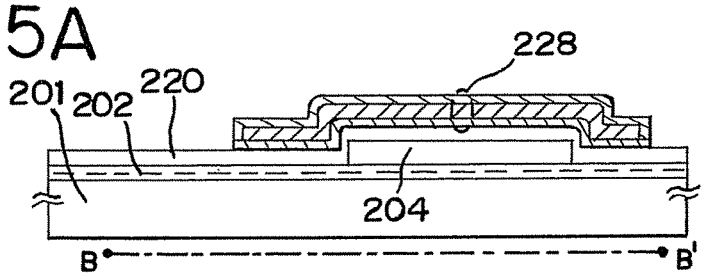
FIGS. 15A to 15C are top views showing manufacturing processes for driver circuit TFTs.
Figure 16A:
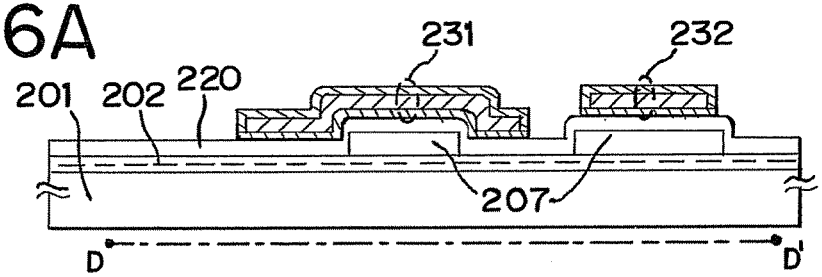
FIGS. 16A to 16C are top views showing manufacturing processes for a pixel TFT.

FIGS. 13A and 14A are top views of the TFTs through to the present step, and the cross portions taken along the A-A' and C-C' lines correspond to A-A' and C-C', respectively, in FIG. 10D. Further, the cross portions taken along the B-B' and D-D' lines correspond to the cross-sectional views of FIG. 15A and FIG. 16A. The gate insulating film is omitted from the top views of FIGS. 13A to 13C, and FIGS. 14A to 14C, but in the steps through here, at least the gate electrodes 228 to 231, and the capacitor wiring 232, are formed on the island-shape semiconductor layers 204 to 207, as shown in the figures.

After the activation and hydrogenation processes are completed, a second conducting layer is formed as a gate wiring. The second conducting layer is formed by a conducting layer (D) made from a low resistance material which has aluminum (Al) or copper (Cu) as its principal constituent. Whichever is used, the resistivity of the second conducting layer is set to between 0.1 and 10 μΩcm. In addition, a conducting layer (E) made from titanium (Ti), tantalum (Ta), tungsten (W), or molybdenum (Mo) may be laminated with the conducting layer (D). In embodiment 1, an aluminum (Al) film containing between 0.1 and 2% titanium (Ti) is formed as conducting layer (D) 245, and a titanium (Ti) film is formed as a conducting layer (E) 246. The conducting layer (D) 245 may be formed with a thickness of 200 to 400 nm (preferably 250 to 350 nm), and the conducting layer (E) may be formed with a thickness of 50 to 200 nm (preferably 100 to 150 nm). (See FIG. 11A.)

The conducting layer (E) 246 and the conducting layer (D) 245 are then etched in order to form a gate wiring connected to the gate electrode, forming gate wirings 247 and 248 and a capacitor wiring 249. In the etching process, dry etching using a mixed gas of $SiCl_4$, $Cl_2$ and $BCl_3$ is performed first, removing a volume from the surface of the conducting layer (E) to the middle of the conducting layer (D). By then removing the conducting layer (D) by wet etching using a phosphoric acid solution, the selectivity with the base film is maintained and the gate wiring can be formed.

Figure 11A:
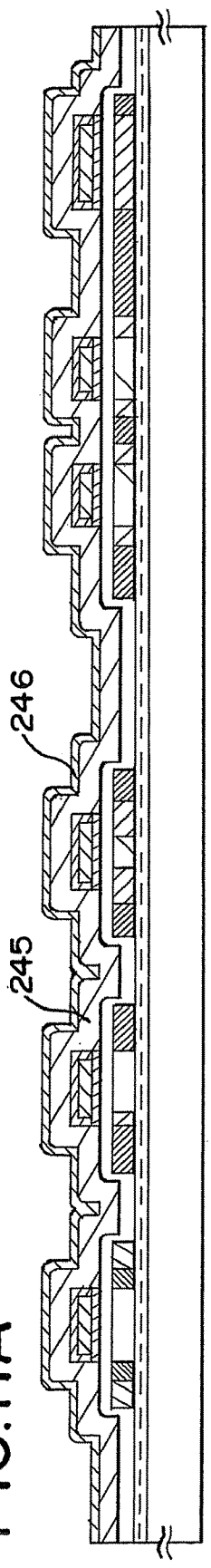
FIGS. 11A to 11C are cross-sectional views showing manufacturing processes for a pixel TFT, a storage capacitor, and driver circuit TFTs.
Figure 11B:
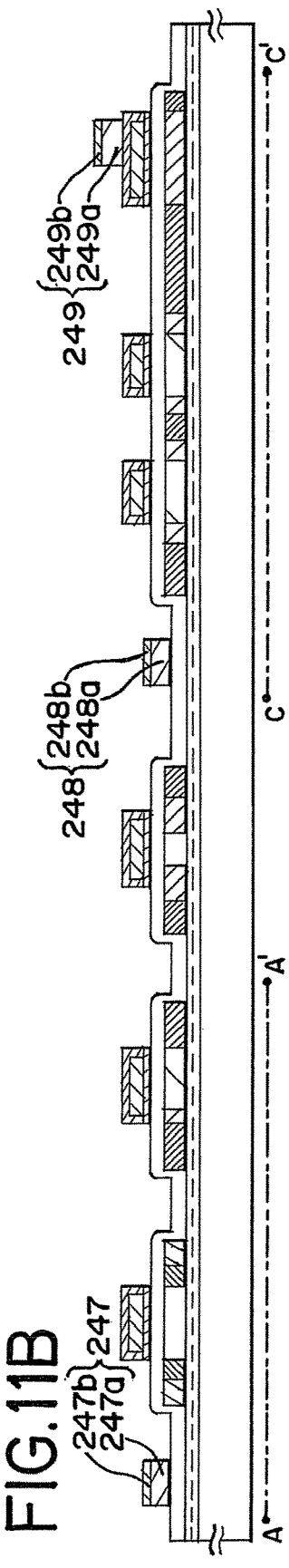
Figure 11C:
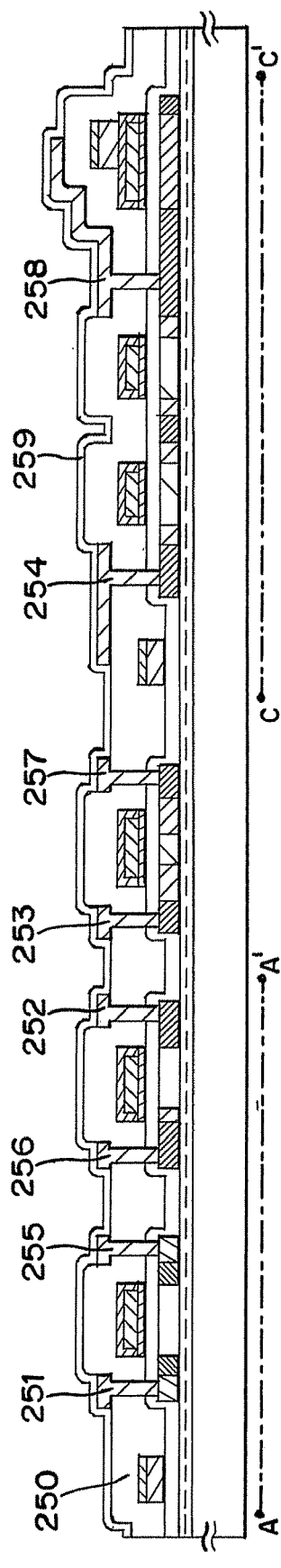
Figure 14B:
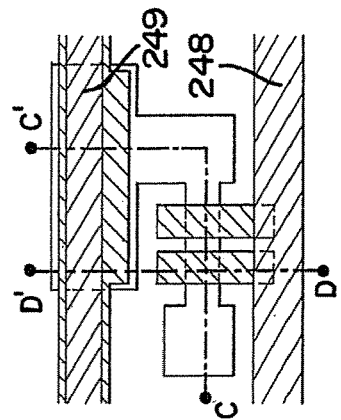
Figure 15B:
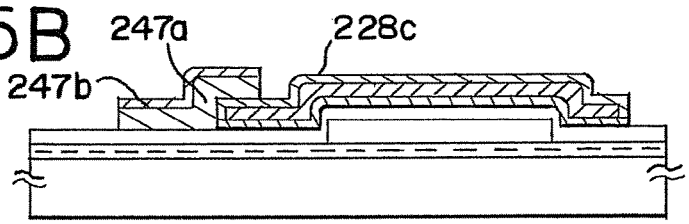
Figure 16B:
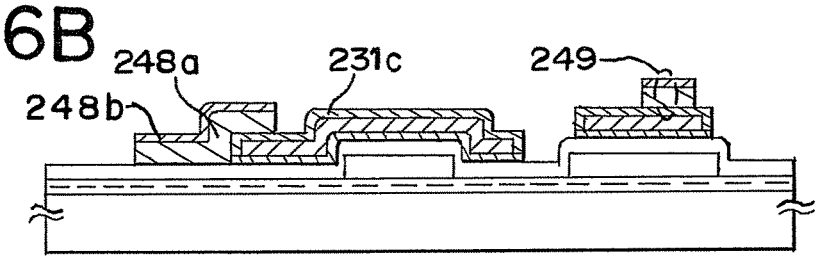

FIGS. 13B and 14B show top views of this state, and the cross portions taken along the line A-A' and the line C-C' correspond to the A-A' and C-C' cross portions, respectively, in FIG. 11B. Further, the cross portions taken along the line B-B' and the line D-D' correspond to the lines B-B' and D-D', respectively, in FIG. 15B and in FIG. 16B. In FIGS. 13B and 14B, a portion of gate wirings 147 and 148 overlap, and are in electrical contact with, a portion of the gate electrodes 128, 129, and 131. This state is also made clear from the cross-sectional structure views of FIG. 15B and FIG. 16B corresponding to the cross portions taken along the lines B-B' and D-D', and the conducting layer (C) forming the first conducting layer is electrically connected with the conducting layer (D) forming the second conducting layer.

A first interlayer insulating film 250 is formed from a silicon oxide film or a silicon oxynitride film with a thickness of between 500 and 1500 nm. This is formed in embodiment 1 by setting SiH$_4$ to 27 SCCM, N$_2$O to 900 SCCM, with a reaction pressure of 160 Pa, a substrate temperature of 325° C., and a discharge power density of 0.15 W/cm$^2$. Contact holes for reaching a source region or a drain region formed in the respective island-shape semiconductor layers are then formed, and source wirings 251 to 254, and drain wirings 255 to 258 are formed. Although not shown in the figures, in embodiment 1 these electrodes are laminate films with a three layer structure of a 100 nm Ti film, a 300 nm aluminum film containing Ti, and a 150 nm Ti film formed in succession by sputtering.

Next, a silicon nitride film, a silicon oxide film or a silicon oxynitride film with a thickness of between 50 and 500 nm (typically between 100 and 300 nm) is formed as a passivation film 259. If hydrogenation processing is performed in this state, then the desirable result as to the improvement of TFT characteristics can be obtained. For example, it is good to perform heat treatment for between 1 and 12 hours at 300 to 450° C. in an atmosphere of 3 to 100% hydrogen, and a similar effect can be obtained by using plasma hydrogenation, Note that openings may be formed in the passivation film 259 in positions in which contact holes for connecting to the pixel electrode, and to the drain wiring, will later be formed. (See FIG. 1c.)

Figure 14C:
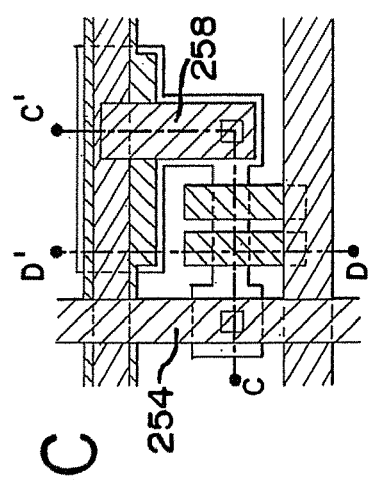
Figure 15C:
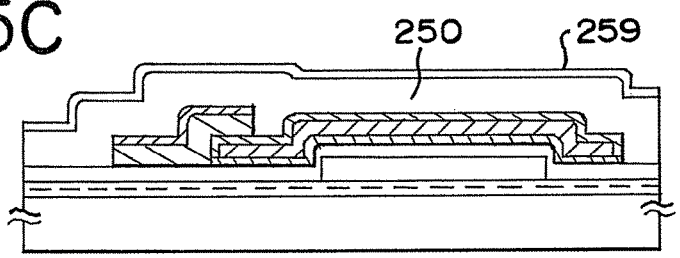
Figure 16C:
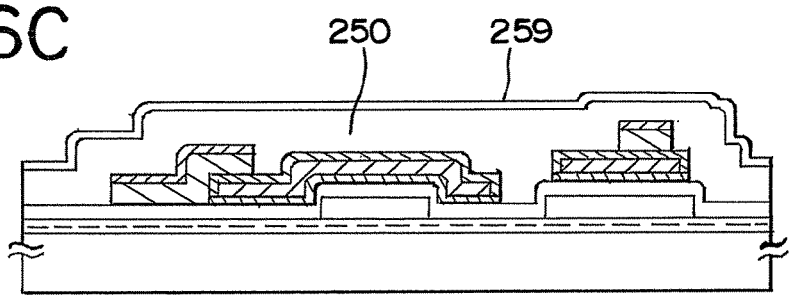

FIGS. 13C and 14C show top views of this state, and the cross portions taken along the line A-A' and the line C-C' correspond to the A-A' and C-C' cross portions, respectively, in FIG. 1C. Furthers the cross portions taken along the line B-B' and the line D-D' correspond to the lines B-B' and D-D', respectively, in FIG. 15C and in FIG. 16C. In FIGS. 13C and 14C, the first interlayer insulating film is shown omitted, and the source wirings 251, 252, and 254, and the drain wirings 255, 256, and 258, are connected to source and drain regions of the island-shape semiconductor layers 204, 205, and 207, respectively, which are not shown in the figures, through contact holes.

A second interlayer insulating film 260 is formed next from an organic resin with a thickness of 1.0 to 1.5 μm. Materials such as polyimide, acrylic, polyamide, polyimide amide, and BCB (benzocyclobutane) can be used as the organic resin. A thermal polymerization type polyimide is used here, and this is baked at 300° C. after application to the substrate. A contact hole for reaching the drain wiring 258 is then formed in the second interlayer insulating film 260, and pixel electrodes 261 and 262 are formed. A transparent conducting film is used for the pixel electrodes in a transmitting type liquid crystal display device, and a metallic film is used in a reflecting type liquid crystal display device. A transmitting type liquid crystal display device is used in embodiment 1, and therefore a 100-nm thick indium tin oxide (ITO) film is formed by sputtering. (See FIG. 12.)

The substrate having the TFTs of the driver circuit and the pixel TFT of the pixel portion on the same substrate is thus completed. A P-channel TFT 301, a first n-channel TFT 302, and a second n-channel TFT 303 are formed in the driver circuit, and a pixel TFT 304 and a storage capacitor 305 are formed in the pixel portion. For convenience, this type of substrate is referred to as an active matrix substrate throughout this specification.

Figure 12:
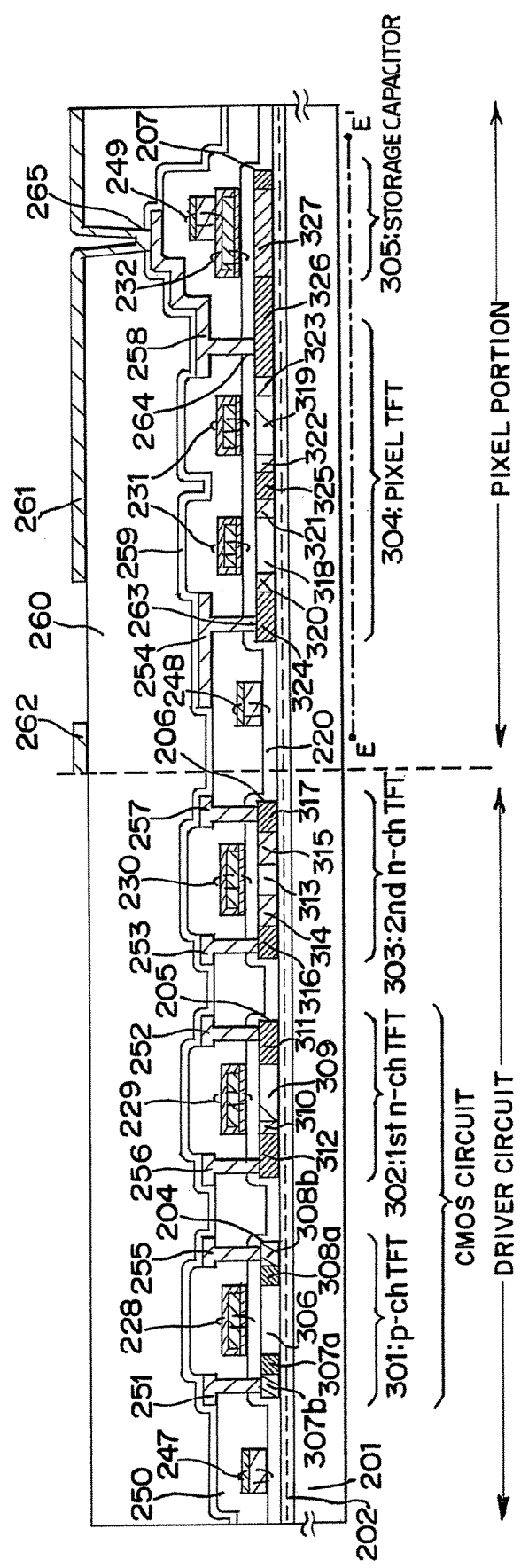
FIG. 12 is a cross-sectional view showing a pixel TFT, a storage capacitor, and driver circuit TFTs.

The P-channel TFT 301 of the driver circuit has a channel forming region 306, source regions 307a and 307b, and drain regions 308a and 308b in the island-shape semiconductor layer 204. The first n-channel TFT 302 has a channel forming region 309, an LDD region ($L_{ov}$) 310 overlapping the gate electrode 229, a source region 311, and a drain region 312 in the island-shape semiconductor layer 205. The length of the $L_{ov}$ region in the channel length direction is from 0.5 to 3.0 μm, preferable between 1.0 and 1.5 μm. A channel forming region 313, an $L_{ov}$ region, and an $L_{off}$ region (an LDD region which does not overlap the gate electrode, hereafter referred to as an $L_{off}$ region) are formed in the island-shape semiconductor layer 206 of the second n-channel TFT 303, and the length of the $L_{off}$ region in the channel length direction is from 0.3 to 2.0 μm, preferably between 1.0 and 1.5 μm. The island-shape semiconductor layer 207 of the pixel TFT 304 has channel forming regions 318 and 319, $L_{off}$ regions 320 to 323, and source or drain regions 324 to 326. The length of the $L_{off}$ region in the channel length direction is from 0.5 to 3.0 μm, preferably between 1.5 and 2.5 μm. In addition, the storage capacitor 305 is formed from the capacitor wirings 232 and 249, an insulating film made from the same material as the gate insulating film, and a semiconductor layer 327 connected to the drain region 326 of the pixel TFT 304 and in which has an added impurity element that imparts n-type conductivity. In FIG. 12 a double gate structure is used for the pixel TFT 304, but a single gate structure may be used, and a multi-gate structure in which a plural number of gates are formed may also be used without hindrance.

With the present invention as above, the TFT structures forming each circuit can be optimized in accordance with the required specification of the pixel TFT and the driver circuit, and it is possible to improve the operational performance of, and the reliability of, the semiconductor device. In addition, by forming the gate electrodes with a conducting material having heat resistance properties, activation of the LDD regions, the source regions, and the drain regions is easy, and by forming the gate wirings with a material having low electrical resistance, the resistance of the wirings can be sufficiently reduced. It is therefore possible to apply the present invention to a display device having a display region (screen size) of 4 inches or more. Then, by forming the blocking layer 202 with a silicon oxynitride film (A) and a silicon oxynitride film (B), as shown in embodiment 1, the S value of the n-channel TFT in the completed TFT can be made more than or equal to 0.10 V/dec and less than or equal to 0.30 V/dec, while $V_{th}$ can be made more than or equal to 0.5 V and less than or equal to 2.5 V, and the electric field effect mobility can be made equal to or more than 120 cm$^2$/V·sec and less than or equal to 250 cm$^2$/V sec. Further, the S value of the P-channel TFT can be made more than or equal to 0.10 V/dec and less than or equal to 0.30 V/dec, while $V_{th}$ can be made more than or equal to −2.5 V and less than or equal to −0.5 V, and the electric field effect mobility can be made equal to or more than 80 cm$^2$/V·sec and less than or equal to 150 cm$^2$/V·sec.

Embodiment 2

Figure 18:
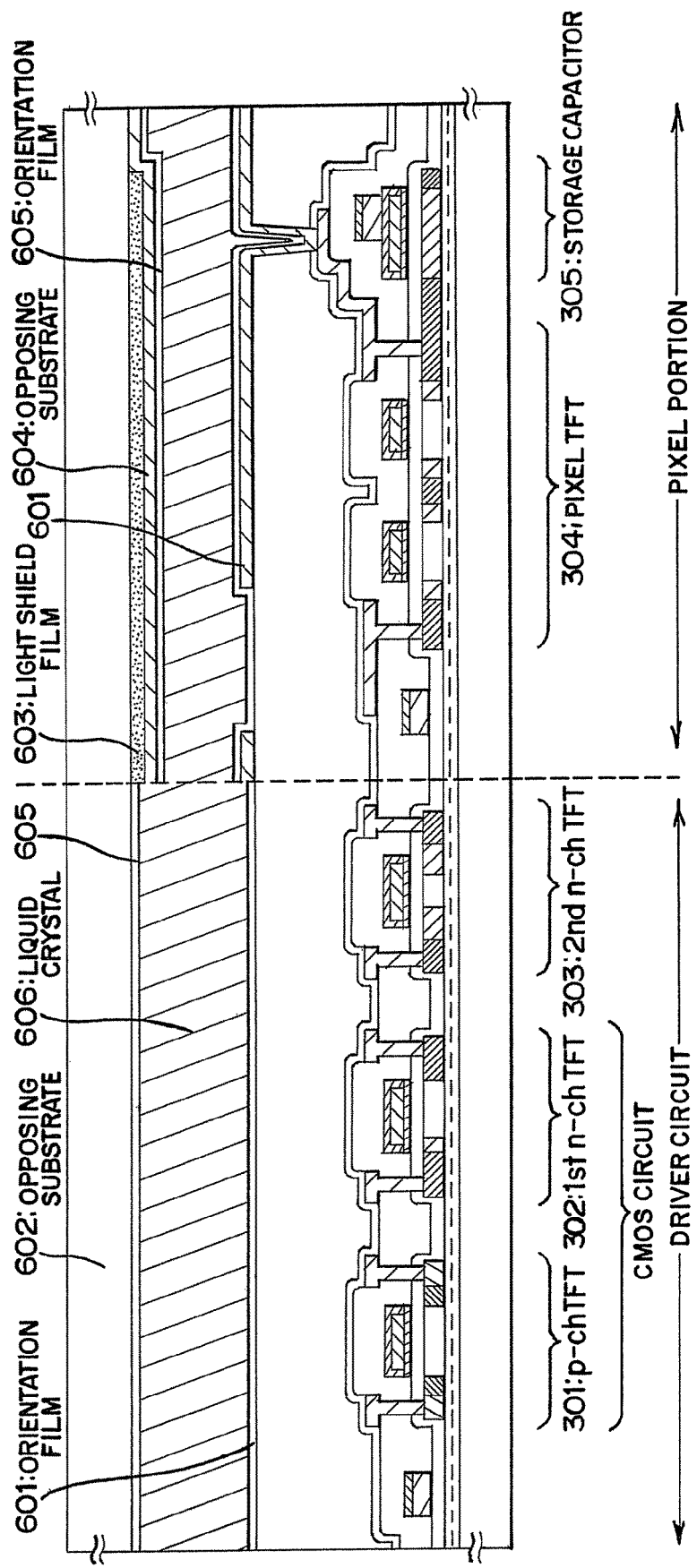
FIG. 18 is a cross-sectional view showing the structure of a liquid crystal display device.

In embodiment 2, a process of manufacturing an active matrix liquid crystal display device from the active matrix substrate of embodiment 1 is explained. As shown in FIG. 18, an alignment film 601 is formed for the active matrix substrate in the state of FIG. 12. A polyimide resin is often used for the alignment film of a liquid crystal display device. A light shielding film 603, a transparent conducting film 604, and an alignment film 605 are formed on an opposing substrate 602. After forming the alignment films, a rubbing process is performed to give the liquid crystal molecules a certain fixed pre-tilt angle, bringing them into alignment. The active matrix substrate, on which the pixel matrix circuit and the CMOS circuit are formed, and the opposing substrate are then joined together by a sealing material or spacers (both not shown in the figures) in accordance with a known cell construction process. Next, a liquid crystal material 606 is injected between both substrates, and the cell is completely sealed by a sealant (not shown in the figures). A known liquid crystal material may be used as the liquid crystal material. Thus the active matrix liquid crystal display device shown in FIG. 18 is completed.

Figure 19:
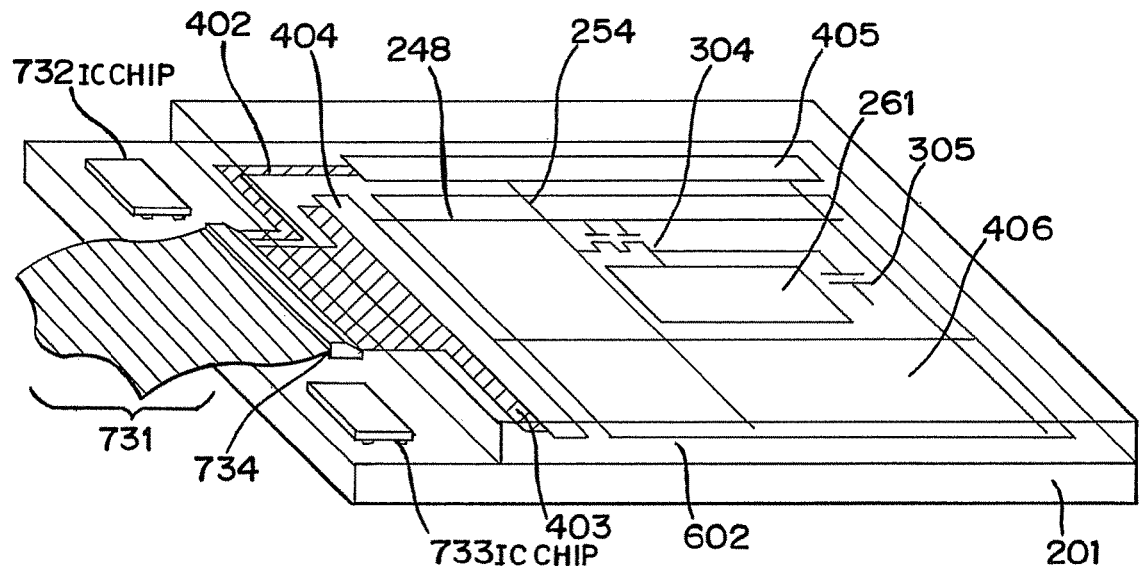
FIG. 19 is a perspective view showing the structure of a liquid crystal display device.
Figure 20:
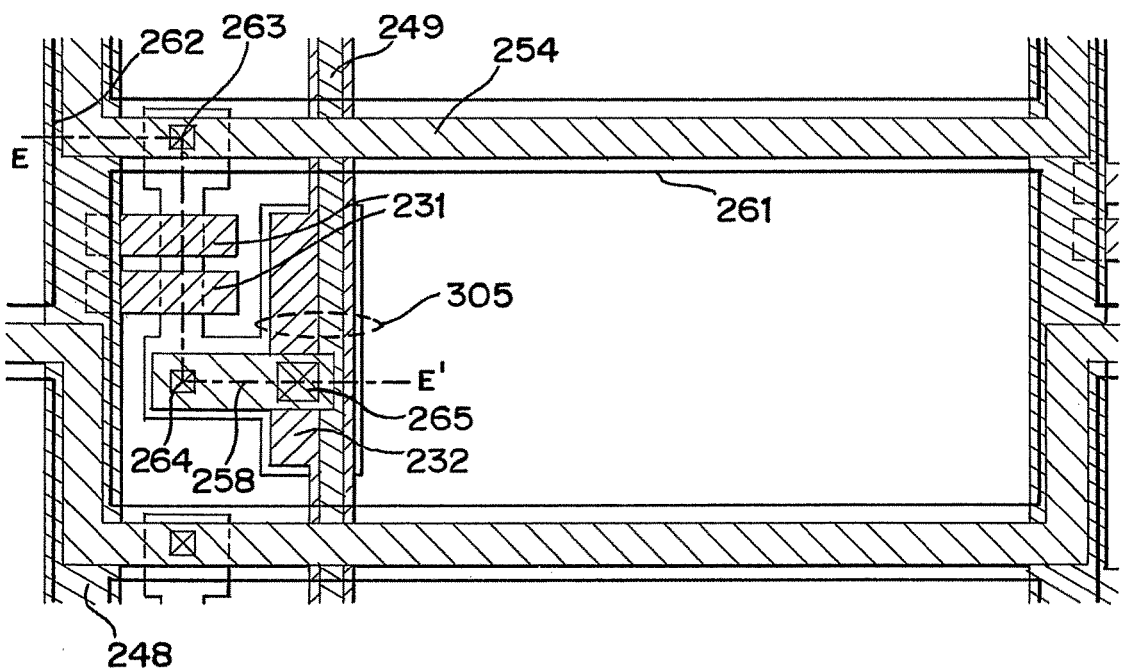
FIG. 20 is a top view showing a display region pixel.

Next, the structure of the active matrix liquid crystal display device is explained using the perspective view of FIG. 19 and the top view of FIG. 20. Note that FIG. 19 and FIG. 20 correspond to the cross-sectional structure views of FIGS. 8A to 12, and therefore common symbols are used. Further, the cross-sectional structure taken along the line E-E' shown in FIG. 20 corresponds to the cross-sectional view of the pixel matrix circuit shown in FIG. 12.

In FIG. 19, the active matrix substrate is structured by a pixel portion 406, a scanning signal driver-circuit 404, and an image signal driver circuit 405 formed on the glass substrate 201. The pixel TFT 304 is formed in the display region, and the driver circuit formed in the periphery is structured based on a CMOS circuit. The scanning signal driver circuit 404 and the image signal driver circuit 405 are connected to the pixel TFT 304 by the gate wiring 231 and the source wiring 254, respectively. Further, an FPC (flexible print circuit) 731 is connected to an external input terminal 734, and input wirings 402 and 403 are connected to the respective driver circuits.

FIG. 20 is an top view showing nearly one full pixel of the display area 406. The gate wiring 248 intersects, through a gate insulating film not shown in the figure, with the semiconductor layer 207 underneath. A source region, a drain region, and an $L_{off}$ region made from an $n^{--}$ region, are formed in the semiconductor layer, although not shown in the figure. Further, reference numeral 263 denotes a contact area of the source wiring 254 and the source region 324, reference numeral 264 denotes a contact area of the drain wiring 258 and the drain region 326, and reference numeral 265 denotes a contact area of the drain wiring 258 and the pixel electrode 261. The storage capacitor 305 is formed by the region in which the semiconductor layer 327 extending from the drain region 326 of the pixel TFT 304, and the region in which the capacitor wirings 232 and 249 overlap, through the gate insulating film.

Note that the active matrix liquid crystal display device of embodiment 2 is explained in accordance with the structure explained in embodiment 1, but it is not limited to the structure of embodiment 1, and an active matrix substrate completed by applying the processes shown by embodiment modes 1 to 3 to embodiment 1 may also be used. Whichever are used, they can be freely combined and an active matrix liquid crystal display device can be manufactured, provided that it is the active matrix substrate of the present invention in which a blocking layer is formed.

Embodiment 3

FIG. 17 is a view showing an example of the arrangement of input-output terminals, a display region, and driver circuits of a liquid crystal display device. There are m gate wirings and n source wirings that intersect in a matrix shape in the pixel portion 406. For example, 480 gate wirings and 640 source wirings are formed when the pixel density is VGA, and 768 gate wirings and 1024 source wirings are formed for the case of XGA. The screen size of the display region becomes 340 mm for a 13-inch class in diagonal length, and becomes 460 mm for an 18-inch class in diagonal. It is necessary to form the gate wirings from low resistance materials as shown in embodiment 1 in order to realize this kind of liquid crystal display device. If the time constant (resistance×capacitance) of the gate wirings becomes large, then the response speed of the scanning signal becomes slow, and the liquid crystal cannot be driven at high speed. For example, when the material forming the gate wiring has a resistivity of 100 μΩcm, then a 6 inch class screen size nearly becomes the limit, but if the resistivity is 3 μΩcm, then a screen size up to a 27 inch class can be adapted.

The scanning signal driver circuit 404 and the image signal driver circuit 405 are formed in the periphery of the display region 406. The length of the gate wirings of these driver circuits necessarily becomes longer with increasing screen size, and therefore it is preferably to form the wirings from a low resistance material such as aluminum (Al) or copper (Cu), as shown in embodiment 1, in order to realize a large screen. Further, with the present invention, the input wirings 402 and 403 which connect the input terminal 401 with each driver circuit can be formed by the same material as the gate wirings, and this can contribute to making the wiring resistance lower.

Embodiment 4

An active matrix substrate, or a liquid crystal display device, manufactured by implementing the present invention can be used in various electro-optical devices. The present invention can then be applied to all electronic equipment that incorporates this kind of electro-optical device as a display medium. The following can be given as this type of electronic equipment: a personal computer; a digital camera; a video camera; a portable information terminal (such as a mobile computer, a portable telephone, and an electronic book); and a navigation system. Some examples of these are shown in FIGS. 24A to 24F.

Figure 24A:
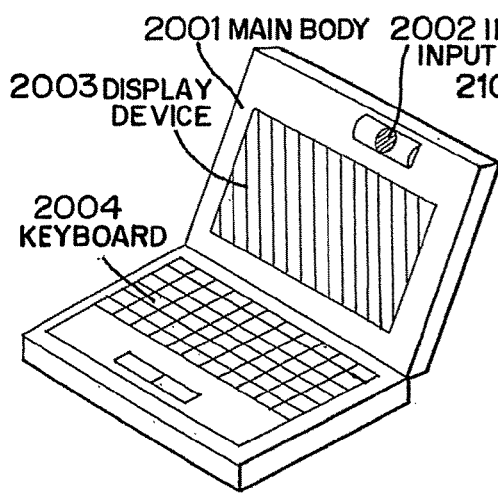
FIGS. 24A to 24F are views showing examples of semiconductor device.

FIG. 24A is a personal computer, and is composed of a main body 2001 comprising a microprocessor and memory, an image input portion 2002, a display device 2003, and a keyboard 2004. The present invention can form the display device 2003 and other signal processing circuits.

Figure 24B:
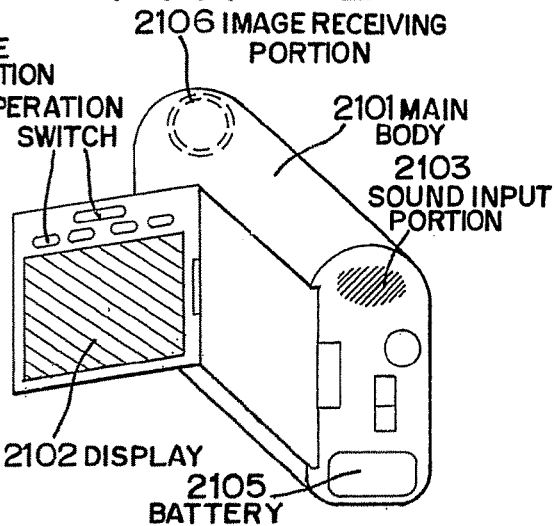

FIG. 24B is a video camera, and is composed of a main body 2101, a display device 2102, a sound input portion 2103, operation switches 2104, a battery 2105, and an image receiving portion 2106. The present invention can be applied to the display device 2102, 2103, and to other signal control circuits.

Figure 24C:
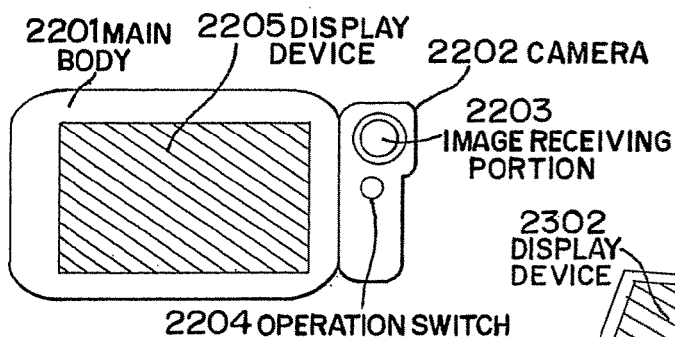

FIG. 24C is a portable information terminal, and is composed of a main body 2201, a camera 2202, an image portion 2203, operation switches 2204, and a display device 2205. The present invention can be applied to the display device 2205 and to other signal control circuits.

Figure 24D:
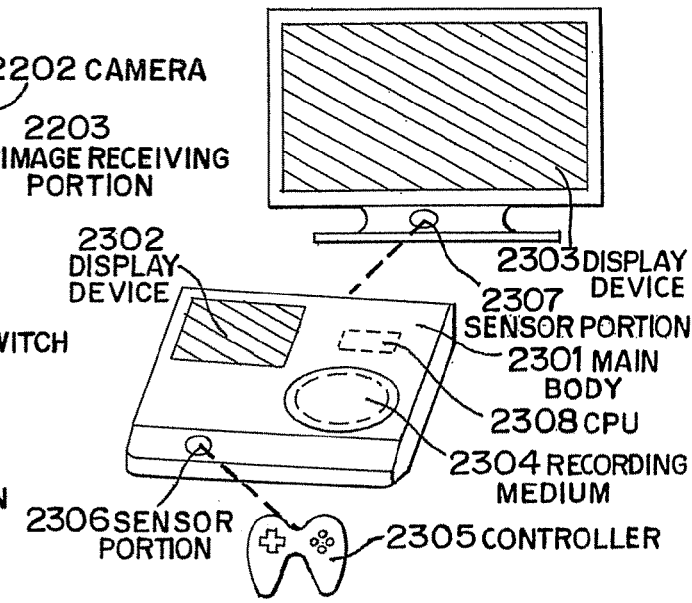

FIG. 24D is electronic game equipment such as a television game or a video game, and is composed of: a main body 2301 loaded with electronic circuits 2308 such as a CPU, and a recording medium 2304; a controller 2305; a display device 2303; and a display device 2302 built into the main body 2301. The display device 2303 and the display device 2302 incorporated into the main body 2301 may both display the same information, or the former may be taken as a main display and the latter may be taken as a sub-display to display information from the recording medium 2304 or the equipment operation status, or touch sensors can be added for use as an operating panel. Further, in order for the main body 2301, the controller 2305, and the display device 2303 to transmit signals to each other, wired communication may be used, or sensor portions 2306 and 2307 can be formed for either wireless communication or optical communication. The present invention can be applied to the display devices 2302 and 2303. A conventional CRT can also be used for the display device 2303.

Figure 24E:
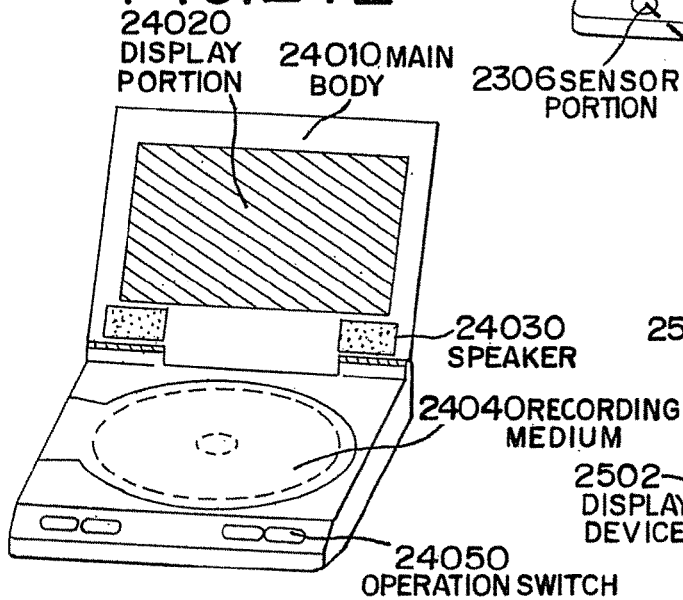

FIG. 24E is a player which uses a recording medium on which a program is recorded (hereafter referred to as a recording medium), and is composed of a main body 24010, a display device 24020, a speaker portion 24030, a recording medium 24040, and operation switches 24050. Note that a DVD (Digital Versatile Disk), or Compact Disk (CD) is used as a recording medium for this device, and that information display can be performed for music appreciation, film appreciation, video games (or television games), and the Internet. The present invention can be ideally used for the display device 2402, and for other signal control circuits.

Figure 24F:
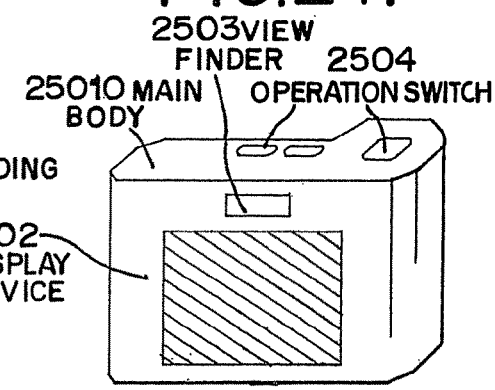

FIG. 24F is a digital camera, and is composed of a main body 25010, a display device 2502, a viewfinder portion 2503, operation switches 2504, and an image receiving portion (not shown in the figure). The present invention can be ideally used for the display devices, and for other signal control circuits.

Figure 25A:
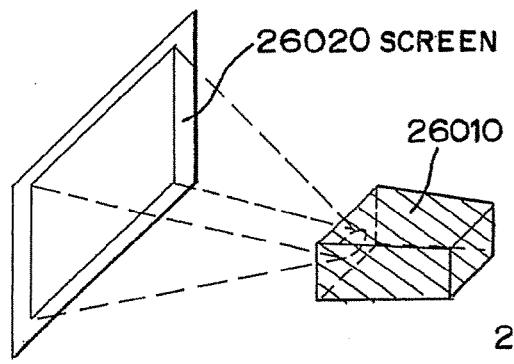
FIGS. 25A to 25D are views showing examples of semiconductor device.
Figure 25B:
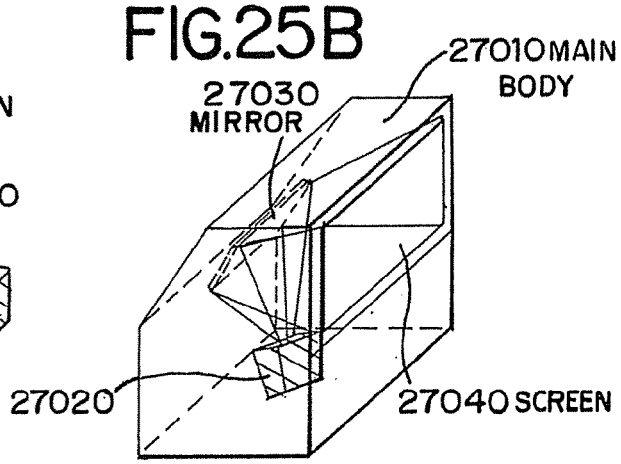

FIG. 25A is a front type projector, and is composed of an optical light source system and a display device 2601, and a screen 26020. The present invention can be applied to the display devices, and to other signal control circuits. FIG. 25B is a rear type projector, and is composed of a main body 27010, an optical light source system and a display device 2702, a mirror 27030, and a screen 2704. The present invention can be applied to display devices, and to other signal control circuits.

Figure 25C:
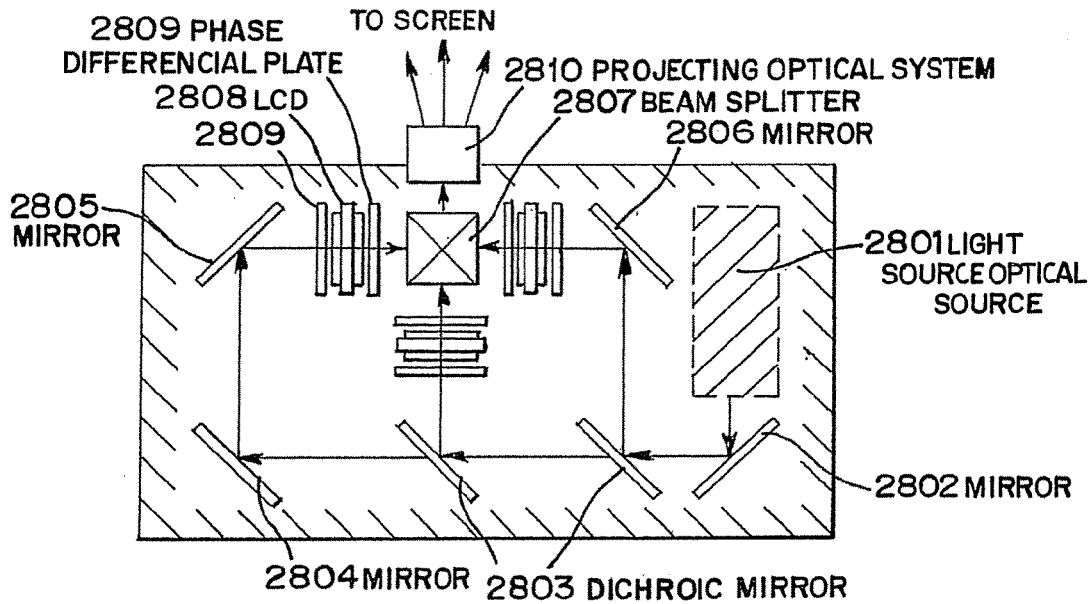
Figure 25D:
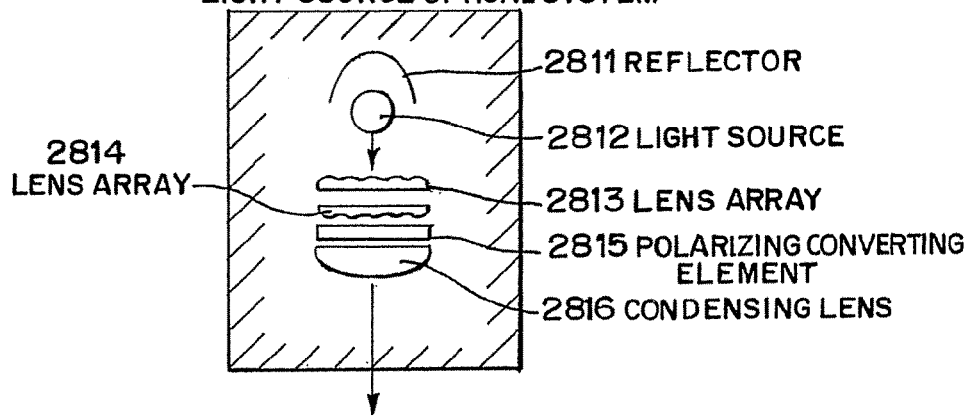

FIG. 25C is a drawing showing one example of the structure of the optical light source system and the display devices 26010 and 27020 in FIGS. 25A and 25B. The optical light source system and display devices 2601 and 2702 consist of an optical light source system 2801, mirrors 2802 and 2804 to 2806, a dichroic mirror 2803, a beam splitter 2807, a liquid crystal display device 2808, a phase difference plate 2809, and an optical projection system 2810. The optical projection system 2810 is composed of a plural number of optical lenses. In FIG. 25C an example is shown in which the liquid crystal display device 2810 is triple stage using three lenses, but there are no special limitations and a simple stage is acceptable, for example. Further, the operator may suitably set optical systems such as optical lenses, polarizing film, film to regulate the phase, IR films, within the optical path shown by the arrows in FIG. 25C. In addition, FIG. 25D shows one example of the structure of the optical light source system 2801 of FIG. 25C. In embodiment 4, the optical light source system 2801 is composed of a reflector 2811, a light source 2812, lens arrays 2813 and 2814, a polarizing conversion element 2815, a compound prism 2815, and a condenser lens 2816. Note that the optical light source system shown in FIG. 25D is one example, and there are no limitations placed on the structure shown in the figure.

Further, although not shown in the figures, it is possible to apply the present invention to a read-in circuit of a navigation system or an image sensor. Thus the application range for the present invention is extremely wide, and it can be applied to electronic equipment in all fields. Further, the electronic equipment of embodiment 4 can be realized with a composition that uses a combination of any of embodiment modes 1 to 3 and embodiments 1 to 3.

Embodiment 5

Figure 26A:
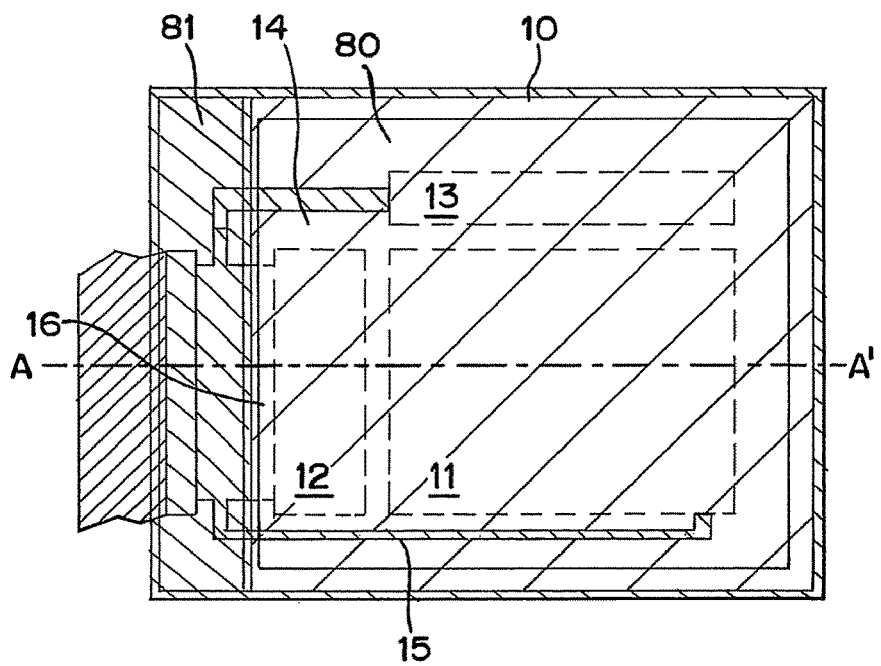
FIGS. 26A and 26B are a top view and a cross-sectional view, respectively, showing the structure of an EL display device.

An example of an active matrix substrate, similar to that of embodiment 1, applied to a self-light emitting type display panel (hereafter referred to as an EL display device) using an electroluminescence (EL) material is explained in embodiment 5. FIG. 26A is a top view of such an EL display panel. In FIG. 26A reference numeral 10 denotes a substrate, 11 denotes a pixel portion, 12 denotes a source side driver circuit, and 13 denotes a gate side driver circuit. The respective driver circuits lead to an FPC 17 through gate wirings 14 to 16, and thus connect to external equipment.

Figure 26B:
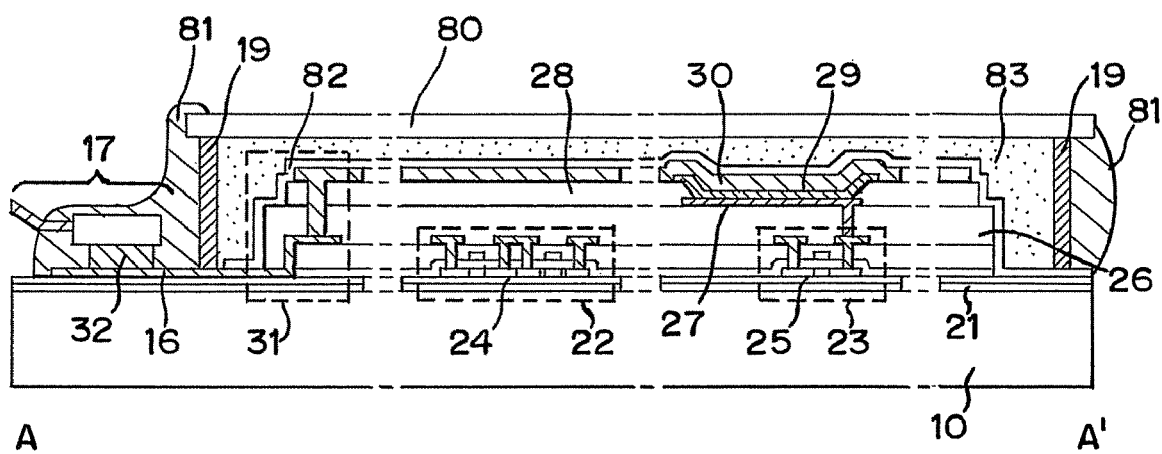

A cross-sectional view corresponding to the cross portion taken along the A-A' line of FIG. 26A is shown in FIG. 26B. An opposing plate 80 is formed over at least the pixel portion, and preferably above the driver circuits and the pixel portion, at this point. The opposing plate 80 is joined to the active matrix substrate, on which the TFTs and the self-light emitting layer using the EL material is formed, by a sealing material 19. A filler (not shown in the figures) is mixed into the sealing material 19, and the two substrates can be joined together with a nearly uniform spacing by the filler. In addition, the structure is sealed up by a sealant 81 on the outside of the sealing material 19, and on the top and periphery of the FPC 17. Materials such as a silicon resin, an epoxy resin, a phenol resin, or a butyl rubber are used for the sealant 81.

If the active matrix substrate 10 and the opposing plate 80 are thus joined, a space is formed between the substrates. A filler 83 fills the space. The filler 83 also has the effect of an adhesive for bonding the opposing plate 80. Materials such as PVC (polyvinyl chloride), epoxy resin, silicon resin, PVB (polyvinyl butyral), and EVA (ethylenevinylacetate) can be used as the filler 83. Further, the self-light emitting layer is weak with regard to moisture and easily deteriorates, and therefore a drying agent such as barium oxide desirably is mixed in to the inside of the filler 83, then a moisture absorption effect can be maintained. In addition, a passivation film 82 is formed from a silicon nitride film or a silicon oxynitride film on the self-light emitting layer, making a structure to prevent corrosion due to alkaline elements contained in the filler 83.

Materials such as a glass plate, an aluminum plate, a stainless steel plate, an FRP (fiberglass-reinforced plastics) plate, a PVF (polyvinyl fluoride) film, a Mylar film (a trademark of Du pont Corp.), a polyester film, and an acrylic film can be used as the opposing plate 80. Further, the moisture resistance can be improved by using a sheet with a structure in which several tens of Pn of aluminum foil is sandwiched by a PVF film or a Mylar film. The EL element is thus in an airtight state, and is closed off from the atmosphere.

Furthermore, a driver circuit TFT (Note that a CMOS circuit combining an n-channel TFT and a P-channel TFT is shown in the figures here) 22 and a pixel TFT 23 (however, only a TFT for controlling the current to the EL element is shown in the figures here) are formed on a blocking layer 21 on the substrate 10 in FIG. 26B. The blocking layer 21 is formed by laminating a silicon oxynitride film (A) and a silicon oxynitride film (B), similar to embodiment 1. An LDD region is formed in the structure shown in embodiment 4 in order to prevent a reduction in the on current due to the hot carrier effect, and to prevent a drop in the characteristics due to a shift in $V_{th}$, or bias stress.

For example, the P-channel TFT 301 and the n-channel TFT 302 shown in FIG. 12 may be used as the driver circuit TFT 22. Further, although it depends upon the drive voltage, the first n-channel TFT 304 shown in FIG. 12, or a P-channel TFT having a similar structure, may be used for the pixel TFT provided that the drive voltage is 10 V or more. The first n-channel TFT 302 has a structure in which an LDD region is formed overlapping the gate electrode on the drain side, but if the drive voltage is 10 V or less, deterioration sue to the hot carrier effect can mostly be ignored, and therefore the LDD region need not be formed.

In manufacturing an EL display device from an active matrix substrate in the state of FIG. 12, an interlayer insulating film (leveling film) 26 is formed from a resin material on the source wiring and on the drain wiring, and a pixel electrode 27 electrically connected to the drain of the pixel TFT 23 is formed from a transparent conducting film. An indium oxide and tin oxide compound (referred to as ITO), or an indium oxide and zinc oxide compound can be used as the transparent conducting film. After forming the pixel electrode 27, an insulating film 28 is then formed, and an open portion is formed on the pixel electrode 27.

Next, any known EL materials (hole injection layer, hole transport layer, light emitting layer, electron transport layer, electron injection layer) may be freely combined and used in a laminate structure or a single layer structure for a self-light emitting layer 29. A known technique may be used to determine the structure type. Further, there are low molecular weight materials and high molecular weight materials (polymers) as EL materials. An evaporation method is used for low molecular weight materials, but it is possible to use a simple method such as spin coating, printing, or inkjet method for high molecular weight materials.

The self-light emitting layer may be formed by a method such as evaporation method using a shadow mask, an ink jet method, or a dispenser method. Whichever method is used, by forming a light emitting layer that can emit light of different wavelengths for each pixel (red light emitting layer, green light emitting layer, and blue light emitting layer), a color display becomes possible. In addition, a method of combining color changing layers (CCM) with color filters, and a method of combining white light emitting layers with color filters exist, and either method may also be used. Of course, a single color light EL display device is also possible.

A cathode 30 is then formed on the self-light emitting layer 29. It is preferable to remove as much as possible of the moisture and oxygen existing in the interface between the cathode 30 and the self-light emitting layer 29. Therefore, it is necessary to form the self-light emitting layer 29 and the cathode 30 inside a vacuum, or to form the self-successively layer 29 in an inert atmosphere and then form the cathode 30 without exposure to the atmosphere. It is possible to perform the above film deposition in embodiment 5 by using a multi-chamber system (cluster tool system) deposition device.

Note that a laminate structure of a LiF (lithium fluoride) film and an Al (aluminum) film is used for the cathode 30 in embodiment 5. Specifically, a 1-nm thick LiF (lithium fluoride) film is formed on the self-light emitting layer 29 by evaporation, and a 300-nm thick aluminum film is formed thereon. Of course, an MgAg electrode, a known cathode material, may also be used. The cathode 30 is then connected to the wiring 16 in the region denoted by reference numeral 31. The wiring 16 is a power supply line for applying a predetermined voltage to the cathode 30, and is connected to the FPC 17 through an aeolotropic conducting paste material 32. Additionally, a resin layer 80 is formed on the FPC 17, increasing the adhesive strength of this area.

In order to electrically connect the cathode 30 and the wiring 16 in the region denoted by reference numeral 31, it is necessary to form contact holes in the interlayer insulating film 26 and the insulating film 28. The contact holes may be formed during etching of the interlayer insulating film 26 (when forming the pixel electrode contact hole), and during etching of the insulating film 28 (when forming the opening before forming the EL layer). Further, etching may proceed in one shot all the way to the interlayer insulating film 26 when etching the insulating film 28. In this case, the contact holes can be given a good shape provided that the interlayer insulating film 26 and the insulating film 28 are the same resin material.

In addition, the wiring 16 is electrically connected to the FPC 17 through the gap (filled by the sealant 81) between the sealant material 19 and the substrate 10. Note that an explanation of the wiring 16 has been made here, and that the wirings 14 and 15 are also connected electrically to the FPC 17 by similarly passing underneath the sealing material 19.

Figure 28A:
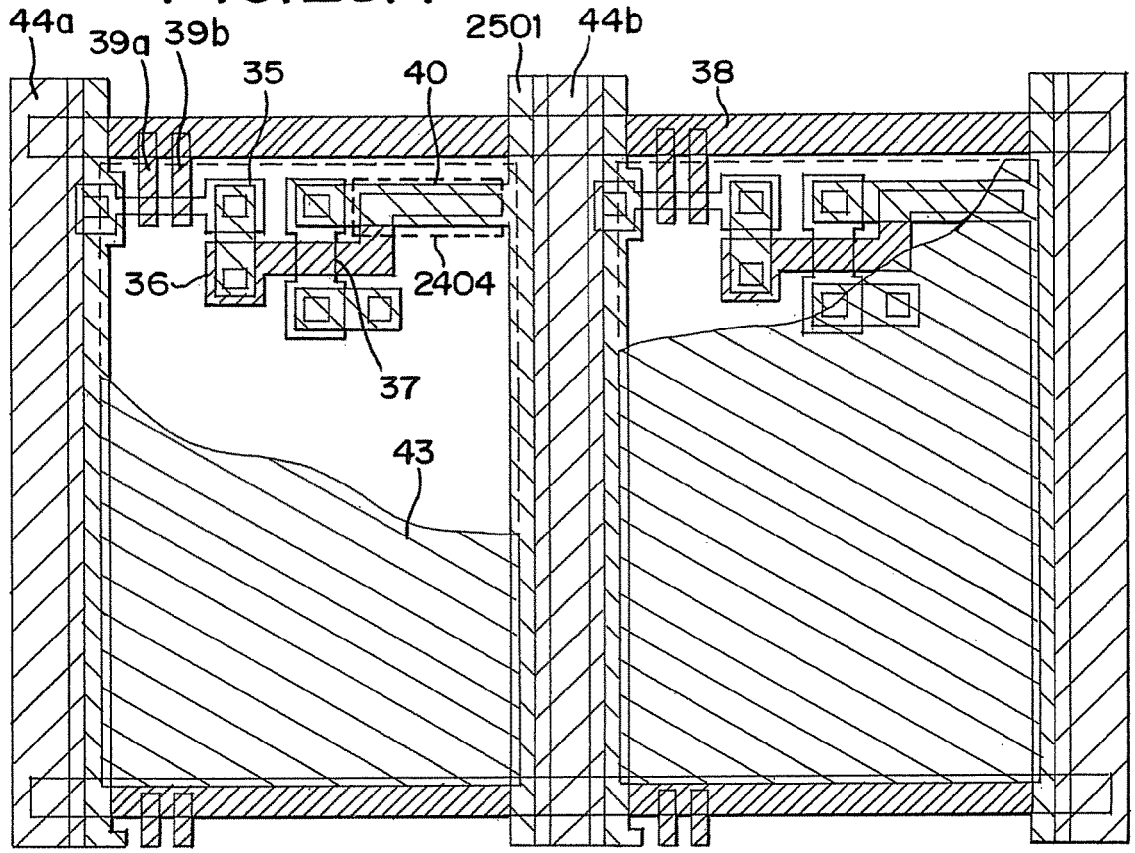
FIGS. 28A and 28B are a top view and a circuit view, respectively, of an EL display device.
Figure 28B:
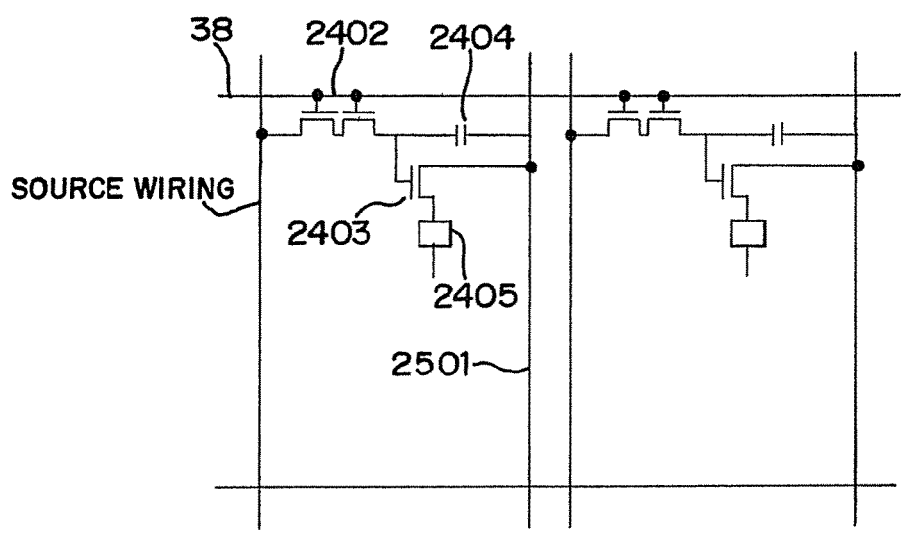

A more detailed cross-sectional structure of a pixel portion is shown now in FIGS. 27A and 27B, a top surface structure is shown in FIG. 28A, and a circuit view is shown in FIG. 28B. In FIG. 27A, first a blocking layer is formed on a substrate 2401, and a switching TFT 2402 formed on the blocking layer is formed with the same structure as that of the pixel TFT 304 of FIG. 12 in embodiment 1. By using a double gate structure, in essence the structure is two TFTs in series, and this has the advantage that the off current value can be lowered. Note that although embodiment 5 has a double gate structure, a single gate structure may also be used, as may a triple gate structure and a plural gate structure having a larger number of gates.

Further, a current control TFT 2403 is formed using the first n-channel TFT 302 shown by FIG. 12. This TFT structure is a structure in which the LDD region is formed overlapping the gate electrode only on the drain side, and becomes a structure which reduces the parasitic capacitance between the gate and the drain, reduces the series resistance, and improves the current drive performance. From other perspectives as well, the fact that this structure is used possesses an extremely important meaning. A current control TFT is an element for controlling the amount of current flowing in an EL element, and there is much current flow, so it is an element in which there is a great danger of degradation due to heat or due to hot carriers. Therefore, by forming the LDD region overlapping a portion of the gate electrode in the current control TFT, deterioration of the TFT can be prevented, and stability of operation can be improved. Furthermore, there is a fear that in an EL layer controlled by current flow, dispersion in the characteristics of the current control TFT may appear, as is, as unevenness in the display. However, by managing the stress of the blocking layer, and by keeping $V_{th}$ and the S value within a prescribed range, as with the present invention, dispersions can be made fewer. A drain line 35 of the switching TFT 2402 is electrically connected to a gate electrode 37 of the current control TFT by a wiring 36. Further, a wiring denoted by reference numeral 38 is a gate wiring for electrically connecting gate electrodes 39a and 39b of the switching TFT 2402.

A single gate structure is shown in the figures for the current control TFT 2403 in embodiment 5, but a plural gate structure, with a plural number of TFTs connected in series, may also be used. In addition, a structure for performing heat radiation with high efficiency, in which a plural number of TFTs are connected in parallel, in essence dividing the channel forming region into a plural number of channel forming regions, may also be used. This type of structure is an effective countermeasure against heat degradation.

The wiring which becomes the gate electrode 37 of the current control TFT 2403 is the region shown by reference numeral 2404, and overlaps a drain wiring 40 of the current control TFT 2403, through an insulating film, as shown in FIG. 28A. At this point a capacitor is formed in the region shown by reference numeral 2404. The capacitor 2404 functions as a capacitor for retaining the voltage applied to the gate on the current control TFT 2403. Note that the drain wiring 40 is connected to a current supply line (voltage supply line) 2501, and a fixed voltage is constantly applied.

A first passivation film 41 is formed on the switching TFT 2402 and the current control TFT 2403, and a leveling film 42 is formed thereon of that with an insulating resin film. It is very important to level the step due to the TFTs by using the leveling film 42. The self-light emitting layer formed later is extremely thin, so that there are cases that cause the luminescence to be defective. Therefore, to form the self-light emitting layer with as level a surface as possible, it is preferable to perform flatting before forming the pixel electrode.

Reference numeral 43 denotes a pixel electrode (EL element cathode) from a conducting film with high reflectivity, and is electrically connected to the drain of the current control TFT 2403. It is preferable to use a low resistance conducting film, such as an aluminum alloy film, a copper alloy film, and a silver alloy film, or a laminate of such films, as the pixel electrode 43. A laminate structure with other conducting films may also be used, of course. Further, a light emitting layer 45 is formed in the middle of the groove (corresponding to the pixel) formed by banks 44a and 44b formed by insulating films (preferably resins). Note that only one pixel is shown in the figures here, but the light emitting layer may be divided to correspond to each of the colors R (red), G (green), and B (blue). A conjugate polymer material is used as an organic EL material. Polyparaphenylene vinylenes (PPVs), polyvinyl carbazoles (PVCs), and polyfluoranes can be given as typical polymer materials. Note that there are several types of PPV organic EL materials, and the materials recorded in Shenk, H., Becker, H., Gelsen, O., Kluge, E., Kreuder, W., and Spreitzer, H., Gelsen, O, Polymers for Light Emitting Diodes, Euro Display Proceedings, 1999, pp. 33-7, and in Japanese Patent Application Laid-open No. Hei 10-92576, for example, may be used.

As specific light emitting layers, cyano-polyphenylene vinylene may be used as a red light radiating light emitting layer, polyphenylene vinylene may be used as a green light radiating light emitting layer, and polyphenylene vinylene or polyalkylphenylene may be used as a blue light radiating light emitting layer. The film thickness may be between 30 and 150 nm (desirably between 40 and 100 nm). However, the above example is one example of the organic EL materials that can be used as light emitting layers, and it is not necessary to limit use to these materials. An EL layer (a layer for luminescence and for performing carrier motion for luminescence) may be formed by freely combining light emitting layers, charge carrier layers, and charge injection layers. For example, embodiment 5 shows an example using polymer materials as light emitting layers, but low molecular weight organic EL materials may also be used. Further, it is possible to use inorganic materials such as silicon carbide, as charge carrier layers and charge injection layers. Known materials can be used for these organic EL materials and inorganic materials.

A laminate structure EL layer, in which a hole injection layer 46 from PEDOT (polythiophene) or PAni (polyaniline) is formed on the light emitting layer 44, is used in embodiment 5. An anode 47 is then formed on the hole injection layer 46 made from a transparent conducting film. The light generated by the light emitting layer 45 is radiated toward the upper surface (toward the top of the TFT) in the case of embodiment 5, so the anode must be transparent to light. An indium oxide and tin oxide compound, or an indium oxide and zinc oxide compound can be used for the transparent conducting film. However, because it is formed after formation of the low heat resistance light emitting layer and the hole injection layer, it is preferable to use a material which can be formed at as low a temperature as possible.

At the point where the anode 47 is formed, an EL element 2405 is complete. Note that what is referred to as the EL element 2405 here indicates the capacitor formed by the pixel electrode (cathode) 43, the light emitting layer 45, the hole injection layer 46, and the anode 47. As shown in FIG. 28A, the pixel electrode 43 nearly matches the area of the pixel, so the entire pixel functions as an EL device. Therefore, the luminescence usage efficiency is very high, and a bright image display is possible.

An additional second passivation film 48 is then formed on the anode 47 in embodiment 5. It is preferable to use a silicon nitride film or a silicon oxynitride film as the second passivation film 48. The purpose of this is the isolation of the EL element from the outside, and it has meaning of preventing degradation due to the oxidation of the organic EL material, and controlling gaseous oscillations from the organic EL material. Thus the reliability of the EL display can be improved.

Thus the EL display panel of embodiment 5 has a pixel portion consists of pixels structured as in FIG. 28, has a switching TFT with sufficiently low of off current value, and has a current control TFT with strong hot carrier injection. Therefore, an EL display panel which has high reliability, and in which good image display is possible, is obtained.

An example of inverting the structure of the self-light emitting layer is shown in FIG. 27B. A current control TFT 2601 is formed with the same structure as that of the P-channel TFT 146 of FIG. 1. Embodiment 1 may be referred to for the manufacturing processes. A transparent conducting film is used as a pixel electrode (anode) 50 in embodiment 5. Specifically, a conducting film consists of a compound of indium oxide and zinc oxide is used. Of course, a conducting film consists of a compound of indium oxide and tin oxide may also be used.

After then forming banks 51a and 51b from insulating films, a light emitting layer 52 is formed from polyvinyl carbazole by solution coating. An electron injection layer 53 is formed thereon from potassium acetylacetonate (denoted acacK), and a cathode 54 is formed from an aluminum alloy on the light emitting layer 52. In this case the cathode 54 also functions as a passivation film. An EL element 2602 is thus formed. The light generated by the light emitting layer 52 is radiated toward the substrate on which the TFT is formed in embodiment 5, as shown by the arrows. It is preferable to form a P-channel TFT for the current control TFT 2601 in cases when a structure like that of embodiment 5 is used.

An EL display device such as that shown in embodiment 5 can be used as the display portion of the electronic equipment of embodiment 4.

Embodiment 6

Figure 29A:
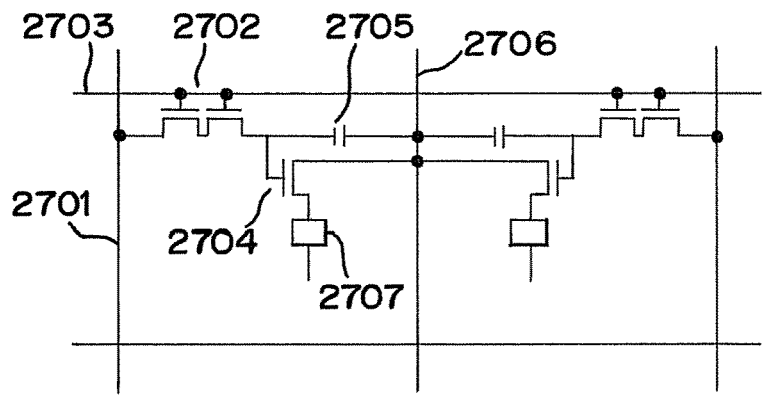
FIGS. 29A to 29C are examples of circuit views of the pixel portion of an EL display device.
Figure 29B:
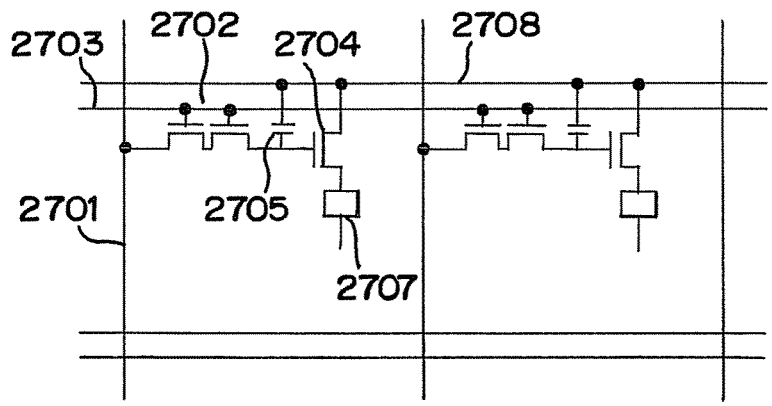
Figure 29C:
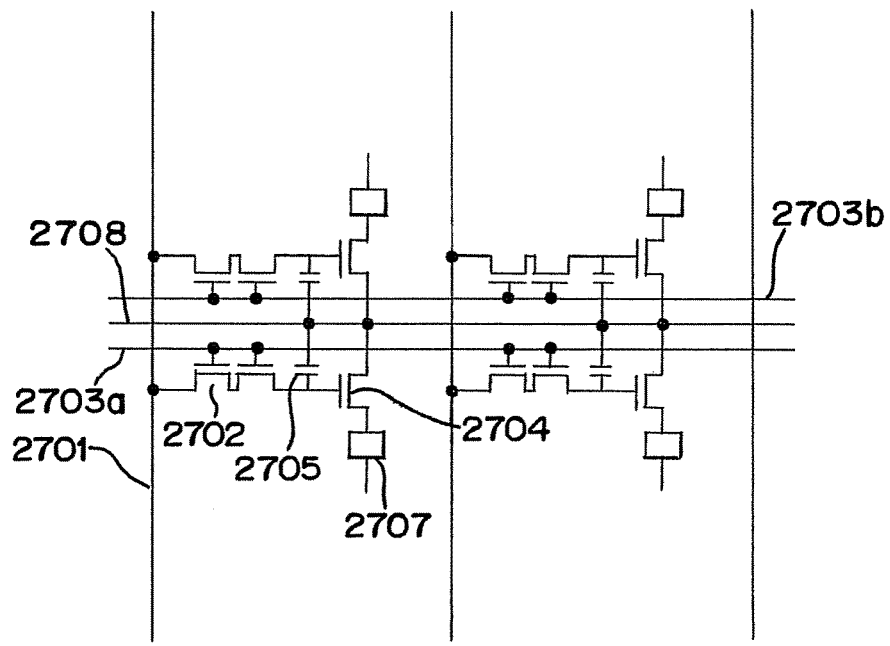

Examples of cases in which the pixel structure differs from that of the circuit view shown in FIG. 28B are shown in embodiment 6 with FIGS. 29A to 29C. Note that in embodiment 6, reference numeral 2701 denotes a source wiring of a switching TFT 2702, reference numeral 2703 denotes a gate wiring of the switching TFT 2702, reference numeral 2704 denotes a current control TFT, 2705 denotes a capacitor, 2706 and 2708 denote electric current supply lines, and 2707 denotes an EL element.

FIG. 29A is an example of a case in which the electric current supply line 2706 is common between two pixels. Namely, this is characterized in that the two pixels are formed having linear symmetry around the electric current supply line 2706. In this case, the number of electric current supply lines can be reduced, and therefore the pixel portion can be made even more high definition.

Further, FIG. 29B is an example of a case in which the electric current supply line 2708 is formed parallel to the gate wiring 2703. Note that in FIG. 29B, the structure is formed such that the electric current supply line 2708 and the gate wiring 2703 do not overlap, but, provided that both are wirings formed on different layers, they can be formed to overlap through an insulating film. In this case, the exclusive surface area can be shared, and the pixel portion can be made even more high definition by the electric current supply line 2708 and the gate wiring 2703.

Furthermore, FIG. 29C is characterized in that the electric current supply line 2708 and the gate wiring 2703 are formed in parallel, similar to the structure of FIG. 29B, and additionally, in that the two pixels are formed so as to have linear symmetry around the electric current supply line 2708. In addition, it is effective to form the electric current supply line 2708 so as to overlap with one of the gate wirings 2703. In this case, the number of electric current supply lines can be reduced, and therefore the pixel portion can be made even more high definition. In FIGS. 29A and 29B, there is a structure forming the capacitor 2705 in order to stores the voltage applied to the gate of the current control TFT 2704, but it is also possible to omit the capacitor 2705.

In order to use the n-channel TFT of the present invention, such as that shown in FIG. 27A, as the current control TFT 2403, there is an LDD region formed so as to overlap the gate electrode through the gate insulating film. A so-called parasitic capacitance is formed in the region, which overlaps, but embodiment 6 is characterized by the active use of this parasitic capacitance as a substitute for the capacitor 2705. The capacitance of the parasitic capacitance changes by the surface area in which the gate electrode and the LDD region overlap, and is determined by the length of the LDD region contained in the overlapping region. Further, it is also possible to omit the capacitor 2705 in the structures of FIGS. 29A, 29B, and 29C.

Note that the circuit structure of the EL display device shown in embodiment 6 may be formed by selecting the TFT structure shown in embodiment 1, and forming the circuit shown in FIGS. 29A to 29C. Furthermore, it is possible to use the EL display panel of embodiment 6 as the display portion of the electronic equipment of embodiment 4.

By forming a silicon oxynitride film (A), manufactured from $SiH_4$, $NH_3$, and $N_2O$ in close adhesion with in a glass substrate, in a semiconductor device having a TFT formed on the glass substrate, contamination of the active layer by an impurity such as an alkaline metal can be prevented.

In addition, by laminating a silicon oxynitride film (B), manufactured from $SiH_4$, $NH_3$, and $N_2O$, to the silicon oxynitride film (A) and taking this as a blocking layer, and by setting the values of: the concentration of oxygen, nitrogen, and hydrogen contained in these films; the molecular density; the etching speed; and the change in internal stress due to thermal annealing to values within a certain range, then the values of TFT characteristics such as $V_{th}$ and the S value can be set to desired values.

Provided that this kind of TFT is used, then an electro-optical device, typically an active matrix liquid crystal display device, which can be driven with low power consumption can be manufactured.

What is claimed is:

1. A display device including at least one thin film transistor formed over a substrate, the display device comprising:
   a first silicon oxynitride film (A) formed on the substrate;
   a second silicon oxynitride film (B) formnned on the first silicon oxynitride film (A);
   a semiconductor layer formed on the second silicon oxynitride film (B);
   a gate electrode adjacent to the semiconductor layer, the gate electrode comprising at least a first layer of tantalum nitride and a second layer of tungsten formed on the first layer;
   a leveling film comprising a resin formed over the semiconductor layer; and
   a pixel electrode formed over the leveling film,
   wherein a composition ratio of nitrogen, with respect to oxygen, in the first silicon oxynitride film (A) is more than or equal to 0.6, and is less than or equal to 1.5; and
   a composition ratio of nitrogen, with respect to oxygen, in the second silicon oxynitride film (B) is more than or equal to 0.01, and is less than or equal to 0.4.

2. The display device according to claim 1 wherein the display device is an active matrix display device.

3. The display device according to claim 1 wherein the display device is an active matrix liquid crystal display device.

4. A display device comprising:
   a first insulating film formed over a substrate, the first insulating film comprising silicon, oxygen and nitrogen;
   a second insulating film formed on the first insulating film, the second insulating film comprising silicon, oxygen and nitrogen;
   a semiconductor layer formed on the second insulating film;
   a leveling film comprising a resin formed over the semiconductor layer; and
   a pixel electrode formed over the leveling film,
   wherein a composition ratio of nitrogen, with respect to oxygen, in the first insulating film is more than or equal to 0.6, and is less than or equal to 1.5; and
   a composition ratio of nitrogen, with respect to oxygen, in the second insulating film is more than or equal to 0.01, and is less than or equal to 0.4.

5. The display device according to claim 4 wherein the semiconductor layer is a crystalline semiconductor layer.

6. The display device according to claim 4 further comprising a gate electrode adjacent to the semiconductor layer.

7. The display device according to claim 6 wherein the gate electrode is located over the semiconductor layer.

8. The display device according to claim 4 wherein the first insulating film has a density of more than or equal to $8 \times 10^{22}$ atoms/$cm^3$, and less than or equal to $2 \times 10^{23}$ atoms/$cm^3$; and the second insulating film has a density of more than or equal to $6 \times 10^{22}$ atoms/$cm^3$, and less than or equal to $9 \times 10^{22}$ atoms/$cm^3$.

9. The display device according to claim 4 wherein the substrate is a glass substrate.

10. The display device according to claim 4 wherein the first and second insulating films contain hydrogen.

11. A display device comprising:
    a first insulating film formed over a substrate, the first insulating film comprising silicon, oxygen and nitrogen;
    a second insulating film formed on the first insulating film, the second insulating film comprising silicon, oxygen and nitrogen;
    a semiconductor layer formed on the second insulating film;
    a leveling film comprising a resin formed over the semiconductor layer; and
    a pixel electrode formed over the leveling film,
    wherein an oxygen concentration of the first insulating film is more than or equal to 20 atomic %, and less than or equal to 30 atomic %; and a nitrogen concentration of the first insulating film is more than or equal to 20 atomic %, and less than or equal to 30 atomic %;
    an oxygen concentration of the second insulating film is more than or equal to 55 atomic %, and less than or equal to 65 atomic %; and a nitrogen concentration of the second insulating film is more than or equal to 1 atomic %, and less than or equal to 20 atomic %.

12. The display device according to claim 11 wherein the semiconductor layer is a crystalline semiconductor layer.

13. The display device according to claim 11 further comprising a gate electrode adjacent to the semiconductor layer.

14. The display device according to claim 13 wherein the gate electrode is located over the semiconductor layer.

15. The display device according to claim 11 wherein the first insulating film has a density of more than or equal to $8 \times 10^{22}$ atoms/$cm^3$, and less than or equal to $2 \times 10^{23}$ atoms/$cm^3$; and the second insulating film has a density of more than or equal to $6 \times 10^{22}$ atoms/$cm^3$, and less than or equal to $9 \times 10^{22}$ atoms/$cm^3$.

16. The display device according to claim 11 wherein the substrate is a glass substrate.

17. The display device according to claim 11 wherein the first and second insulating films contain hydrogen.

18. A display device comprising:
    a first insulating film formed over a substrate, the first insulating film comprising silicon, oxygen and nitrogen;

a second insulating film formed on the first insulating film, the second insulating film comprising silicon, oxygen and nitrogen;
a semiconductor layer formed on the second insulating film;
a third insulating film formed over the semiconductor layer, the third insulating film comprising silicon, oxygen and nitrogen;
a leveling film comprising a resin formed over the third insulating film; and
a pixel electrode formed over the leveling film,
wherein a composition ratio of nitrogen, with respect to oxygen, in the first insulating film is more than or equal to 0.6, and is less than or equal to 1.5;
a composition ratio of nitrogen, with respect to oxygen, in the second insulating film is more than or equal to 0.01, and is less than or equal to 0.4; and
a composition ratio of nitrogen, with respect to oxygen, in the third insulating film is more than or equal to 0.01, and is less than or equal to 0.4.

19. The display device according to claim 18 wherein the semiconductor layer is a crystalline semiconductor layer.

20. The display device according to claim 18 further comprising a gate electrode adjacent to the semiconductor layer with the third insulating film interposed therebetween.

21. The display device according to claim 18 wherein the third insulating film is a gate insulating film.

22. The display device according to claim 18 wherein the first insulating film has a density of more than or equal to $8\times10^{22}$ atoms/cm$^3$, and less than or equal to $2\times10^{23}$ atoms/cm$^3$; and the second insulating film has a density of more than or equal to $6\times10^{22}$ atoms/cm$^3$, and less than or equal to $9\times10^{22}$ atoms/cm$^3$.

23. The display device according to claim 18 wherein the substrate is a glass substrate.

24. The display device according to claim 18 wherein the first and second insulating films contain hydrogen.

25. A display device comprising:
a first insulating film formed over a substrate, the first insulating film comprising silicon, oxygen and nitrogen;
a second insulating film formed on the first insulating film, the second insulating film comprising silicon, oxygen and nitrogen;
a semiconductor layer formed on the second insulating film;
a third insulating film formed over the semiconductor layer, the third insulating film comprising silicon, oxygen and nitrogen;
a leveling film comprising a resin formed over the third insulating film;
a pixel electrode formed over the leveling film,
wherein an oxygen concentration of the first insulating film is more than or equal to 20 atomic %, and less than or equal to 30 atomic %; and a nitrogen concentration of the first insulating film is more than or equal to 20 atomic %, and less than or equal to 30 atomic %;
an oxygen concentration of the second insulating film is more than or equal to 55 atomic %, and less than or equal to 65 atomic %; and a nitrogen concentration of the second insulating film is more than or equal to 1 atomic %, and less than or equal to 20 atomic %; and
an oxygen concentration of the third insulating film is more than or equal to 55 atomic %, and less than or equal to 65 atomic %; and a nitrogen concentration of the third insulating film is more than or equal to 1 atomic %, and less than or equal to 20 atomic %.

26. The display device according to claim 25 wherein the semiconductor layer is a crystalline semiconductor layer.

27. The display device according to claim 25 further comprising a gate electrode adjacent to the semiconductor layer with the third insulating film interposed therebetween.

28. The display device according to claim 25 wherein the third insulating film is a gate insulating film.

29. The display device according to claim 25 wherein the first insulating film has a density of more than or equal to $8\times10^{22}$ atoms/cm$^3$, and less than or equal to $2\times10^{23}$ atoms/cm$^3$; and the second insulating film has a density of more than or equal to $6\times10^{22}$ atoms/cm$^3$, and less than or equal to $9\times10^{22}$ atoms/cm$^3$.

30. The display device according to claim 25 wherein the substrate is a glass substrate.

31. The display device according to claim 25 wherein the first and second insulating films contain hydrogen.

* * * * *

UNITED STATES PATENT AND TRADEMARK OFFICE
CERTIFICATE OF CORRECTION

PATENT NO. : 7,855,416 B2
APPLICATION NO. : 12/276746
DATED : December 21, 2010
INVENTOR(S) : Hidehito Kitakado et al.

Page 1 of 1

It is certified that error appears in the above-identified patent and that said Letters Patent is hereby corrected as shown below:

In The Specification:

Column 12, Line 18; Change "scm" to --$\mu\Omega$cm-- (the same unit used in Column 12, Lines 3 and 5).

Column 25, Line 22; Change "alight" to --a light--.

Column 26, Line 17; Change "Pn" to --$\mu$m--.

Column 26, Line 40; Change "sue" to --due--.

Signed and Sealed this
Thirteenth Day of December, 2011

David J. Kappos
*Director of the United States Patent and Trademark Office*